(12) United States Patent
You et al.

(10) Patent No.: US 10,199,279 B2
(45) Date of Patent: Feb. 5, 2019

(54) METHOD OF FABRICATING FINFET STRUCTURE

(71) Applicants: Junggun You, Ansan-si (KR); Sukhoon Jeong, Suwon-si (KR)

(72) Inventors: Junggun You, Ansan-si (KR); Sukhoon Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/793,491

(22) Filed: Oct. 25, 2017

(65) Prior Publication Data

US 2018/0047636 A1 Feb. 15, 2018

Related U.S. Application Data

(63) Continuation of application No. 14/981,267, filed on Dec. 28, 2015, now Pat. No. 9,842,778.

(30) Foreign Application Priority Data

Feb. 23, 2015 (KR) .......................... 10-2015-0025302

(51) Int. Cl.
  *H01L 21/8238* (2006.01)
  *H01L 29/66* (2006.01)
  *H01L 29/78* (2006.01)

(52) U.S. Cl.
  CPC ........... *H01L 21/823821* (2013.01); *H01L 21/823807* (2013.01); *H01L 21/823814* (2013.01);
  (Continued)

(58) Field of Classification Search
  CPC ...... H01L 21/8238; H01L 29/66; H01L 29/78
  See application file for complete search history.

(56) References Cited

U.S. PATENT DOCUMENTS 6,413,802 B1 7/2002 Hu et al.
8,609,495 B2 12/2013 Gan et al.
(Continued)

FOREIGN PATENT DOCUMENTS

JP 5521541 B2 6/2014
KR 10-2012-0003715 1/2012

OTHER PUBLICATIONS

Park et al. "Fabrication of Body-Tied FinFETs (Omega MOSFETs) Using Bulk Si Wafers" *Symposium on VLSI Technology Digest of Technical Papers* (pp. 135-136) (Jun. 10-12, 2003).

*Primary Examiner* — Kyoung Lee
*Assistant Examiner* — Christina A Sylvia
(74) *Attorney, Agent, or Firm* — Myers Bigel, P.A.

(57) ABSTRACT

A method of fabricating a semiconductor device includes forming a first well region and a second well region in a semiconductor substrate, forming an isolation region defining a first fin active region and a second fin active region on the semiconductor substrate, forming a sacrificial gate layer on the semiconductor substrate having the first and second fin active regions and the isolation region, forming a hardmask line on the sacrificial gate layer, forming a gate cut mask having a gate cut opening on the hardmask line, and forming first and second hardmask patterns spaced apart from each other by etching the hardmask line using the gate cut mask as an etching mask. The gate cut opening overlaps a boundary between the first and second well regions formed between the first and second fin active regions, and has a line shape in a direction intersecting the hardmask line.

20 Claims, 71 Drawing Sheets

(52) U.S. Cl.
CPC ............. *H01L 21/823878* (2013.01); *H01L 29/66545* (2013.01); *H01L 29/7848* (2013.01); *H01L 21/823828* (2013.01)

(56) References Cited

U.S. PATENT DOCUMENTS

| | | |
|---|---|---|
| 9,293,459 B1 | 3/2016 | Cheng et al. |
| 9,842,778 B2 * | 12/2017 | You ................. H01L 21/823821 |
| 2006/0138522 A1 * | 6/2006 | Kim ..................... H01L 27/115 257/315 |
| 2009/0114971 A1 * | 5/2009 | Cai ................... G11C 16/0433 257/315 |
| 2013/0244392 A1 | 9/2013 | Oh et al. |
| 2014/0319626 A1 | 10/2014 | Jangjian et al. |
| 2014/0322872 A1 | 10/2014 | Wang et al. |
| 2014/0327044 A1 | 11/2014 | Leobandung |
| 2014/0327046 A1 | 11/2014 | Huang et al. |
| 2014/0327060 A1 | 11/2014 | Cheng et al. |
| 2016/0247730 A1 | 8/2016 | You et al. |

* cited by examiner

METHOD OF FABRICATING FINFET STRUCTURE

CROSS-REFERENCE TO RELATED APPLICATION

This application is a continuation application of and claims priority from U.S. application Ser. No. 14/981,267, filed Dec. 28, 2015, which claims priority under 35 U.S.C. § 119 to Korean Patent Application No. 10-2015-0025302 filed on Feb. 23, 2015, the disclosures of which are hereby incorporated by reference in their entirety.

BACKGROUND

Technical Field

Embodiments of the inventive concepts relate to methods of fabricating a semiconductor device, structures of the semiconductor device, and electronic systems including the semiconductor device.

Description of Related Art

Discrete devices, such as NMOS transistors and PMOS transistors, may be used in integrated circuits of semiconductor devices. Such NMOS transistors and PMOS transistors may be scaled down as semiconductor devices become more highly integrated, and accordingly, short channel effects in transistors may increasingly result. A FinFET structure has been proposed to reduce or suppress short channel effects in transistors. However, unexpected problems caused by arranging FinFET NMOS transistors and FinFET PMOS transistors having reduced sizes in a limited space may occur in manufacturing processes.

SUMMARY

According to some embodiments of the inventive concepts, in a method of fabricating a semiconductor device, first and second fin-shaped active regions are formed protruding from first and second well regions in a substrate, respectively. The first and second well regions have different conductivity types and define a well boundary region at an interface therebetween. A sacrificial gate layer and a hardmask pattern are formed on the first and second fins, and the hardmask pattern and the sacrificial gate layer are sequentially patterned to define first and second hardmask patterns on first and second sacrificial gate patterns, respectively, and a gate cut region therebetween. The gate cut region overlaps the well boundary in plan view.

In some embodiments, the gate cut region may expose an isolation region between the first and second fin-shaped active regions. An interlayer insulating layer may be formed on respective surfaces of the first and second hard mask patterns and on the isolation region in the gate cut region therebetween. The respective surfaces of the first and second hardmask patterns may be substantially coplanar prior to forming the interlayer insulating layer thereon.

In some embodiments, prior to forming the interlayer insulating layer, the isolation region that is exposed by the gate cut region may include recessed portions therein defining a protrusion therebetween. The protrusion in the isolation region may overlap the well boundary in plan view.

In some embodiments, prior to the sequential patterning, the hardmask pattern may include a protrusion in a surface thereof. The protrusion in the surface of the hardmask pattern may overlap the well boundary in plan view.

In some embodiments, in sequentially patterning, a gate cut mask may be formed on the hard mask pattern opposite the sacrificial gate layer. The gate cut mask may include a gate cut opening therein that extends parallel to the first and second fin-shaped active regions and overlaps the well boundary in plan view. The hard mask pattern may be patterned using the gate cut mask to define the first and second hard mask patterns, and the sacrificial gate layer may be patterned using the first and second hard mask patterns to define the first and second sacrificial gate patterns, respectively.

In some embodiments, the first and second hard mask patterns and portions of the interlayer insulating layer on the respective surfaces thereof may be planarized to expose respective surfaces of the first and second sacrificial gate patterns on opposite sides of the gate cut region, such that the gate cut region may include a remaining portion the interlayer insulating layer therein. The first and second sacrificial gate patterns may be removed to define first and second gate trenches exposing portions of the first and second fin-shaped active regions, respectively, on the opposite sides of the gate cut region, and first and second gate electrodes may be formed in the first and second gate trenches, respectively. The remaining portion of the interlayer insulating layer in the gate cut region may separate the first and second gate electrodes. Respective surfaces of the first and second gate electrodes opposite the first and second fin-shaped active regions may be substantially coplanar.

In some embodiments, the first fin-shaped active regions may be under tensile stress and may define channel regions for NMOS devices, and the second fin-shaped active regions may be under compressive stress and may define channel regions for PMOS devices.

In accordance with some embodiments of the inventive concepts, a method of fabricating a semiconductor device is provided. The method includes forming a first well region having a first conductivity type and a second well region having a second conductivity type different from the first conductivity type in a semiconductor substrate. An isolation region defining active regions is formed on the semiconductor substrate. The active regions includes a first fin active region having the first conductivity type and a second fin active region having the second conductivity type. A sacrificial gate layer and a hardmask layer disposed on the sacrificial gate layer are sequentially formed on the active regions and the isolation region. A hardmask line is formed by patterning the hardmask layer. A first hardmask pattern and a second hardmask pattern are formed by patterning the hardmask line. A first sacrificial gate pattern and a second sacrificial gate pattern are formed by etching the sacrificial gate layer using the first and second hardmask patterns as etching masks. The first sacrificial gate pattern crosses the first fin active region, and the second sacrificial gate pattern crosses the second fin active region. An area between the first and second sacrificial gate patterns is defined as a gate cut area. The gate cut area overlaps a boundary between the first well region and the second well region formed in a surface of the semiconductor substrate disposed between the first and second fin active regions.

In accordance with some embodiments of the inventive concepts, a method of fabricating a semiconductor device is provided. The method includes forming a first well region having a first conductivity type and a second well region having a second conductivity type different from the first conductivity type in a semiconductor substrate. An isolation region defining active regions is formed on the semiconductor substrate. The active regions include a first fin active region having the first conductivity type and a second fin active region having the second conductivity type. A sacrificial gate line and a hardmask line sequentially stacked on the first and second fin active regions and the isolation region are formed. The sacrificial gate line and the hardmask line cross the first and second fin active regions and extend into the isolation region. A first etching mask pattern is formed on the semiconductor substrate having the sacrificial gate line and the hardmask line. The first etching mask pattern overlaps the second fin active region without overlapping the first fin active region. A first active recess area is formed by etching the first fin active region using the first etching mask pattern and the hardmask line as etching masks. While the first fin active region is etched, the hardmask line is partially etched to form a first hardmask recess portion. The first etching mask pattern is removed. A first semiconductor layer is formed on the first active recess area. A second etching mask pattern is formed on the semiconductor substrate having the first semiconductor layer. The second etching mask pattern overlaps the first fin active region without overlapping the second fin active region. A second active recess area is formed by etching the second fin active region, using the second etching mask pattern and the hardmask line as etching masks. While the second fin active region is etched, the hardmask line is partially etched to form a second hardmask recess portion, and a hardmask protrusion is formed between the first and second hardmask recess portions. The second etching mask pattern is removed. The second semiconductor layer is formed on the second active recess area. A gate cut mask having a gate cut opening is formed on the semiconductor substrate having the first and second semiconductor layers. The gate cut opening exposes the hardmask protrusion. First and second sacrificial gate patterns and first and second hardmask patterns are formed by etching the hardmask line and the sacrificial gate line using the gate cut mask as an etching mask.

In accordance with some embodiments of the inventive concepts, a method of fabricating a semiconductor device is provided. The method includes forming a first well region having a first conductivity type and a second well region having a second conductivity type different from the first conductivity type in a semiconductor substrate, forming an isolation region defining a first fin active region and a second fin active region on the semiconductor substrate, forming a sacrificial gate layer on the semiconductor substrate having the first and second fin active regions and the isolation region, forming a hardmask line on the sacrificial gate layer, forming a gate cut mask having a gate cut opening on the hardmask line. The gate cut opening overlaps a boundary between the first and second well regions formed between the first and second fin active regions and has a line shape in a direction intersecting the hardmask line. First and second hardmask patterns spaced apart from each other are formed by etching the hardmask line using the gate cut mask as an etching mask.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings.

DETAILED DESCRIPTION OF EMBODIMENTS

Figure 1:
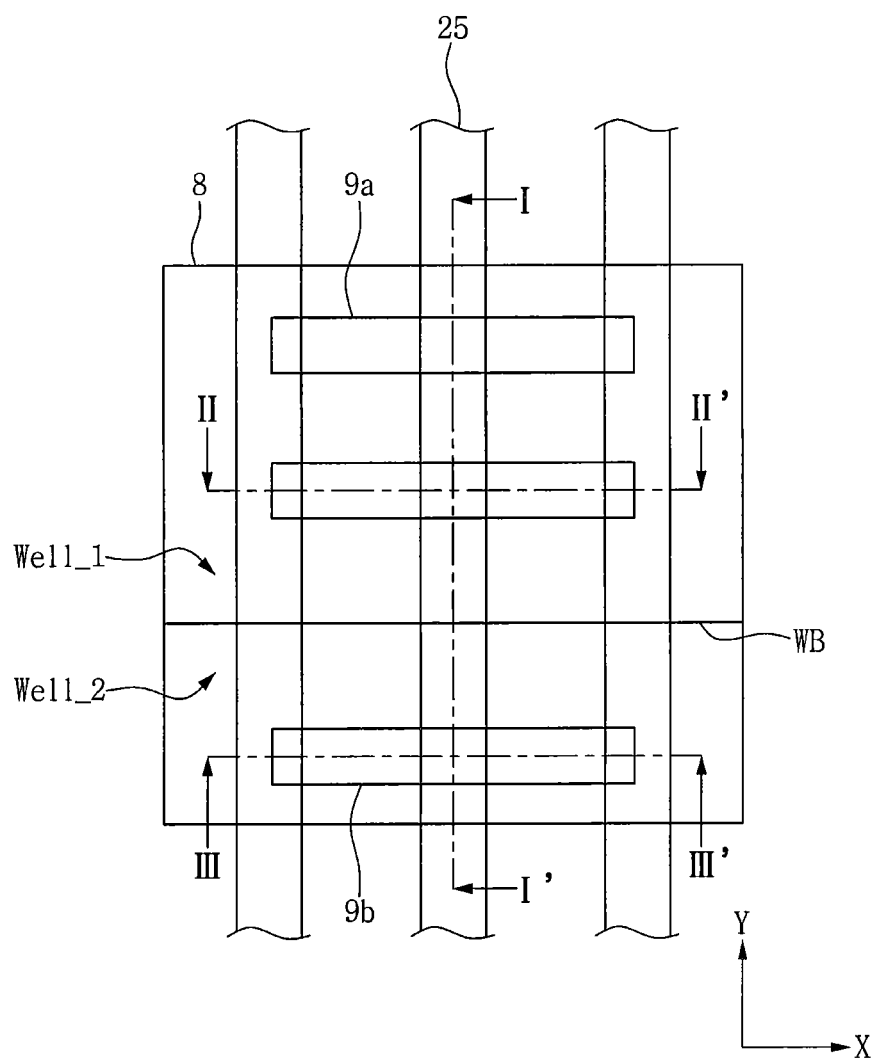
FIGS. 1 to 18B are diagrams illustrating methods of fabricating semiconductor devices in accordance with some embodiments of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art. Accordingly, all such modifications are intended to be included within the scope of these inventive concepts as defined in the claims. Like numerals refer to like elements throughout the specification.

Embodiments are described herein with reference to cross-sectional and/or planar illustrations that are schematic illustrations of idealized embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein, but are to include deviations in shapes that result, for example, from manufacturing. Thus, the regions illustrated in the figures are schematic in nature and their shapes are not intended to illustrate the actual shape of a region of a device and are not intended to limit the scope of the present inventive concepts.

In the drawings, the sizes and relative sizes of layers and regions may be exaggerated for clarity. It will be understood that when a layer or region is referred to as being "on" or "under" another layer or region, the layer may be formed directly on the other layer or the substrate, or an intervening layer or region may exist between the layer and the other layer or the substrate. In contrast, a layer referred to as being "directly on" or "directly under" another layer or region, no intervening layers or regions are present.

Throughout the specification, the term "air spacer" may refer to an empty spacer that is not occupied by a solid material.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

In addition, the terms "upper," "intermediate," "lower," etc. may be used to describe the relationship of one element or feature to another, and these elements should not be limited by these terms. Therefore, the terms "upper," "intermediate," "lower," etc. could be replaced by other terms, such as "first," "second," "third," etc. within the scope of the invention.

It will be understood that, although the terms "first," "second," etc. may be used herein to describe various elements, components and/or sections, these elements, components and/or sections should not be limited by these terms. These terms are only used to distinguish one element, component, or section from another. Therefore, a first element, a first component, or a first section could be termed a second element, a second component, or a second section within the scope of the invention.

The terminology used herein to describe embodiments of the invention is not intended to limit the scope of the invention.

The use of the singular form in the present document should not preclude the presence of more than one referent. In other words, elements of the invention referred to in the singular form may number one or more, unless the context clearly indicates otherwise. It will be further understood that the terms "comprises," "comprising," "includes," and/or "including," when used herein, specify the presence of stated elements, components, steps, operations, and/or devices, but do not preclude the presence or addition of one or more other elements, components, steps, operations, and/or devices.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Methods of fabricating semiconductor devices in accordance with some embodiments of the inventive concepts will be described with reference to FIGS. 1 to 18B. FIGS. 1, 4, 6, 11, and 14 are plan views for describing methods of fabricating semiconductor devices in accordance with embodiments of the inventive concepts, and FIGS. 2A, 3A, 5A, 7A, 8A, 9A, 10A, 12A, 13A, 15A, 16A, 17A, and 18A are cross-sectional views illustrating areas taken along lines I-I' in the plan views of FIGS. 1, 4, 6, 11, and 14. FIGS. 2B, 3B, 5B, 7B, 8B, 9B, 10B, 12B, 13B, 15B, 16B, 17B, and 18B are cross-sectional views illustrating areas taken along lines II-IF and in the plan views of FIGS. 1, 4, 6, 11, and 14.

Figure 2A:
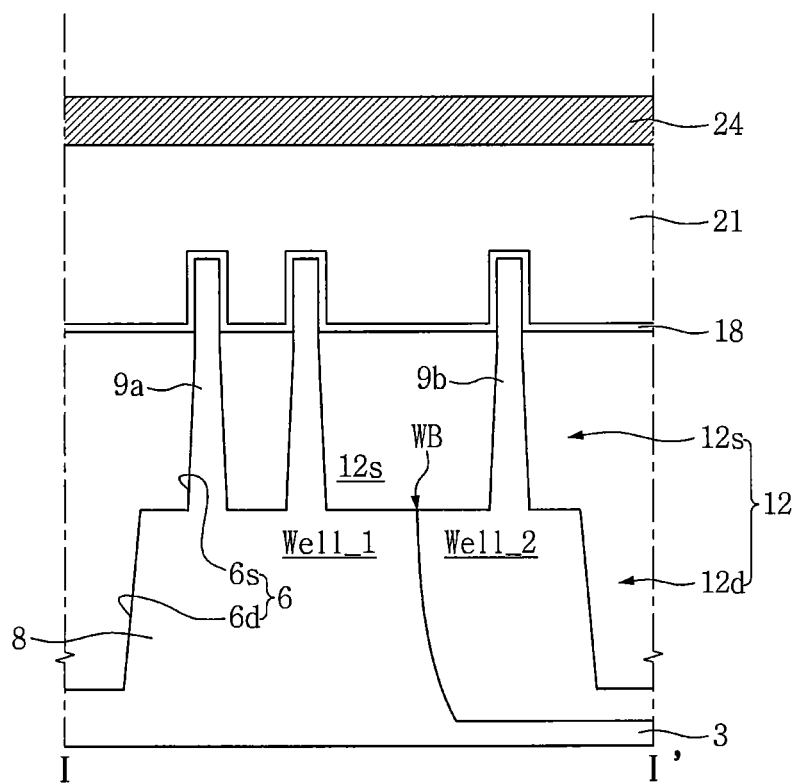
Figure 2B:
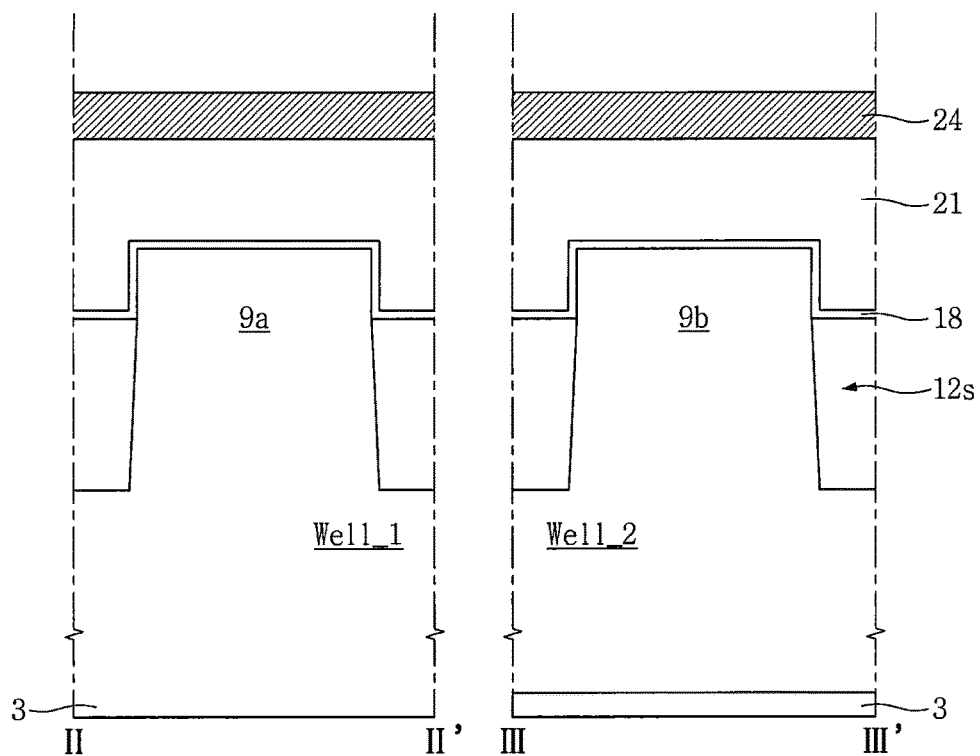

Referring to FIGS. 1, 2A, and 2B, methods of fabricating semiconductor devices in accordance with embodiments of the inventive concepts may include forming a first well region Well_1 and a second well region Well_2 in a semiconductor substrate 3, forming a isolation region 12 defining a plurality of active regions in the semiconductor substrate 3, and sequentially forming a base insulating layer 18, a sacrificial gate layer 21, and a hardmask layer 24 on the semiconductor substrate 3 having the isolation region 12.

The semiconductor substrate 3 may be a single crystalline silicon wafer, a SiGe wafer, or a silicon on insulator (SOI) wafer. The first well region Well_1 may have a first conductivity type, and the second well region Well_2 may have a second conductivity type different from the first conductivity type. For example, the first well region Well_1 may have P-type conductivity, and the second well region Well_2 may have N-type conductivity.

The isolation region 12 may include a trench insulating material filling a trench 6. The trench 6 may include a deep trench 6d and a shallow trench 6s. The isolation region 12 may include a deep isolation region 12d including a trench insulating material filling the deep trench 6d, and a shallow isolation region 12s including a trench insulating material partially filling the shallow trench 6s. The trench insulating material of the isolation region 12 may include silicon oxide such as tonen silazane (TOSZ) or undoped silicate glass (USG).

The plurality of active regions may include a lower active region 8 and a plurality of fin active regions disposed on the lower active region 8. The lower active region 8 may be defined by the deep isolation region 12d. The fin active regions may be defined by the shallow isolation region 12s.

The fin active regions may include first and second fin active regions 9a and 9b having different type conductivity and spaced apart from each other. The first fin active region 9a may be formed in the first well region Well_1 and may have the first conductivity type. The second fin active region 9b may be formed in the second well region Well_2 and may have the second conductivity type. For example, the first fin active region 9a may be formed to have P-type conductivity, and the second fin active region 9b may be formed to have N-type conductivity. The first and second fin active regions 9a and 9b may be formed in line shapes parallel to each other and extending in a first direction X. Upper portions of the first and second fin active regions 9a and 9b may protrude from an upper surface of the isolation region 12.

A boundary WB between the first well region Well_1 and the second well region Well_2 may be formed in the lower active region 8 interposed between the first and second fin active regions 9a and 9b.

The base insulating layer 18 may be conformally formed on surfaces of the first and second fin active regions 9a and 9b and the isolation region 12. The base insulating layer 18 may include silicon oxide. The sacrificial gate layer 21 may be formed on the base insulating layer 18. The sacrificial gate layer 21 may include polysilicon. The hardmask layer 24 may be formed on the sacrificial gate layer 21. The hardmask layer 24 may include silicon nitride.

Figure 3A:
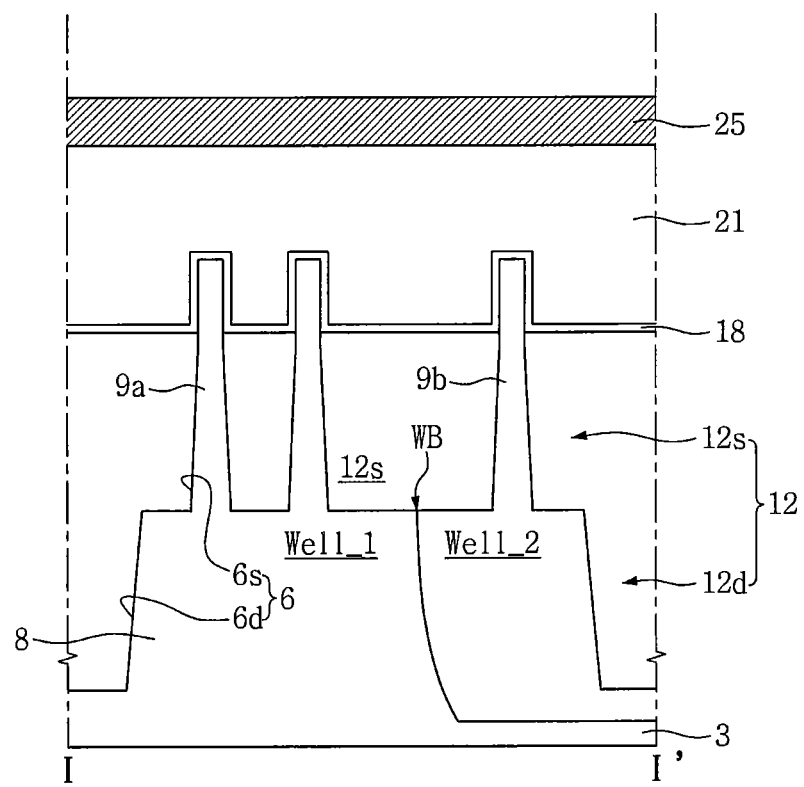
Figure 3B:
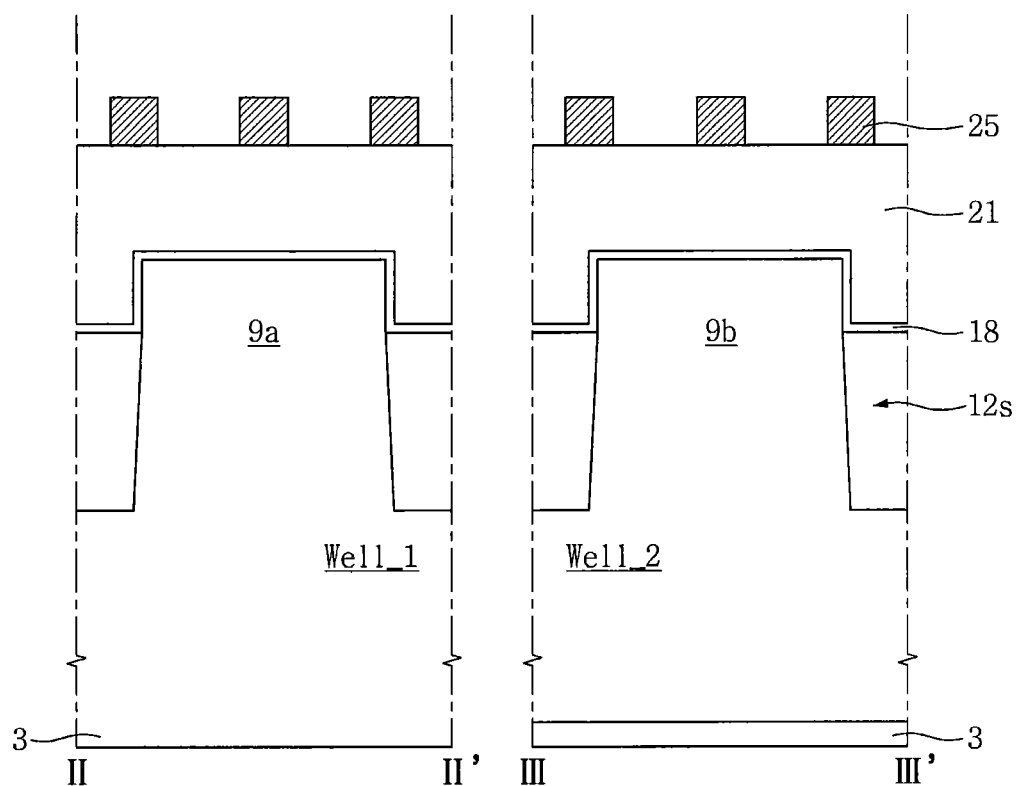

Referring to FIGS. 1, 3A, and 3B, methods of fabricating the semiconductor device in accordance with embodiments of the inventive concepts may include forming a hardmask pattern or line 25 by patterning the hardmask layer 24. The hardmask line 25 may be formed in a plurality of lines spaced apart in the first direction X. The patterning of the hardmask layer 24 may include performing a photolithography and etching process. The hardmask line 25 may have a line shape intersecting the first and second fin active regions 9a and 9b. For example, the first and second fin active regions 9a and 9b may have the line shape extending in the first direction X, and the hardmask line 25 may have the line shape extending in a second direction Y intersecting the first direction X or perpendicular to the first direction X.

Figure 4:
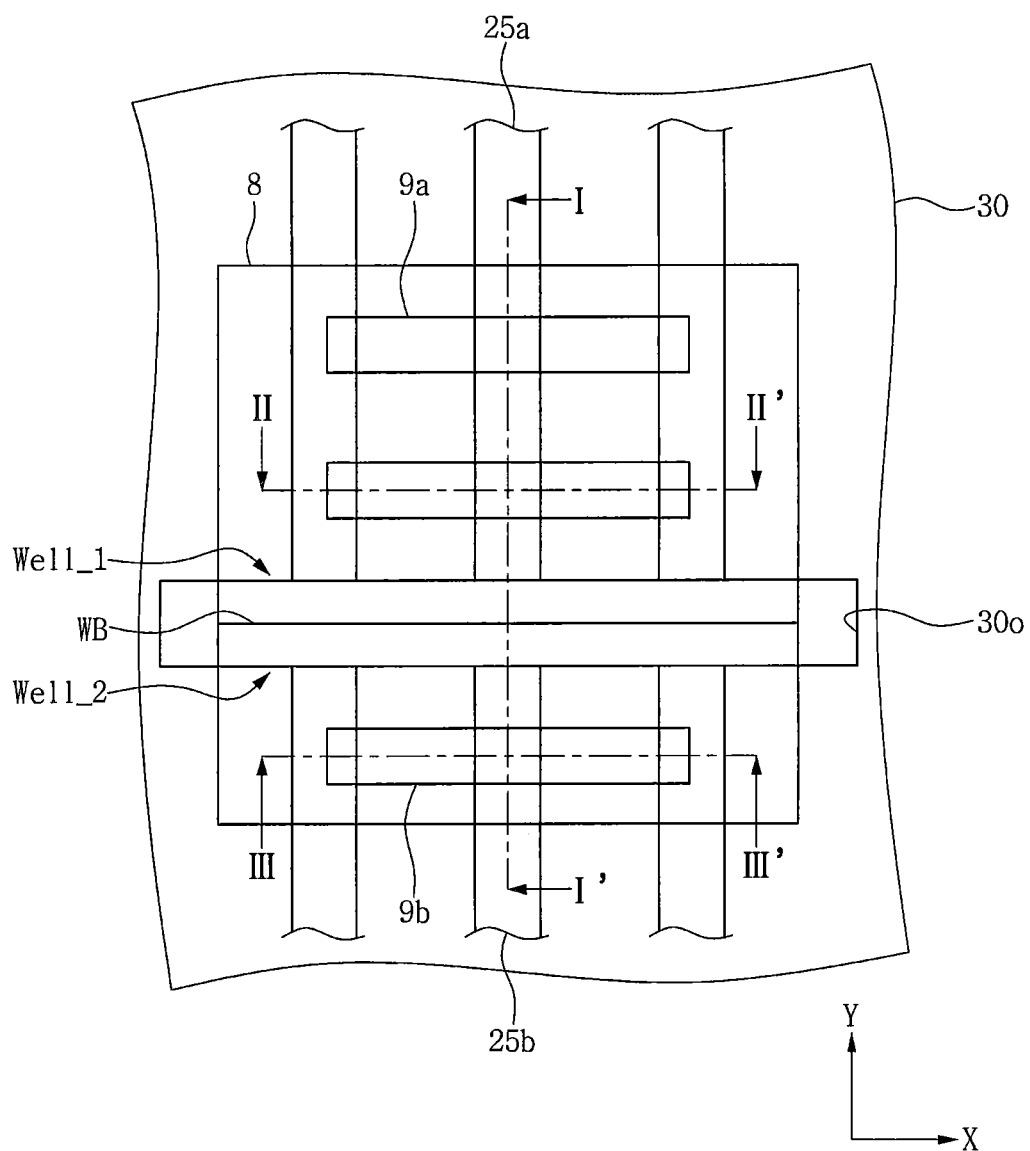
Figure 5A:
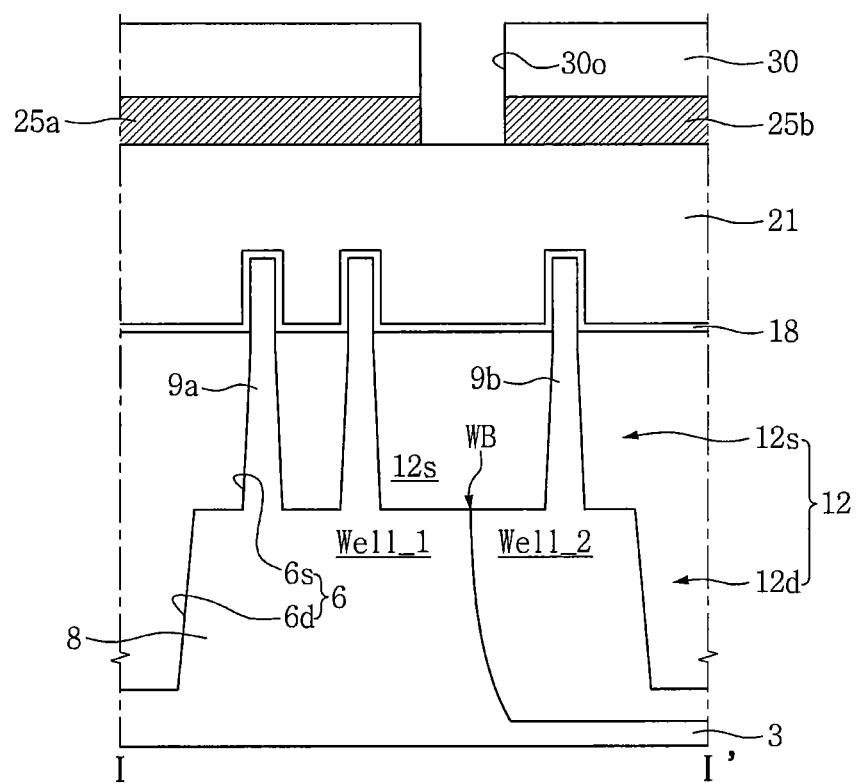
Figure 5B:
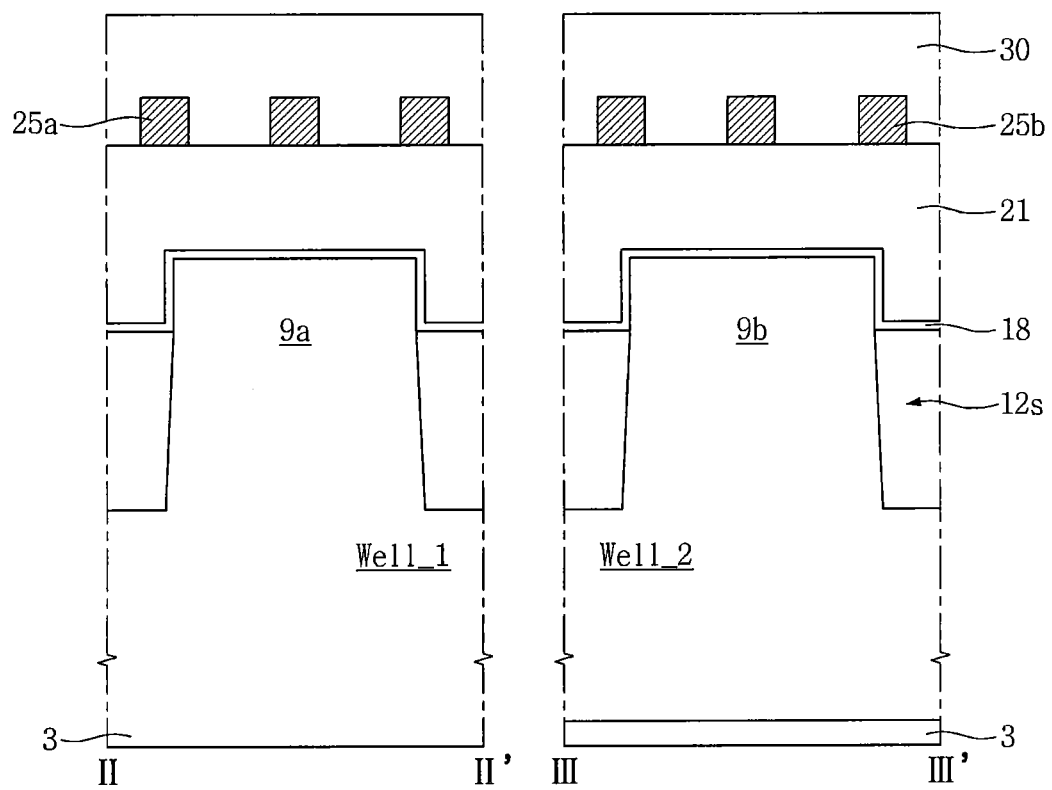

Referring to FIGS. 4, 5A, and 5B, methods of fabricating the semiconductor device in accordance with embodiments of the inventive concepts may include patterning the hardmask line 25 and forming a first hardmask pattern 25a and a second hardmask pattern 25b.

The patterning of the hardmask line 25 may include forming a gate cut mask 30 having a gate cut opening 30o on the semiconductor substrate 3 having the hardmask line 25 using a photolithography apparatus, and forming the first and second hardmask patterns 25a and 25b by etching the hardmask line 25 exposed by the gate cut opening 30o using the gate cut mask 30 as an etching mask.

The gate cut mask 30 may be formed as a photoresist pattern. The gate cut opening 30o may be formed to have a minimum width implemented by the photolithography apparatus. The gate cut opening 30o may be parallel to the first fin active region 9a and the second fin active region 9b. The gate cut opening 30o may be longer than the first and second fin active regions 9a and 9b. The gate cut opening 30o may have a line shape extending in the first direction X. The gate cut opening 30o may overlap or may otherwise be aligned (in plan view) with the boundary WB between the first well region Well_1 and the second well region Well_2, and may not overlap the first fin active region 9a and the second fin active region 9b.

The first hardmask pattern 25a may cross the first fin active region 9a, and the second hardmask pattern 25b may cross the second fin active region 9b. A distance between the first hardmask pattern 25a and the second hardmask pattern 25b may correspond to a width of the gate cut opening 30o in the second direction Y, for example, the minimum width implemented by the photolithography apparatus.

Next, the gate cut mask 30 may be removed.

Figure 6:
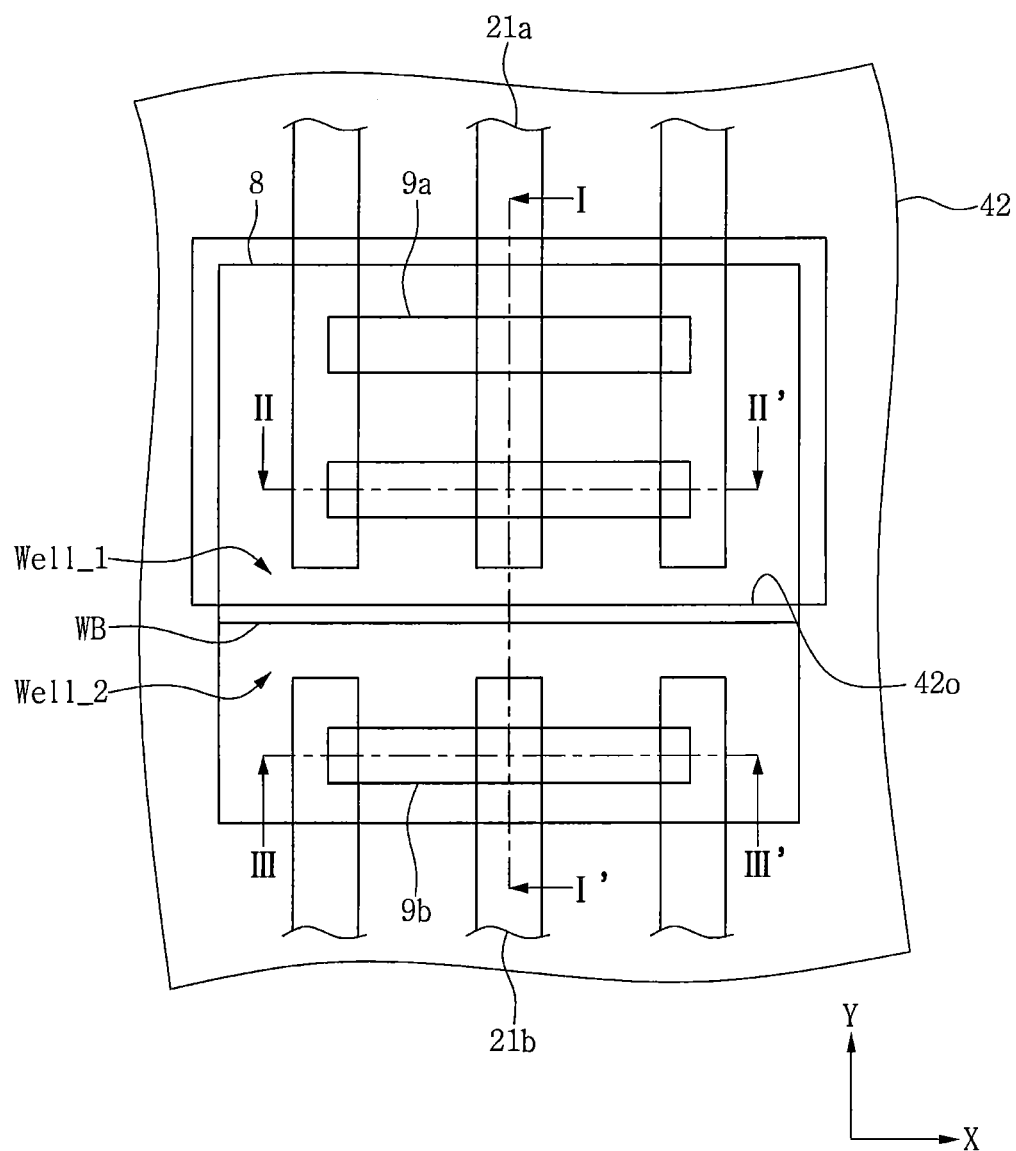
Figure 7A:
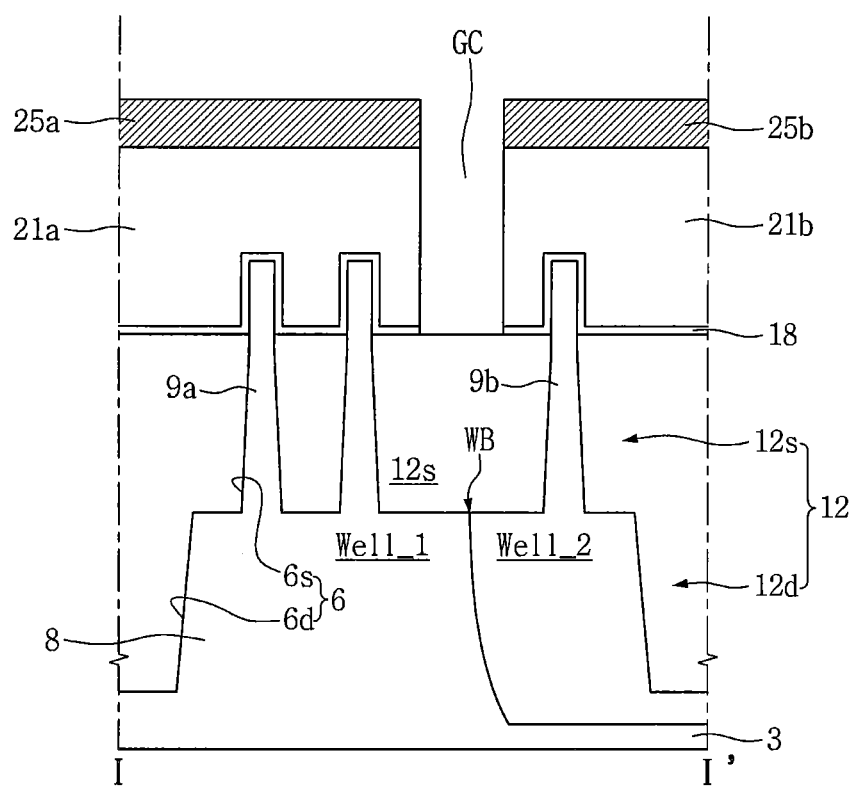
Figure 7B:
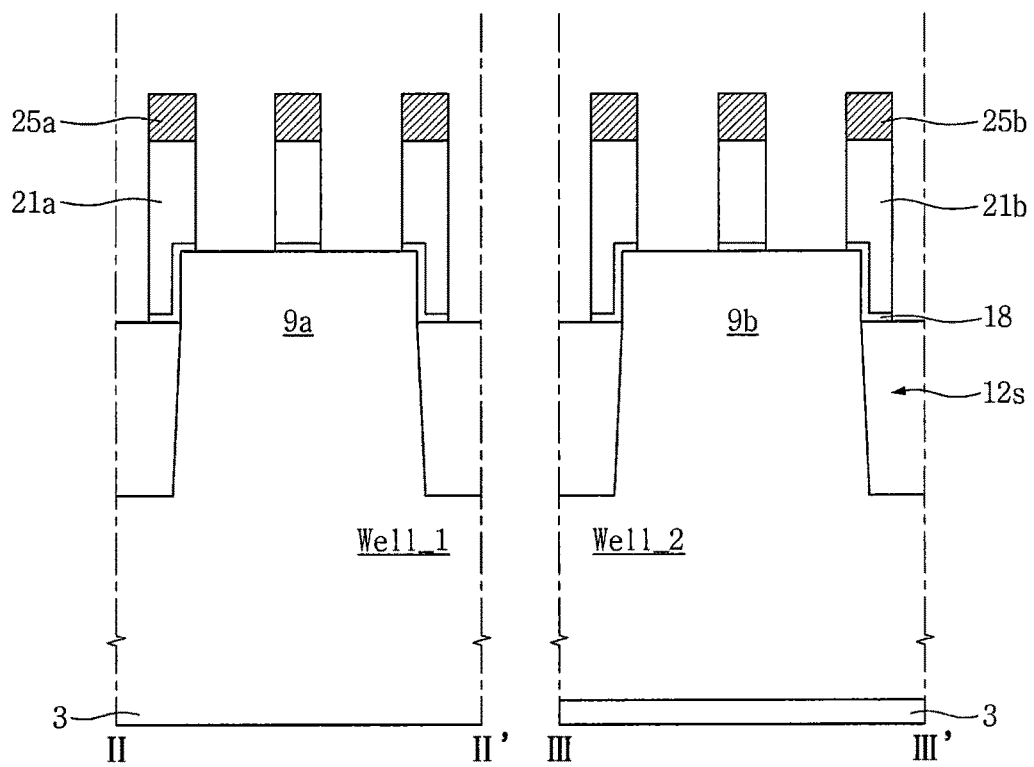

Referring to FIGS. 6, 7A, and 7B, methods of fabricating the semiconductor device in accordance with embodiments of the inventive concepts may include sequentially etching the sacrificial gate layer 21 and the base insulating layer 18 using the first and second hardmask patterns 25a and 25b as etching masks. The sacrificial gate layer 21 may be etched to form a first sacrificial gate pattern 21a and a second sacrificial gate pattern 21b.

The first sacrificial gate pattern 21a may have a line shape intersecting the first fin active region 9a. The first sacrificial gate pattern 21a may be formed in a plurality of patterns including edge patterns partially overlapping both end portions of the first fin active region 9a and a center pattern interposed between the edge patterns and crossing the first fin active region 9a.

The second sacrificial gate pattern 21b may have a line shape intersecting the second fin active region 9b. The second sacrificial gate pattern 21b may be formed in a plurality of patterns including edge patterns partially overlapping both end portions of the second fin active region 9b and a center pattern interposed between the edge patterns and crossing the second fin active region 9b.

The first hardmask pattern 25a may be stacked on the first sacrificial gate pattern 21a. The second hardmask pattern 25b may be stacked on the second sacrificial gate pattern 21b. An upper surface of the first fin active region 9a may be partially exposed through the first sacrificial gate pattern 21a and the first hardmask pattern 25a. An upper surface of the second fin active region 9b may be partially exposed through the second sacrificial gate pattern 21b and the second hardmask pattern 25b.

An area between the first sacrificial gate pattern 21a and the second sacrificial gate pattern 21b may be defined as a gate cut area or region GC. The gate cut area GC may overlap or may otherwise be aligned (in plan view) with the boundary WB between the first well region Well_1 and the second well region Well_2. The boundary WB between the first and second well regions Well_1 and Well_2 may be a boundary formed at a surface of the lower active region 8 interposed between the first and second fin active regions 9a and 9b.

Figure 8A:
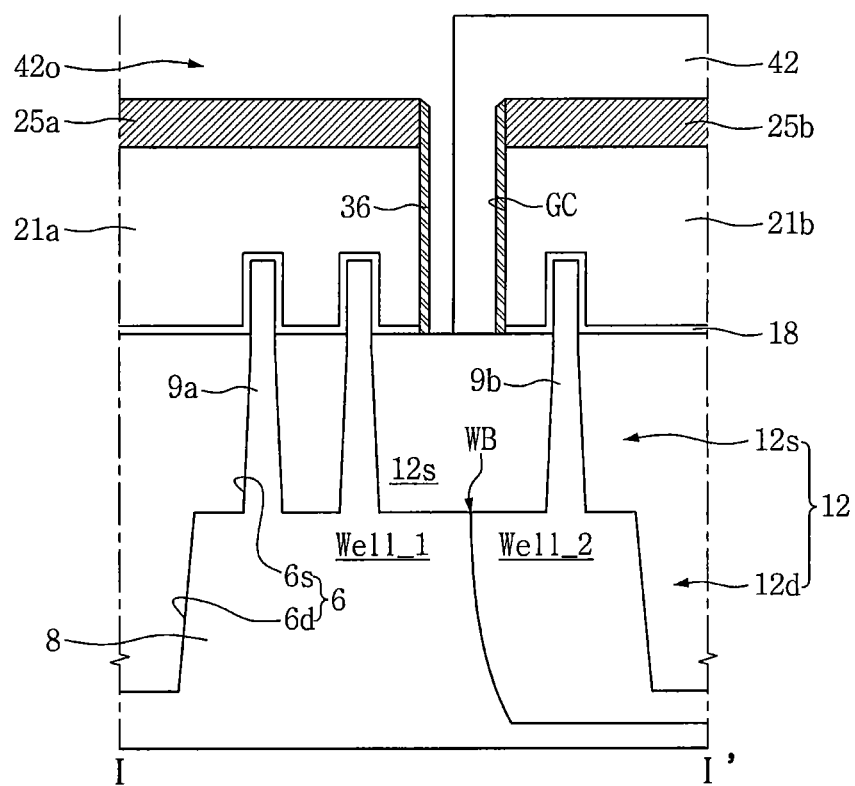
Figure 8B:
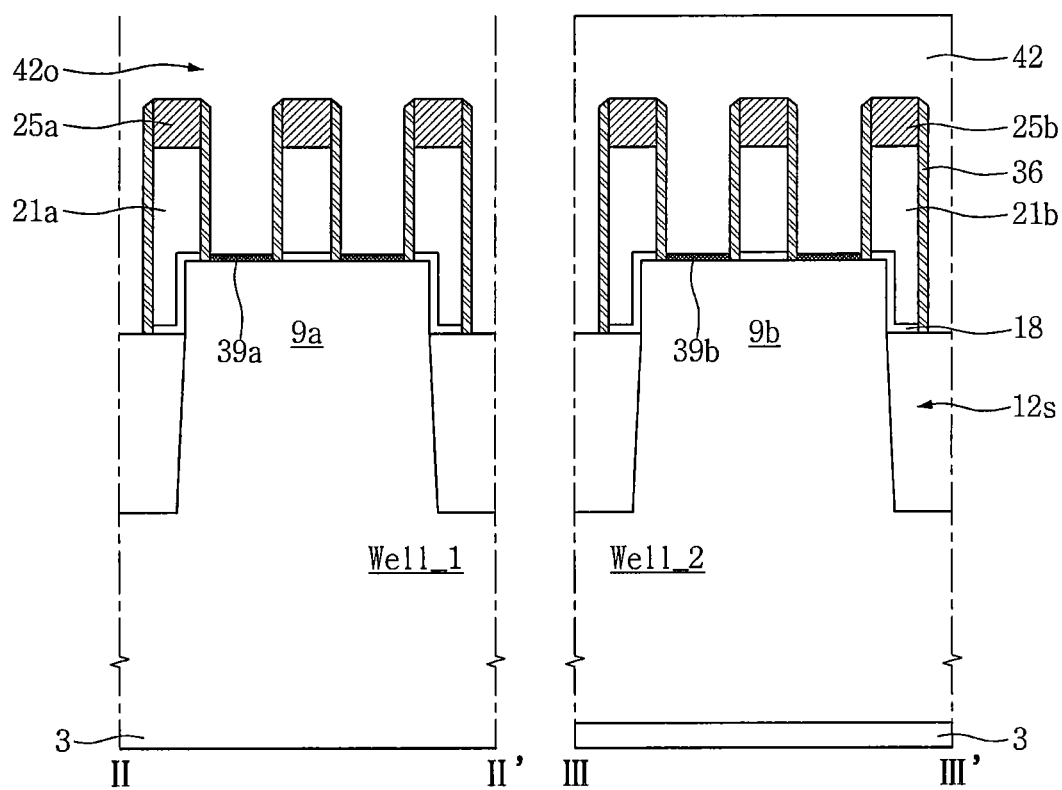

Referring to FIGS. 6, 8A, and 8B, methods of fabricating the semiconductor device in accordance with embodiments of the inventive concepts may include forming gate spacers 36, surface protection layers 39a and 39b, and a first etching mask pattern 42.

The formation of the gate spacers 36 may include conformally forming an insulating material layer (e.g. silicon nitride) on the semiconductor substrate 3 having the first and second hardmask patterns 25a and 25b and the first and second sacrificial gate patterns 21a and 21b, and anisotropically etching the insulating material layer.

The surface protection layers 39a and 39b may be formed on the first and second fin active regions 9a and 9b disposed at sides of the first and second sacrificial gate patterns 21a and 21b. The surface protection layers 39a and 39b may be formed by oxidizing exposed surfaces of the first and second fin active regions 9a and 9b after the gate spacers 36 are formed. The surface protection layers 39a and 39b may be formed of silicon oxide.

The first etching mask pattern 42 may be formed on the semiconductor substrate 3 having the gate spacers 36 and the surface protection layers 39a and 39b. The first etching mask pattern 42 may include openings 42o exposing the first fin active region 9a and cover the second fin active region 9b.

The first etching mask pattern 42 may cover the second well region Well_2 and partially cover the first well region Well_1. The first etching mask pattern 42 may overlap the boundary WB between the first and second well regions Well_1 and Well_2. A side portion of the first etching mask pattern 42 may be formed in the gate cut area GC, and the first etching mask pattern 42 may cover the boundary WB between the first and second well regions Well_1 and Well_2. A side surface of the first etching mask pattern 42 disposed in the gate cut area GC between the first and second sacrificial gate patterns 21a and 21b may be closer to the first sacrificial gate pattern 21a than the second sacrificial gate pattern 21b.

Figure 9A:
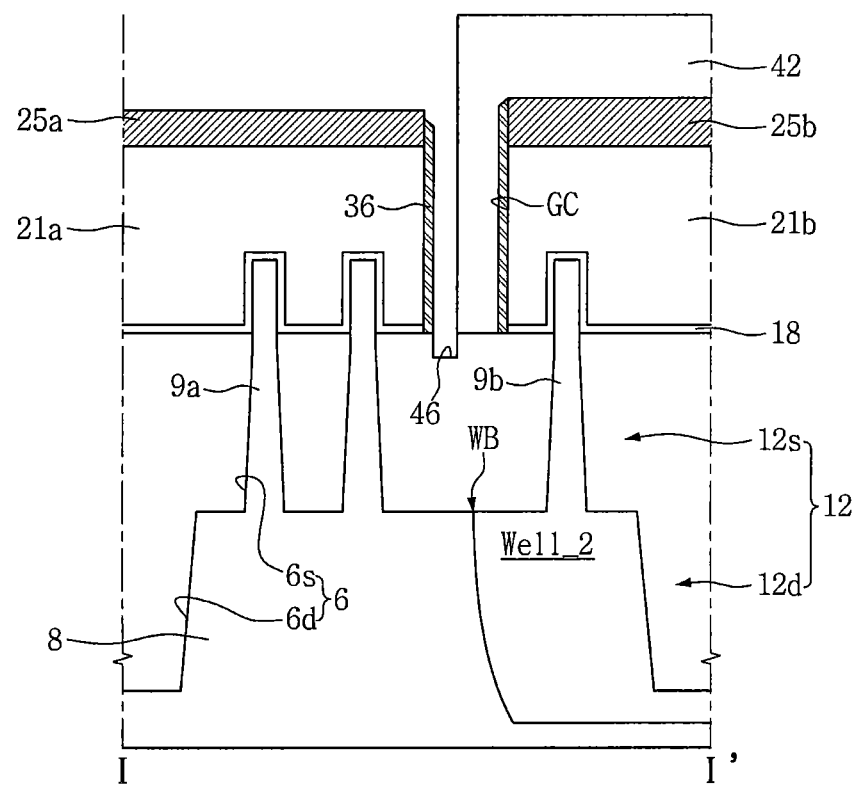
Figure 9B:
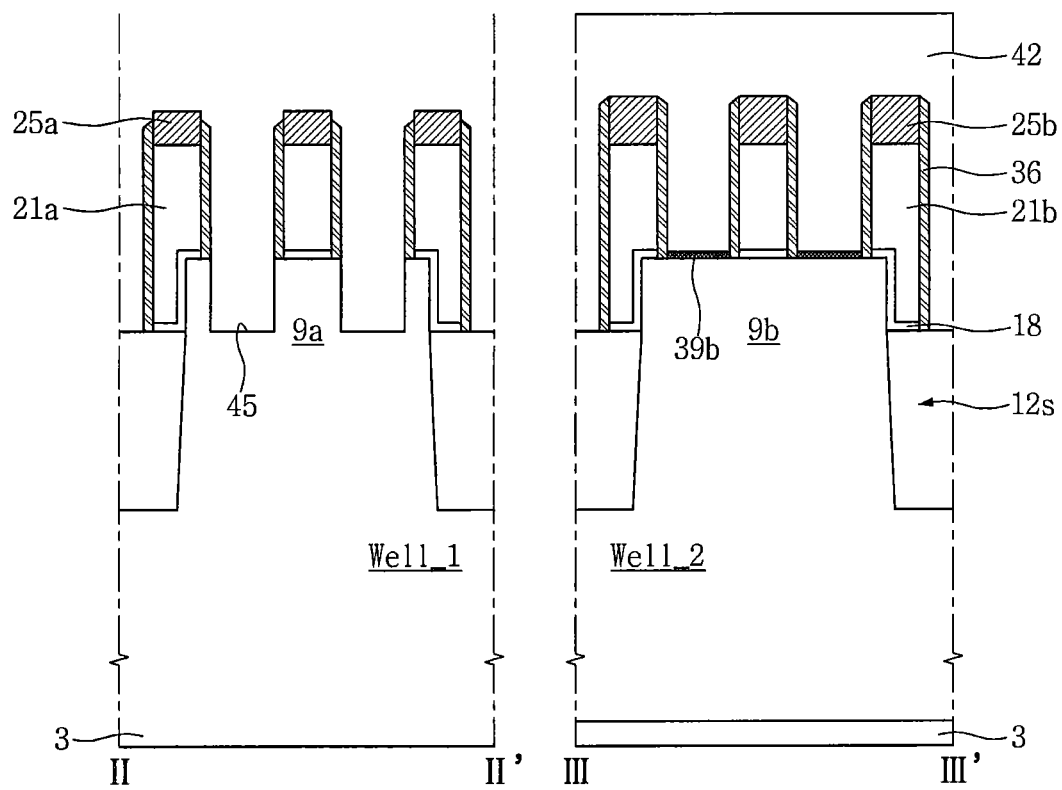

Referring to FIGS. 6, 9A, and 9B, methods of fabricating the semiconductor device in accordance with embodiments of the inventive concepts may include forming a first active recess area 45. The formation of the first active recess area 45 may include etching the first fin active region 9a interposed between the first sacrificial gate patterns 21a using the first etching mask pattern 42, the first hardmask pattern 25a, and the gate spacers 36 as etching masks.

In some embodiments, while the first active recess area 45 is formed, the first hardmask pattern 25a may be partially etched, and an upper surface thereof may be lowered.

In other embodiments, while the first active recess area 45 is formed, upper end portions of the gate spacers 36 may be etched and lowered.

In still other embodiments, while the first active recess area 45 is formed, the shallow isolation region 12s of the isolation region 12 may be partially etched to form a first field recess portion 46.

Next, the first etching mask pattern 42 may be removed.

Figure 10A:
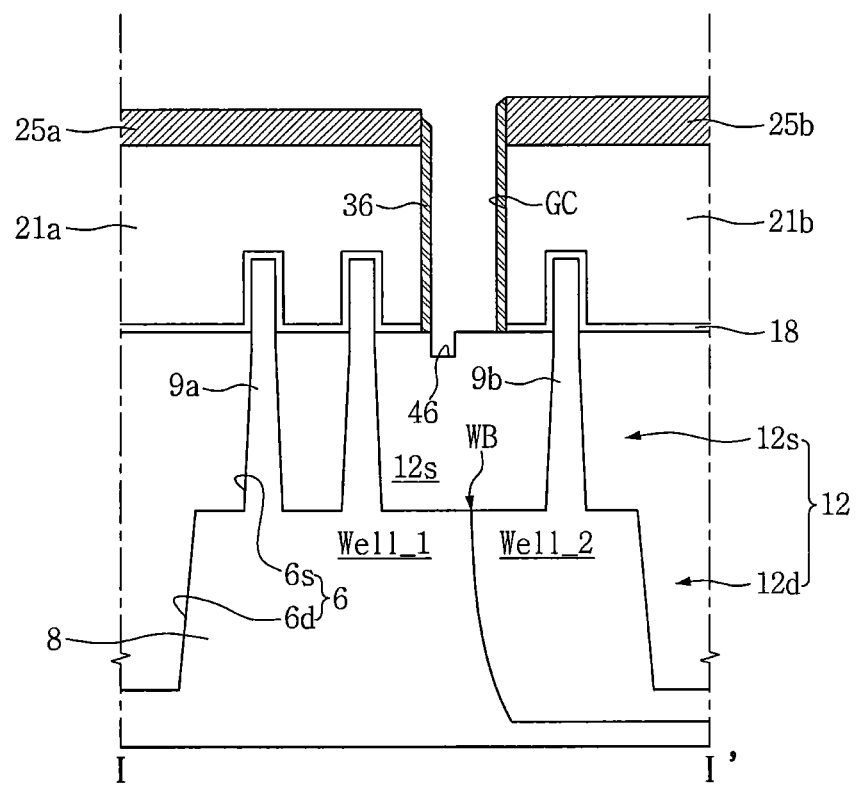
Figure 10B:
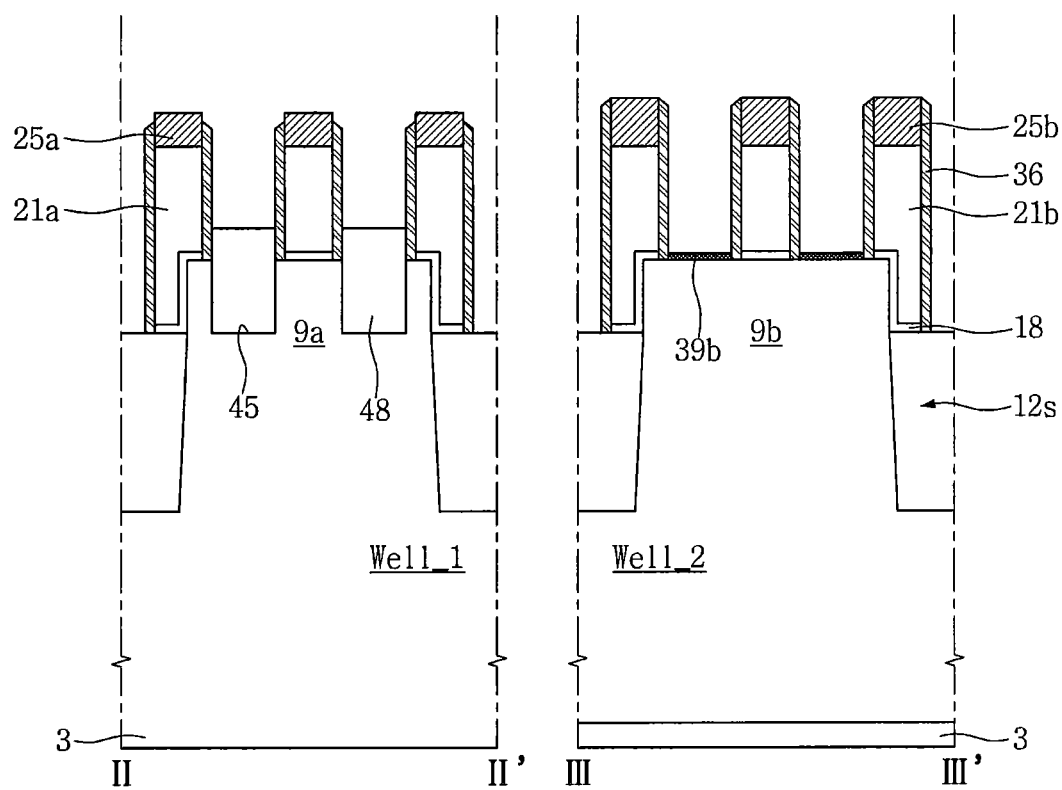

Referring to FIGS. 6, 10A, and 10B, methods of fabricating the semiconductor device in accordance with embodiments of the inventive concepts may include forming a first semiconductor layer 48.

The first semiconductor layer 48 may be formed by performing a first selective epitaxial growth (SEG) process. For example, when the first well region Well_1 has P-type conductivity, the first semiconductor layer 48 may be formed as a silicon layer using the first SEG process.

While the first semiconductor layer 48 is formed, the surface protection layer 39b disposed on the second fin active region 9b may serve to prevent growth of an SEG layer on the surface of the second fin active region 9b during the first SEG process.

The first semiconductor layer 48 may fill the first active recess area 45 and have an upper surface disposed at a higher level than the upper surface of the first fin active region 9a. The first semiconductor layer 48 may be a stressor that applies a tensile stress to a channel area of an NMOS transistor to increase the mobility of carriers of the NMOS transistor, that is, electrons.

Figure 11:
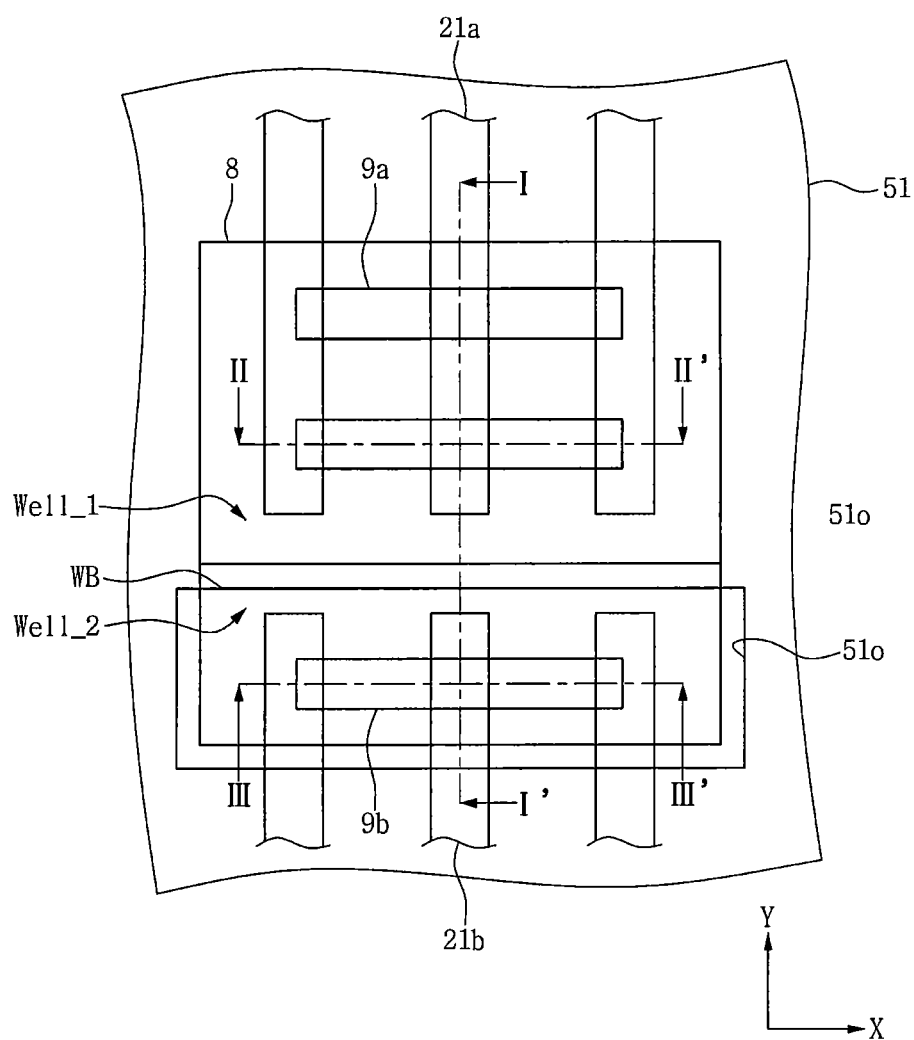
Figure 12A:
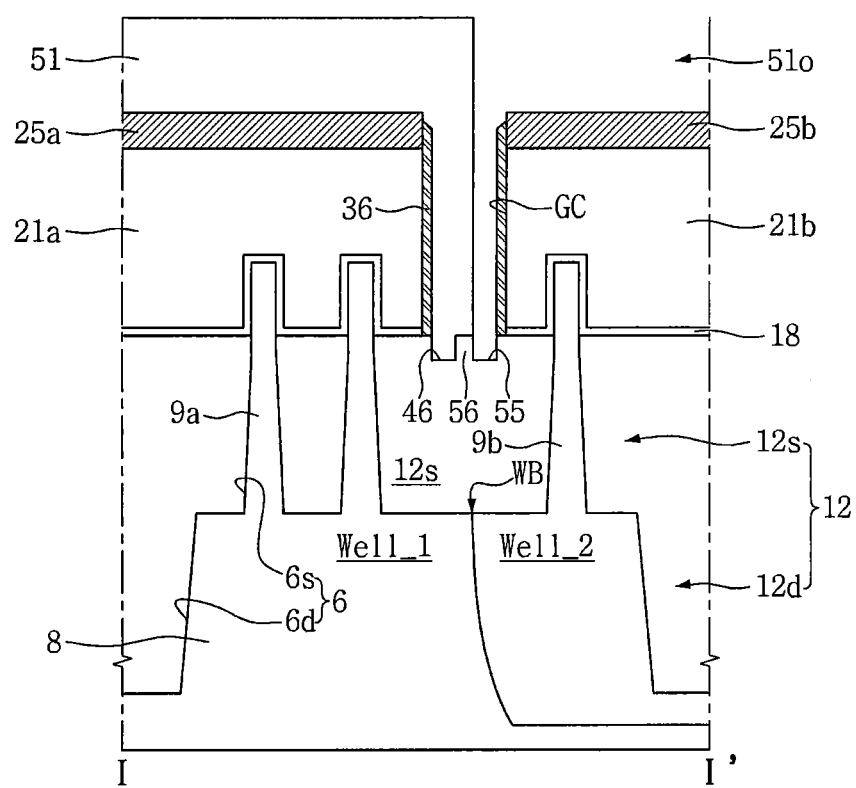
Figure 12B:
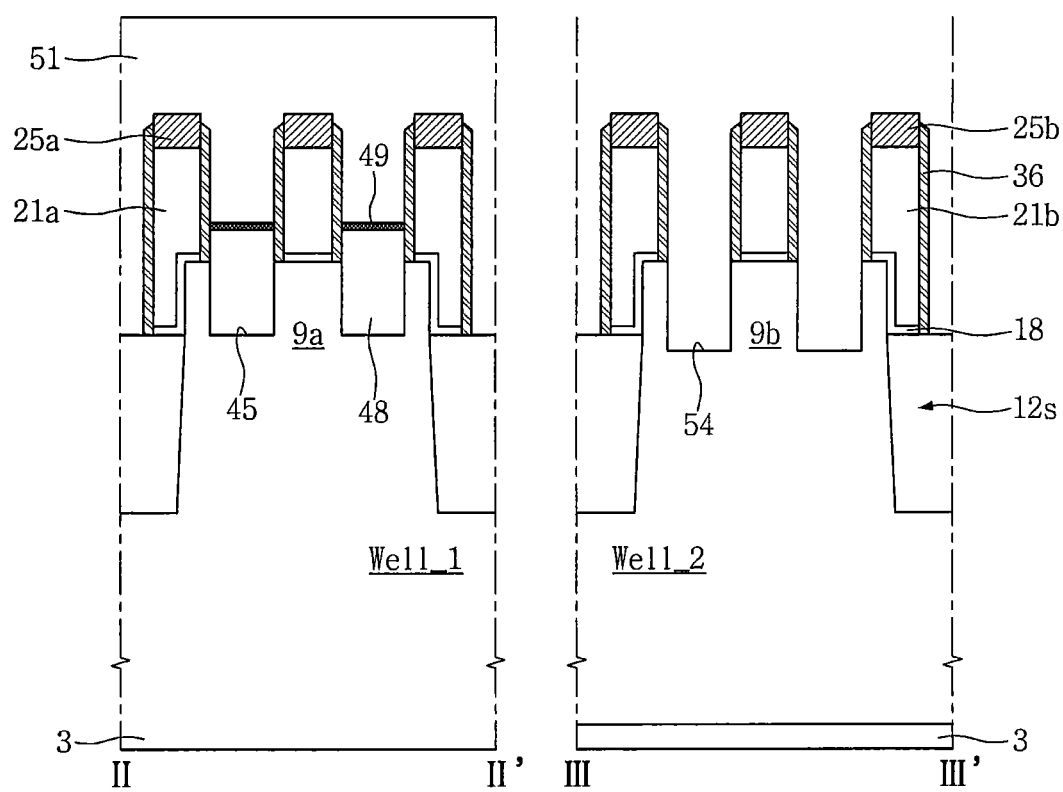

Referring to FIGS. 11, 12A, and 12B, methods of fabricating the semiconductor device in accordance with embodiments of the inventive concepts may include forming a surface protection layer 49, a second etching mask pattern 51, and a second active recess area 54.

The surface protection layer 49 may be formed by oxidizing the upper surface of the first semiconductor layer 48. The surface protection layer 49 may be formed of silicon oxide.

The second etching mask pattern 51 may be formed on the semiconductor substrate 3 having the surface protection layer 49. The second etching mask pattern 51 may include an opening 51O exposing the second fin active region 9b and cover the first fin active region 9a. The second etching mask pattern 51 may be formed as a photoresist pattern.

The second etching mask pattern 51 may cover the first well region Well_1 and partially cover the second well region Well_2. The second etching mask pattern 51 may overlap the boundary WB between the first and second well regions Well_1 and Well_2. A side portion of the second etching mask pattern 51 may be disposed in the gate cut area GC, and the second etching mask pattern 51 may cover the boundary WB between the first and second well regions Well_1 and Well_2. A side surface of the second etching mask pattern 51 disposed in the gate cut area GC between the first and second sacrificial gate patterns 21a and 21b may be closer to the second sacrificial gate pattern 21b than the first sacrificial gate pattern 21a.

The formation of the second active recess area 54 may include etching the second fin active region 9b interposed between the second sacrificial gate patterns 21b using the second etching mask pattern 51, the second hardmask pattern 25b, and the gate spacers 36 as etching masks.

In some embodiments, the second active recess area 54 may have a deeper bottom than the first active recess area 45. A plurality of second active recess areas 54 spaced apart from each other may be formed by etching the second fin active region 9b having N-type conductivity. A plurality of first active recess areas 45 spaced apart from each other may be formed by etching the first fin active region 9a having P-type conductivity. The mobility and leakage current of carriers in a channel area of a transistor may be factors affecting the performance of the transistor. In order to improve the performance of a PMOS transistor by increasing the mobility of carriers, that is, holes, in a channel area of the PMOS transistor, the second active recess area 54 may be formed to be deeper than the first active recess area 45 of the NMOS transistor. In order to increase the mobility of carriers, that is, electrons, in the channel area of the NMOS transistor and minimize the leakage current of the NMOS transistor, the first active recess area 45 may be formed to be shallower than the second active recess area 54 of the PMOS transistor.

In some embodiments, while the second active recess area 54 is formed, the second hardmask pattern 25b may be partially etched and an upper surface thereof may be lowered.

In other embodiments, while the second active recess area 54 is formed, upper portions of the gate spacers 36 may be etched and lowered.

In still other embodiments, while the second active recess area 54 is formed, the shallow isolation region 12s of the isolation region 12 may be partially etched to form a second field recess area 55. A surface of the shallow isolation region 12s of the isolation region 12 interposed between the first and second sacrificial gate patterns 21a and 21b may be indented. For example, the surface of the shallow isolation region 12s of the isolation region 12 interposed between the first and second sacrificial gate patterns 21a and 21b may include first and second field recess portions 46 and 55 and a protrusion 56 relatively protruding between the first and second field recess portions 46 and 55.

The second etching mask pattern 51 may be removed.

Figure 13A:
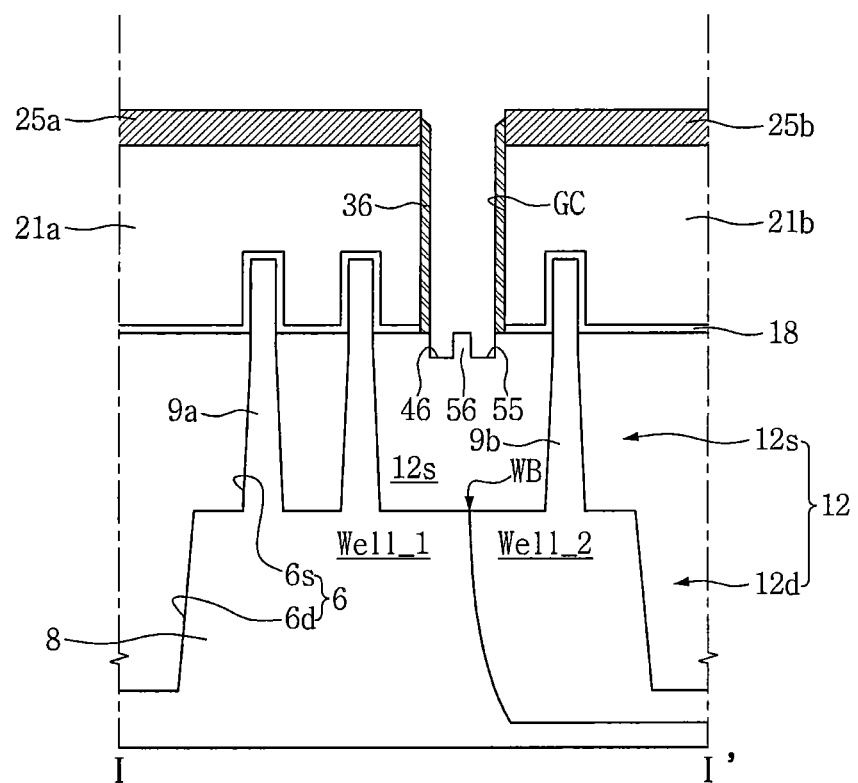
Figure 13B:
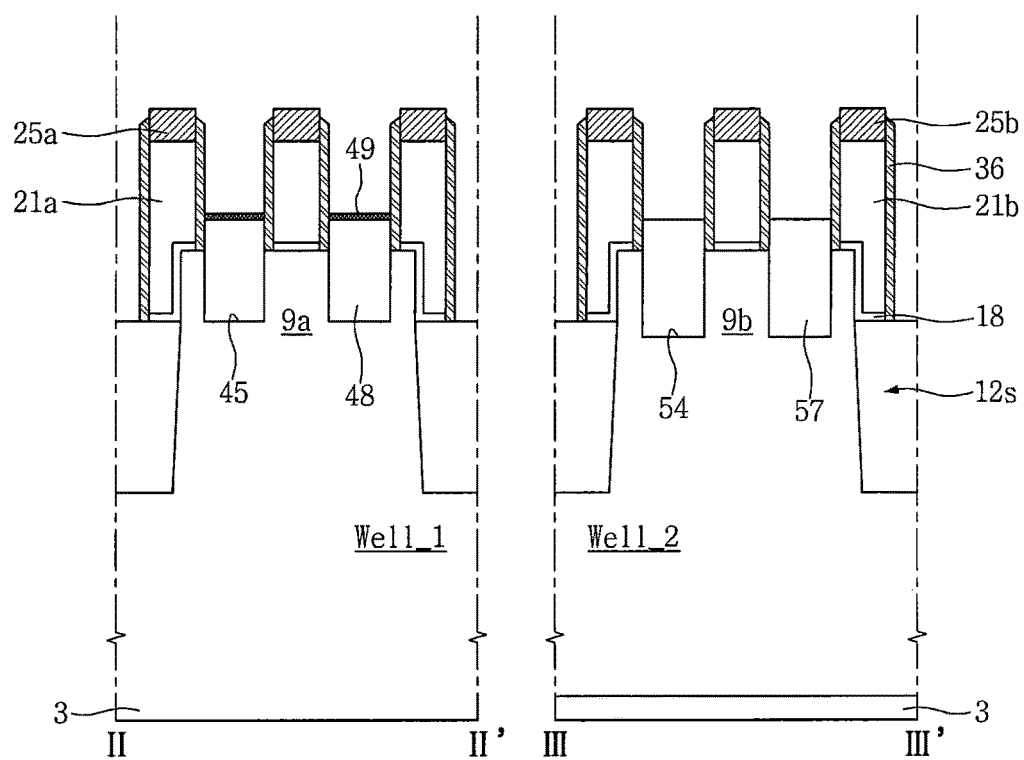

Referring to FIGS. 11, 13A, and 13B, methods of fabricating the semiconductor device in accordance with embodiments of the inventive concepts may include forming a second semiconductor layer 57. The formation of the second semiconductor layer 57 may include a second SEG process. For example, when the second well region Well_2 has N-type conductivity, the second semiconductor layer 57 may be formed of a SiGe layer using the second SEG process.

While the second semiconductor layer 57 is formed, the surface protection layer 49 disposed on the first semiconductor layer 48 may prevent growth of an SEG layer on the surface of the first semiconductor layer 48 during the second SEG process.

The second semiconductor layer 57 may fill the second active recess area 54 and have an upper surface disposed at a higher level than the upper surface of the second fin active region 9b. The second semiconductor layer 57 may be a stressor that applies a compressive stress to a channel area of a PMOS transistor to increase the mobility of carriers of the PMOS transistor, that is, holes.

In some embodiments, an upper surface of the second semiconductor layer 57 may be at a different level from the upper surface of the first semiconductor layer 48. For example, in order to apply a higher compressive stress to the channel area of the PMOS transistor to increase the mobility of holes in the channel area, the upper surface of the second semiconductor layer 57 may be disposed at a higher level than the upper surface of the first semiconductor layer 48.

In other embodiments, by performing source/drain ion-implantation processes, the first semiconductor layer 48 may be formed to have a different conductivity-type from the first well region Well_1, and the second semiconductor layer 57 may be formed to have a different conductivity-type from the second well region Well_2. For example, the first semiconductor layer 48 may have N-type conductivity, and the second semiconductor layer 57 may have P-type conductivity. Accordingly, the first semiconductor layer 48 may be a source/drain area of the NMOS transistor, and the second semiconductor layer 57 may be a source/drain area of the PMOS transistor.

In still other embodiments, the surface protection layer 49 may be removed.

Figure 14:
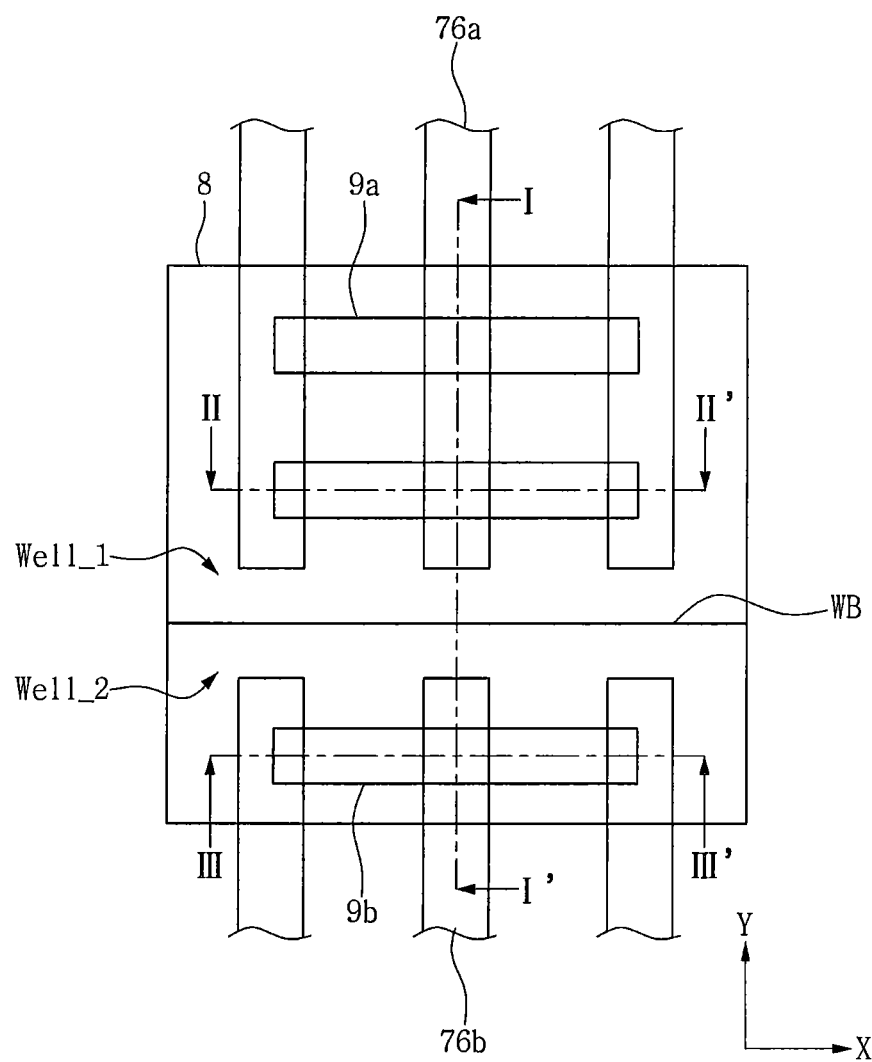
Figure 15A:
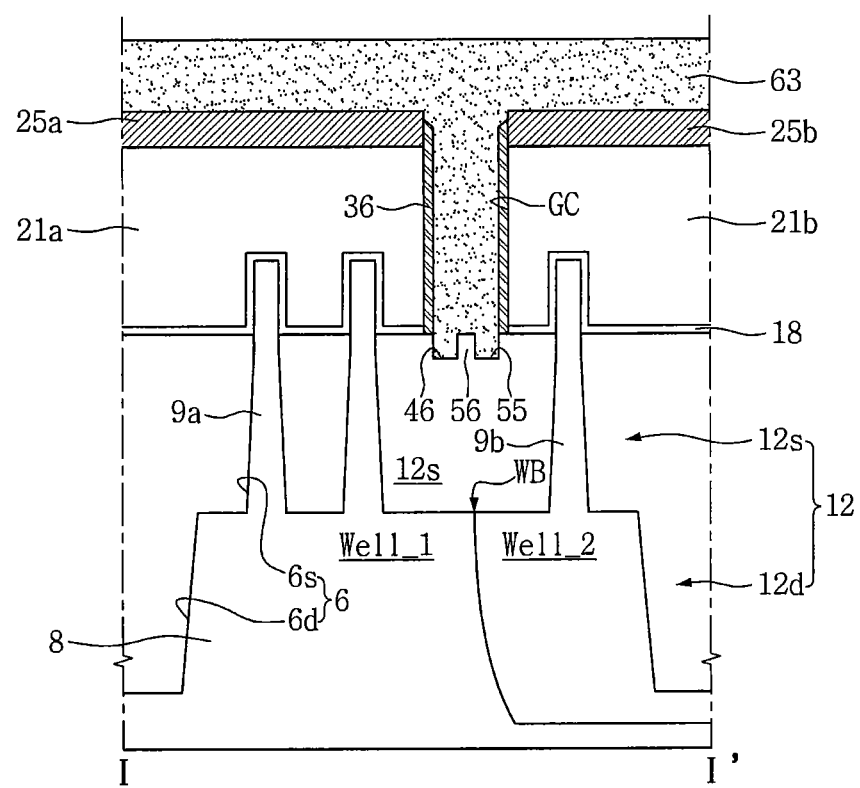
Figure 15B:
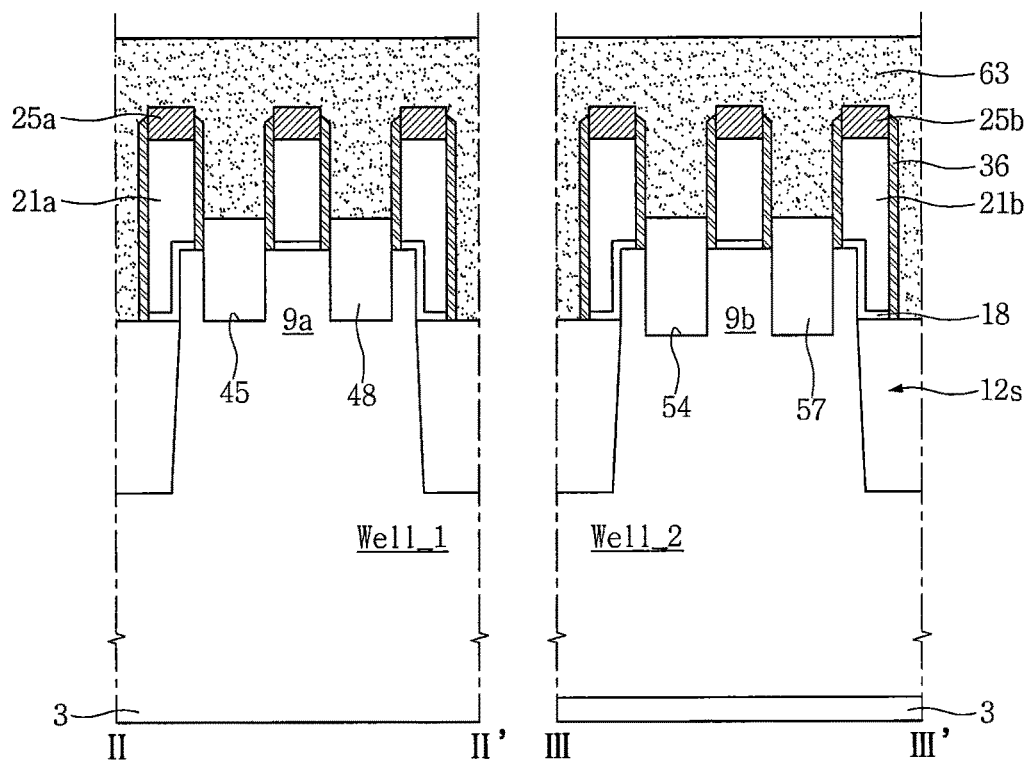

Referring to FIGS. 14, 15A, and 15B, methods of fabricating the semiconductor device in accordance with embodiments of the inventive concepts may include forming an interlayer insulating layer 63.

The interlayer insulating layer 63 may cover the first and second semiconductor layers 48 and 57 and the first and second hardmask patterns 25a and 25b. Upper surfaces of the first and second hardmask patterns 25a and 25b may be at the same level or substantially coplanar prior to forming the interlayer insulating layer 63 thereon. The interlayer insulating layer 63 may be formed of an insulating material (e.g. silicon oxide).

Figure 16A:
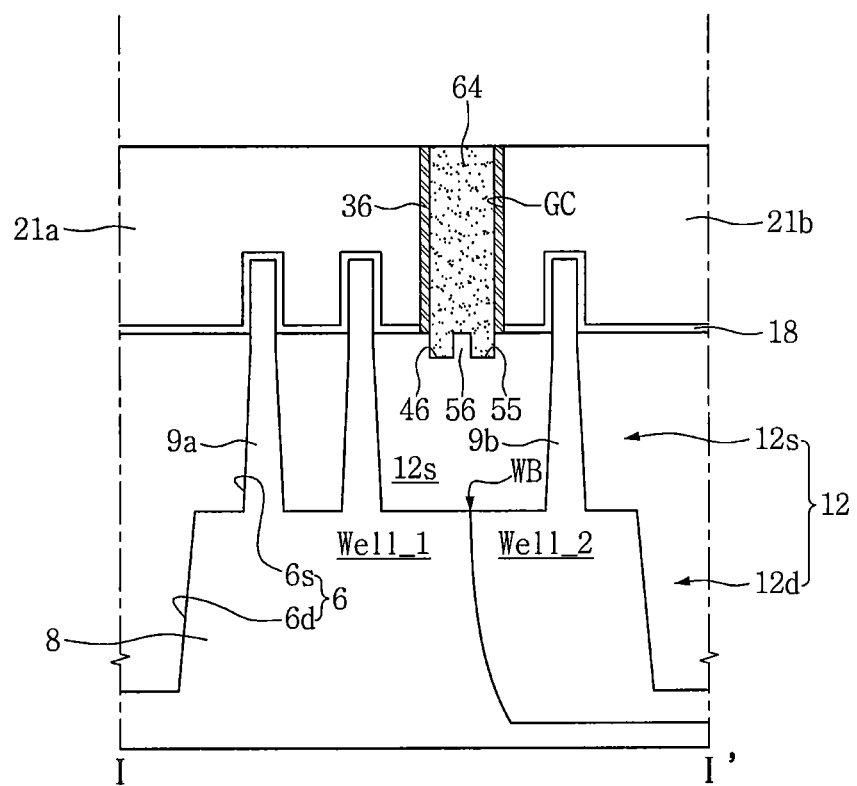
Figure 16B:
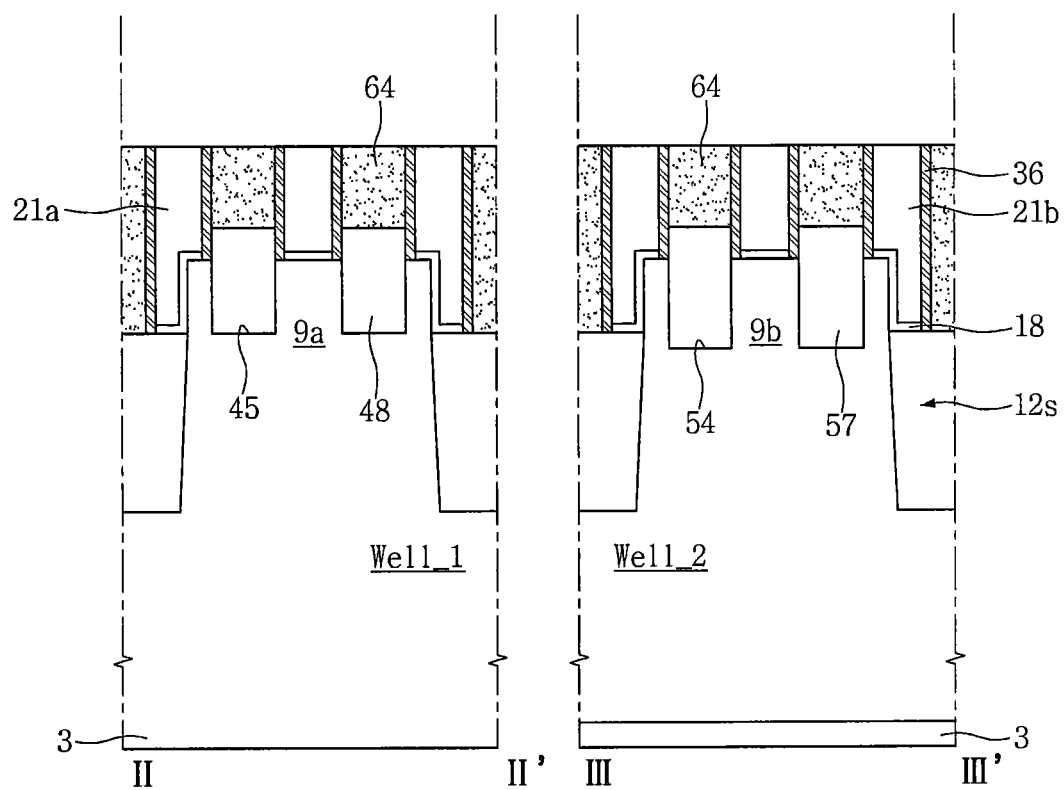

Referring to FIGS. 14, 16A, and 16B, methods of fabricating the semiconductor device in accordance with embodiments of the inventive concepts may include forming a planarized interlayer insulating layer pattern 64 by planarizing the interlayer insulating layer 63. The planarizing of the interlayer insulating layer 63 may be performed using a chemical mechanical polishing (CMP) process. While the interlayer insulating layer 63 is planarized, the first and second hardmask patterns 25a and 25b may be removed. At this time, the gate spacers 36 may be partially removed. Accordingly, the first and second sacrificial gate patterns 21a and 21b may be exposed. Upper surfaces of the gate spacers 36 may be exposed.

Figure 17A:
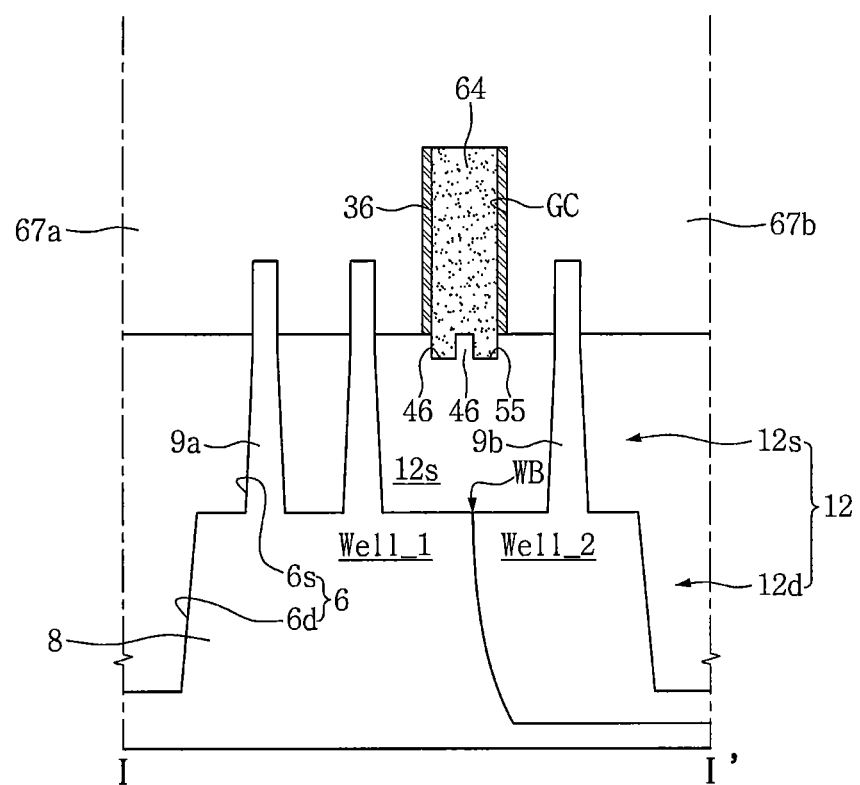
Figure 17B:
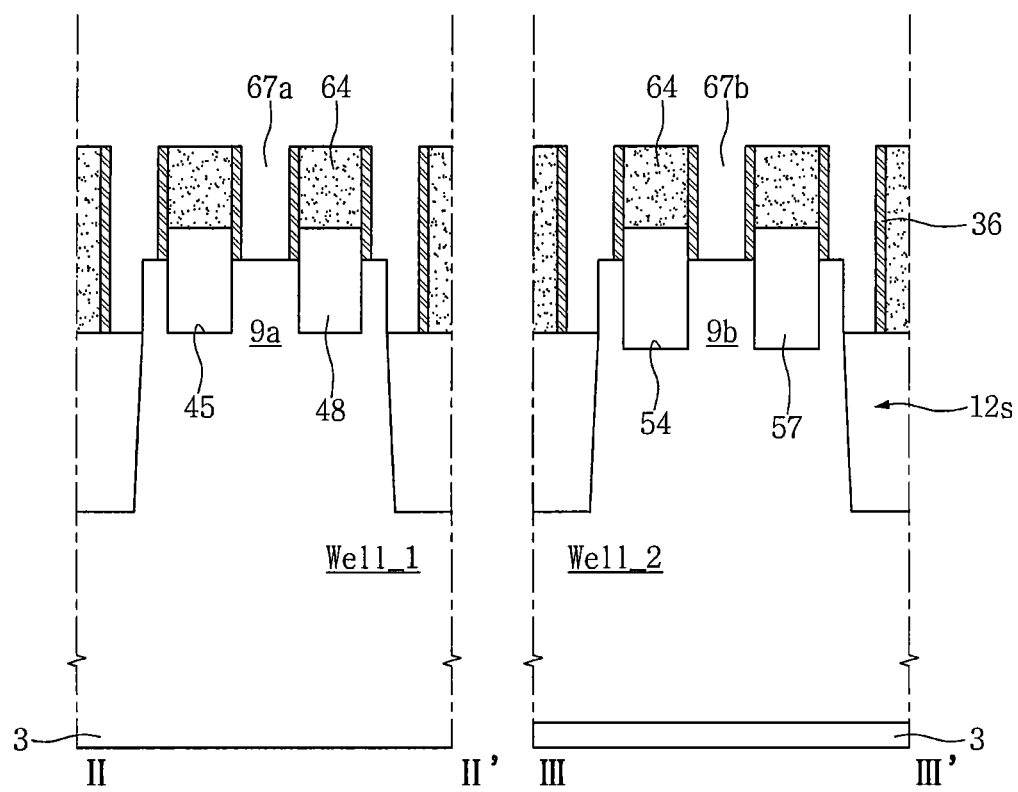

Referring to FIGS. 14, 17A, and 17B, methods of fabricating the semiconductor device in accordance with embodiments of the inventive concepts may include forming a first gate trench 67a and a second gate trench 67b by removing the first and second sacrificial gate patterns 21a and 21b and the base insulating layer 18. The first gate trench 67a may expose the upper surface of the first fin active region 9a, and the second gate trench 67b may expose the upper surface of the second fin active region 9b. The first gate trench 67a may partially expose sidewalls of the first fin active region 9a and an upper surface of the shallow isolation region 12s of the isolation region 12. The second gate trench 67b may partially expose sidewalls of the second fin active region 9b and the upper surface of the shallow isolation region 12s of the isolation region 12.

Figure 18A:
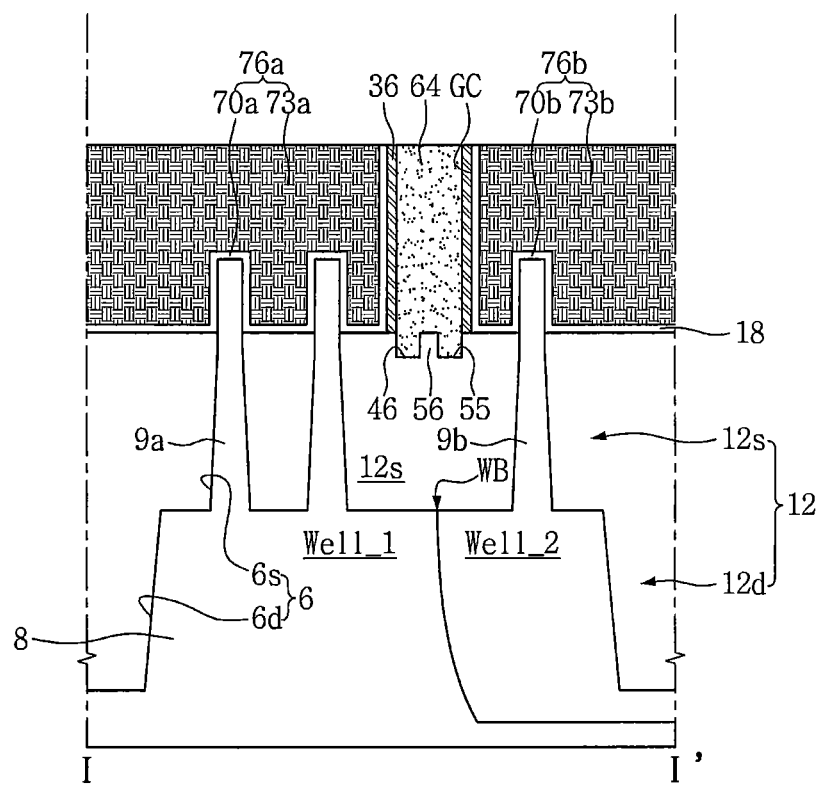
Figure 18B:
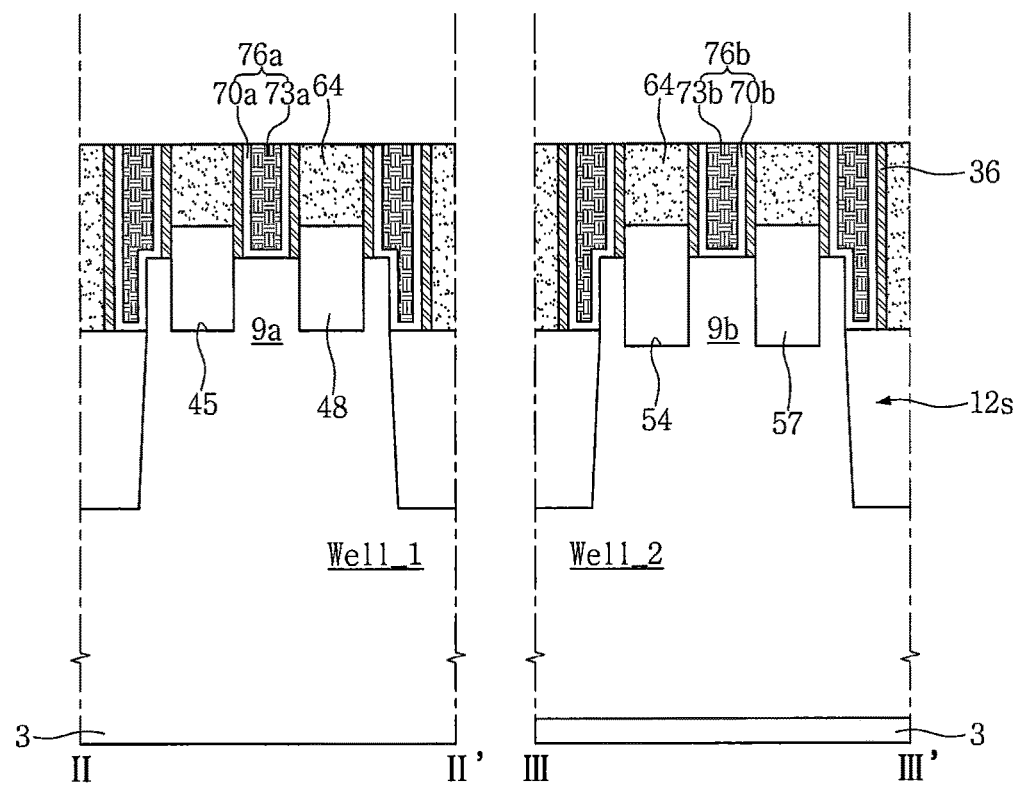

Referring to FIGS. 14, 18A, and 18B, methods of fabricating the semiconductor device in accordance with embodiments of the inventive concepts may include forming a first gate structure 76a and a second gate structure 76b. The first gate structure 76a may be formed in the first gate trench 67a, and the second gate structure 76b may be formed in the second gate trench 67b.

The first gate structure 76a may include a first gate dielectric layer 70a conformally formed on sidewalls and a bottom of the first gate trench 67a, and a first gate electrode 73a formed on the first gate dielectric layer 70a and filling the first gate trench 67a. The second gate structure 76b may include a second gate dielectric layer 70b conformally formed on sidewalls and a bottom of the second gate trench 67b, and a second gate electrode 73b formed on the second gate dielectric layer 70b and filling the second gate trench 67b.

The first and second gate dielectric layers 70a and 70b may include a high-k dielectric material formed by a deposition process. The first and second gate electrodes 73a and 73b may include, for example, a metal nitride (e.g. TiN or WN) and/or a metal material (e.g. W).

The first gate structure 76a crossing the first fin active region 9a, and the first semiconductor layer 48 disposed at a side of the first gate structure 76a may define a first MOS transistor. The second gate structure 76b crossing the second fin active region 9b, and the second semiconductor layer 57 disposed at a side of the second gate structure 76b may define a second MOS transistor. The first MOS transistor may be an NMOS transistor, and the second MOS transistor may be a PMOS transistor. The NMOS transistor and the PMOS transistor may be adjacent to each other. The NMOS transistor and the PMOS transistor may be disposed in the second direction Y and spaced apart from each other, and the interlayer insulating layer pattern 64 is interposed therebetween.

The NMOS transistor and the PMOS transistor formed by methods of fabricating semiconductor devices in accordance with embodiments of the inventive concepts may have finFET structures, and a distance between the NMOS transistor and the PMOS transistor may be reduced or minimized. According to embodiments of the inventive concepts, methods of forming the NMOS transistor and the PMOS transistor having a reduced or minimized distance therebetween may be provided with no process failures. Accordingly, productivity of the semiconductor device may be improved.

Next, methods of fabricating semiconductor devices in accordance with other embodiments of the inventive concepts will be described with reference to FIGS. 19 to 29b. FIGS. 19, 21, 24, and 27 are plan views for describing methods of fabricating semiconductor devices in accordance with other embodiments of the inventive concepts, FIGS. 20A, 22A, 23A, 25A, 26A, 28A, and 29A are cross-sectional views illustrating areas taken along lines I-I' in the plan views of FIGS. 19, 21, 24, and 27, and FIGS. 20B, 22B, 23B, 25B, 26B, 28B, and 29B are cross-sectional views illustrating areas taken along lines II-IF and in the plan views of FIGS. 19, 21, 24, and 27.

Figure 19:
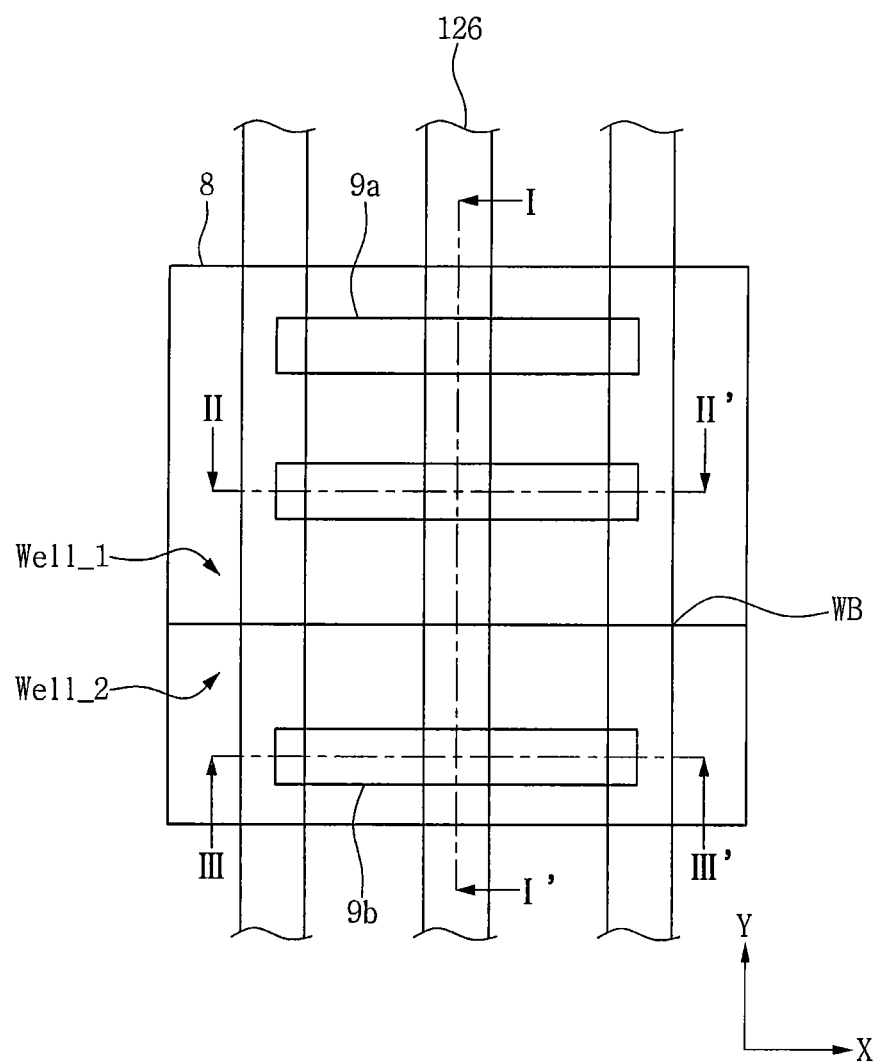
FIGS. 19 to 29B are diagrams illustrating methods of fabricating semiconductor devices in accordance with some embodiments of the inventive concepts.
Figure 20A:
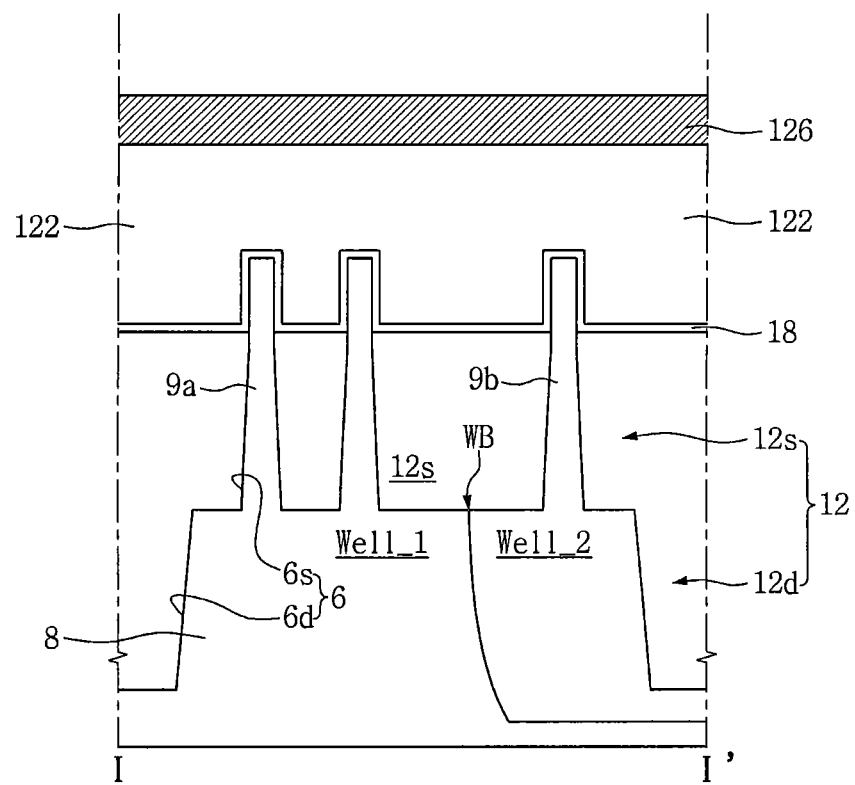
Figure 20B:
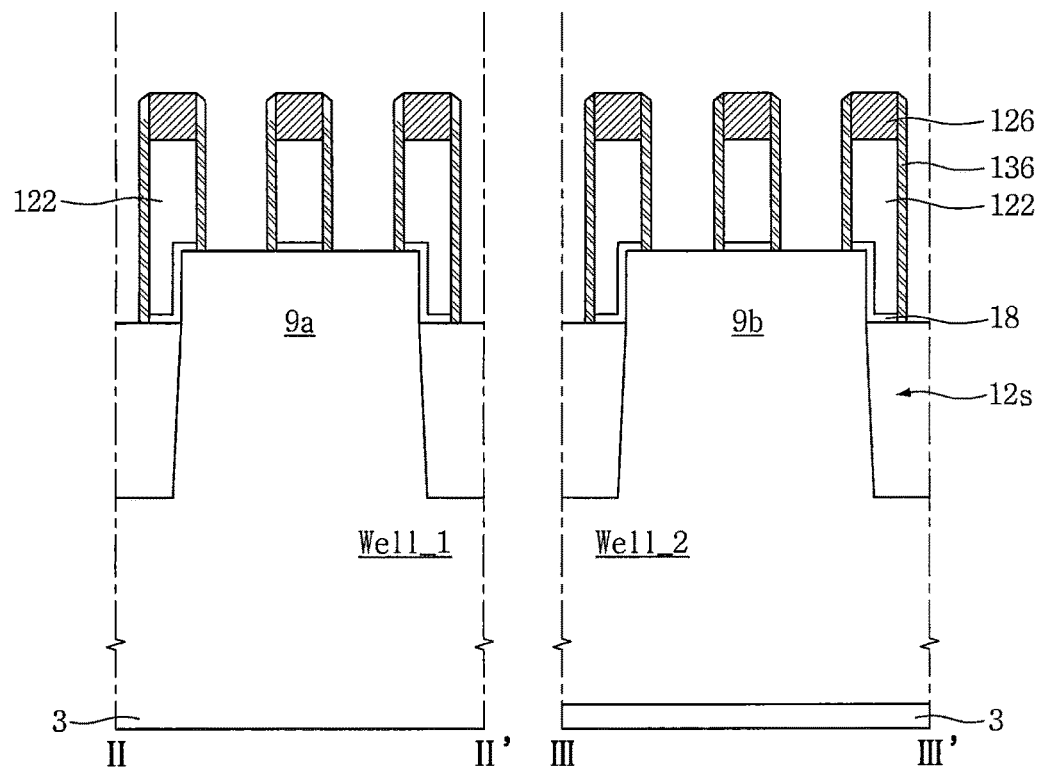

Referring to FIGS. 19, 20A, and 20B, methods of fabricating the semiconductor device in accordance with embodiments of the inventive concepts may include forming the first and second well regions Well_1 and Well_2 in the semiconductor substrate 3, as described with reference to FIGS. 1, 2A, and 2B. Methods of fabricating the semiconductor device in accordance with embodiments of the inventive concepts may include the isolation region 12, the base insulating layer 18, the sacrificial gate layer 21, and the hardmask layer 24 defining the active regions 8, 9a, and 9b, as described with reference to FIGS. 1, 2A, and 2B.

Methods of fabricating the semiconductor device in accordance with embodiments of the inventive concepts may include forming a hardmask line 126 by patterning the hardmask layer (reference numeral 24 in FIGS. 2A and 2B). The hardmask line 126 may have the same shape as the hardmask line 25 described with reference to FIGS. 1, 3A, and 3B, and a plurality of hardmask lines 126 may be formed.

Methods of fabricating the semiconductor device in accordance with embodiments of the inventive concepts may include etching the sacrificial gate layer 21 and the base insulating layer 18 using the hardmask line 126 as an etching mask. The sacrificial gate layer 21 may be etched to form a sacrificial gate line 122.

Methods of fabricating the semiconductor device in accordance with embodiments of the inventive concepts may include forming gate spacers 136 on side surfaces of the sacrificial gate line 122 and the hardmask line 126. The gate spacers 136 may be formed of an insulating material (e.g. silicon nitride).

Figure 21:
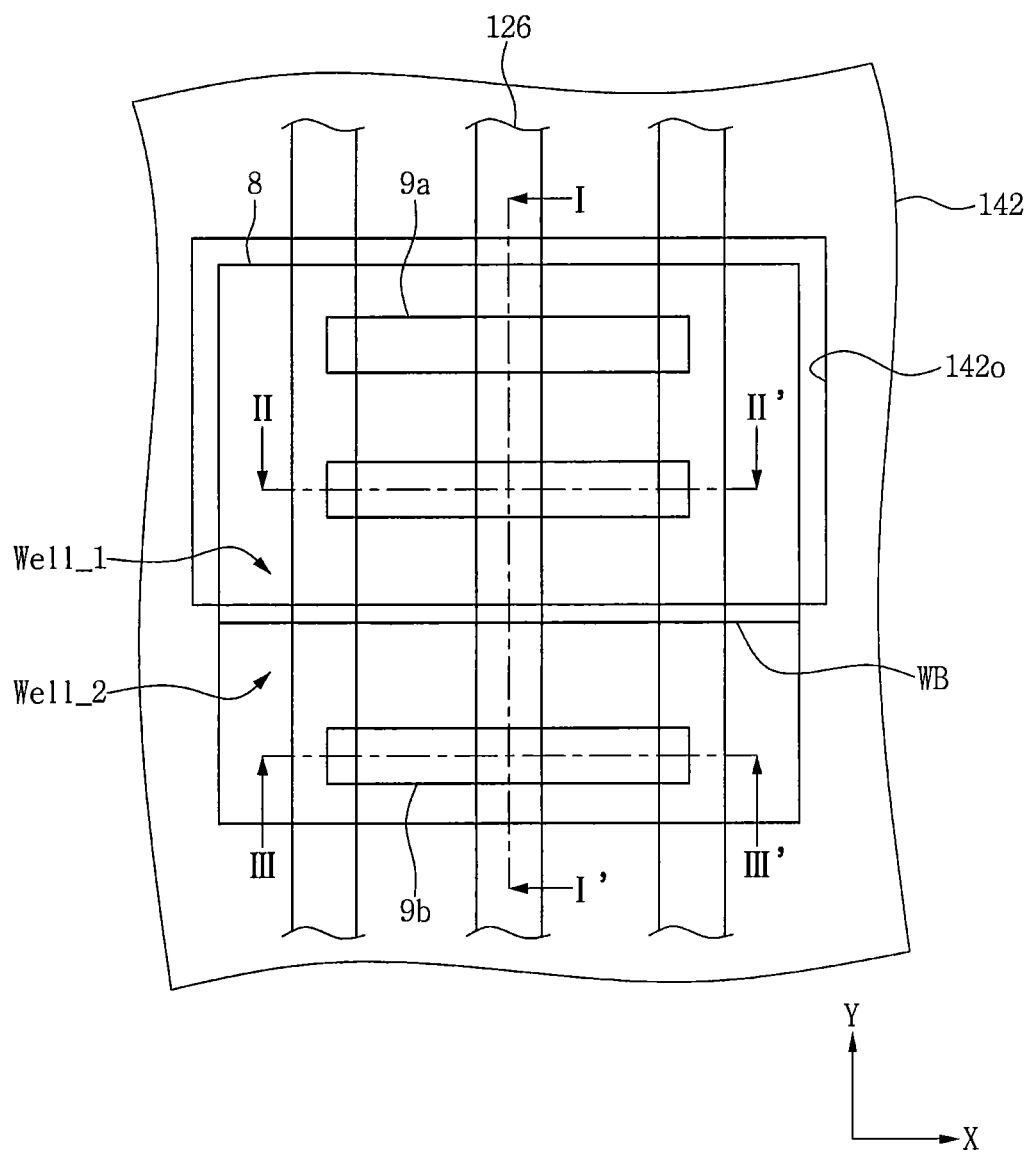
Figure 22A:
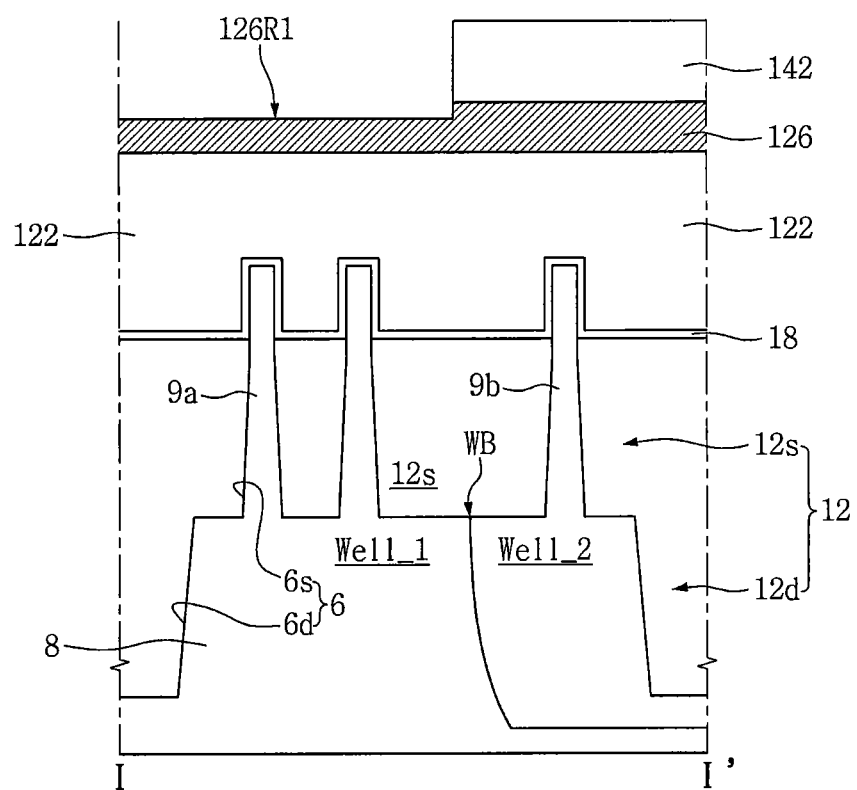
Figure 22B:
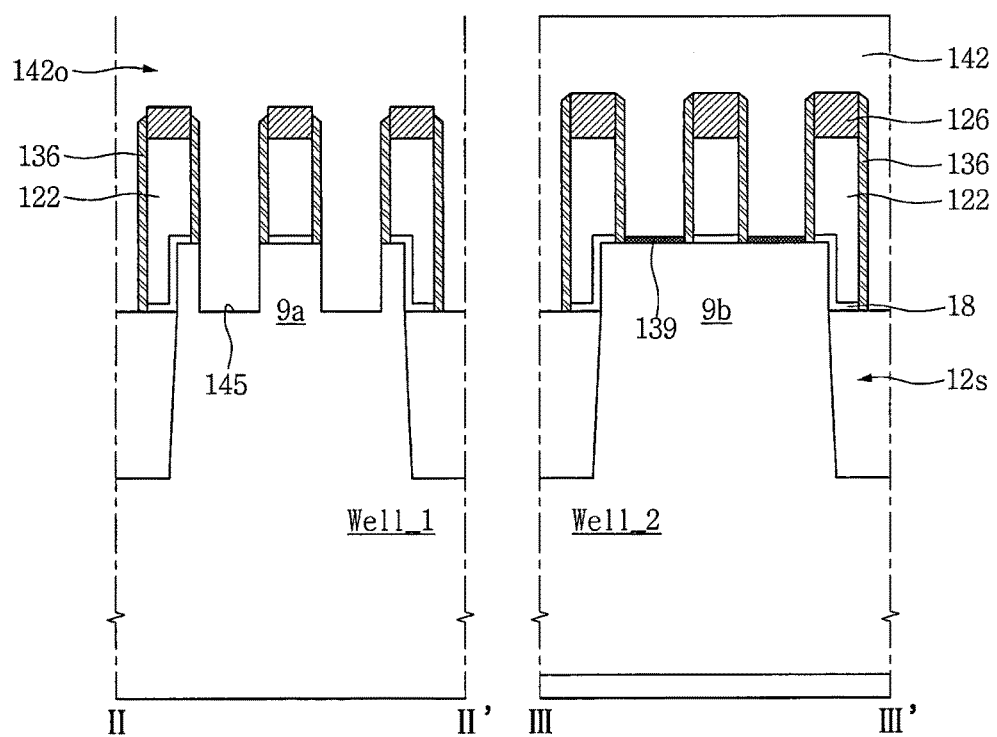

Referring to FIGS. 21, 22A, and 22B, methods of fabricating the semiconductor device in accordance with embodiments of the inventive concepts may include forming a surface protection layer 139, a first etching mask pattern 142, and a first active recess area 145.

The surface protection layer 139 may be formed by forming the gate spacers 136 and oxidizing exposed surfaces of the fin active regions 9a and 9b.

The first etching mask pattern 142 may be formed on the semiconductor substrate 3 having the surface protection layer 139. The first etching mask pattern 142 may be formed as a photoresist pattern.

The first etching mask pattern 142 may include an opening 142o exposing the first fin active region 9a and covering the second fin active region 9b. The first etching mask pattern 142 may cover the second well region Well_2 and partially cover the first well region Well_1. The first etching mask pattern 142 may overlap the boundary WB between the first and second well regions Well_1 and Well_2.

The formation of the first active recess area 145 may include etching the first fin active region 9a using the first etching mask pattern 142, the hardmask line 126, and the gate spacers 136 as etching masks. While the first active recess area 145 is formed, the hardmask line 126 may be partially etched to form a first hardmask recess portion 126R1.

Next, the first etching mask pattern 142 may be removed.

Figure 23A:
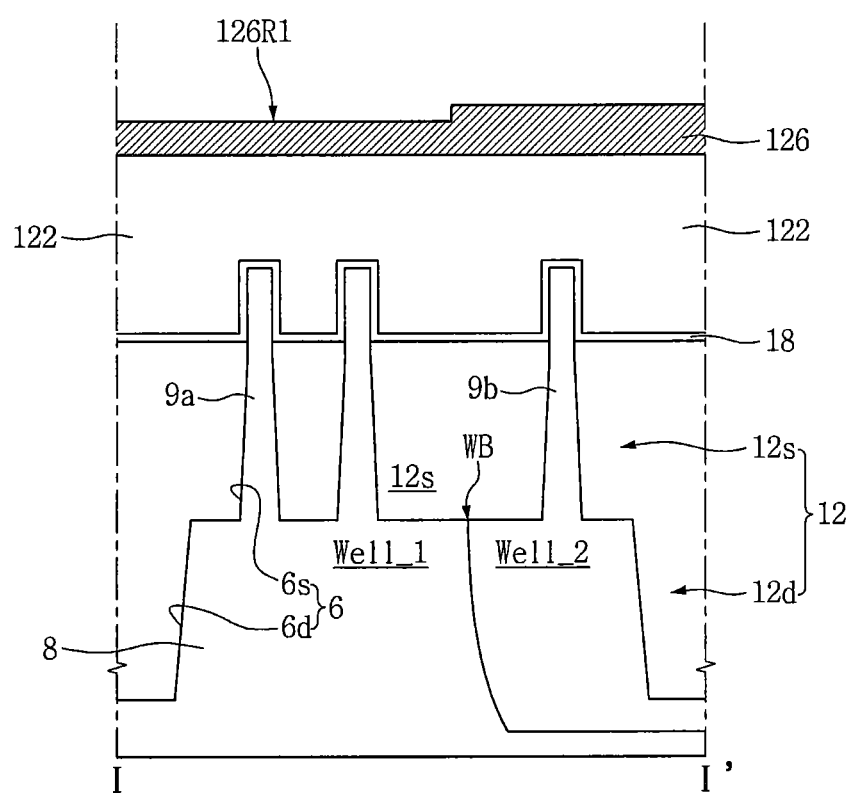
Figure 23B:
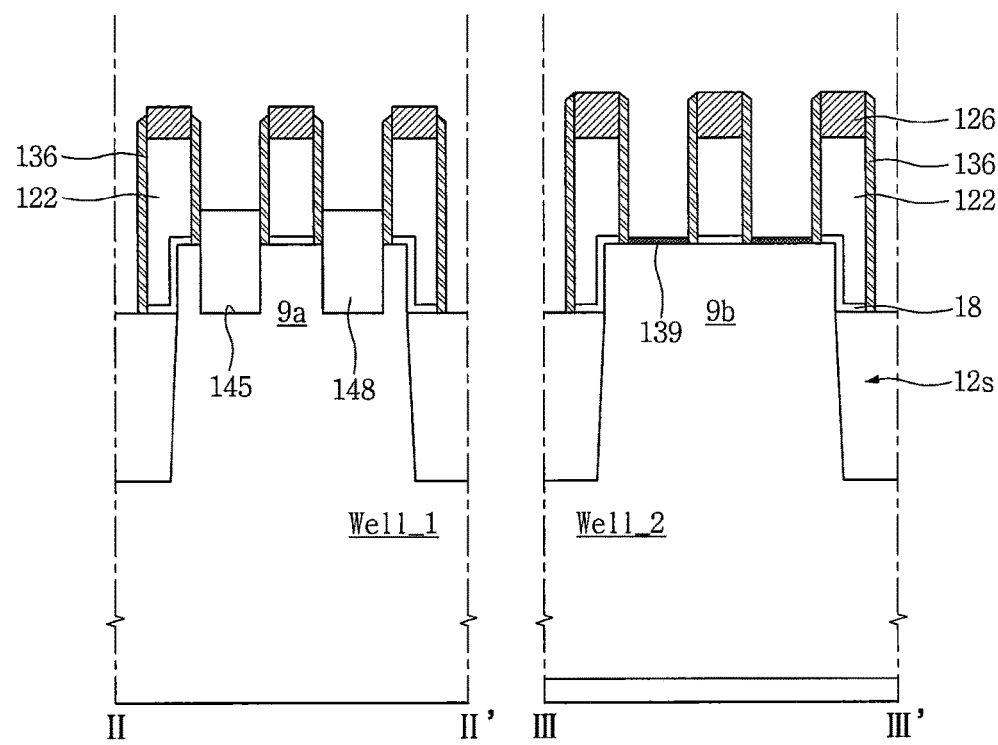

Referring to FIGS. 21, 23A, and 23B, methods of fabricating the semiconductor device in accordance with embodiments of the inventive concepts may include forming a first semiconductor layer 148 by performing the first SEG process described with reference to FIGS. 10A and 10B. While the first semiconductor layer 148 is formed, the surface protection layer 139 disposed on the second fin active region 9b may prevent growth of an SEG layer on the surface of the second fin active region 9b during the first SEG process.

The first semiconductor layer 148 may fill the first active recess area 145 and have an upper surface disposed at a higher level than an upper surface of the first fin active region 9a.

Figure 24:
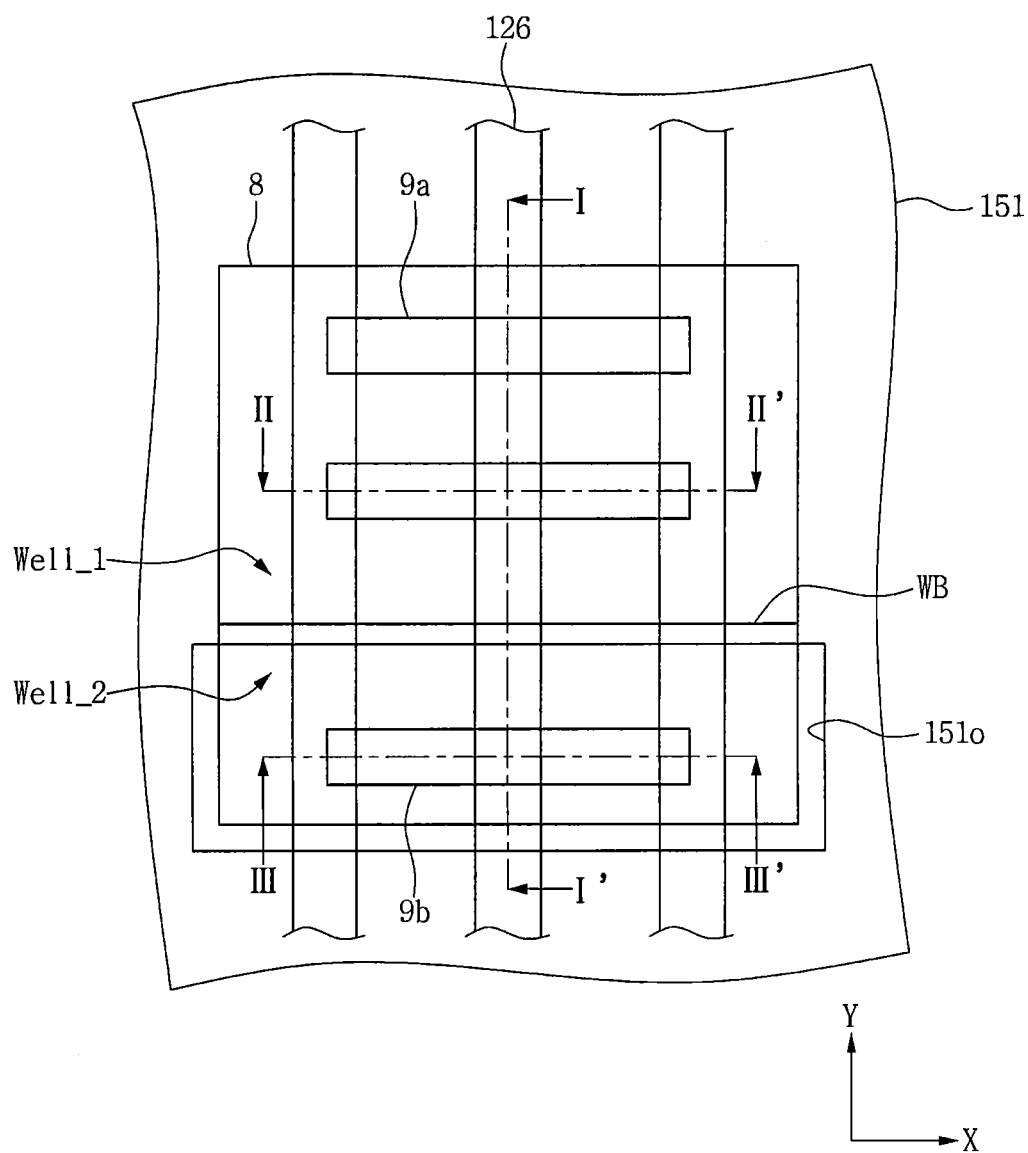
Figure 25A:
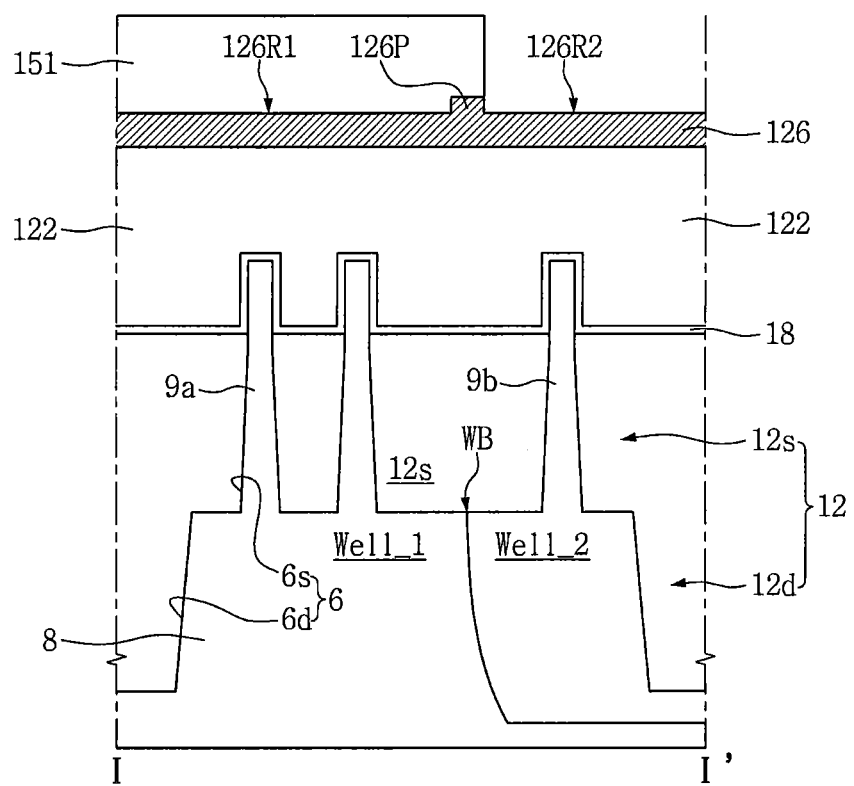
Figure 25B:
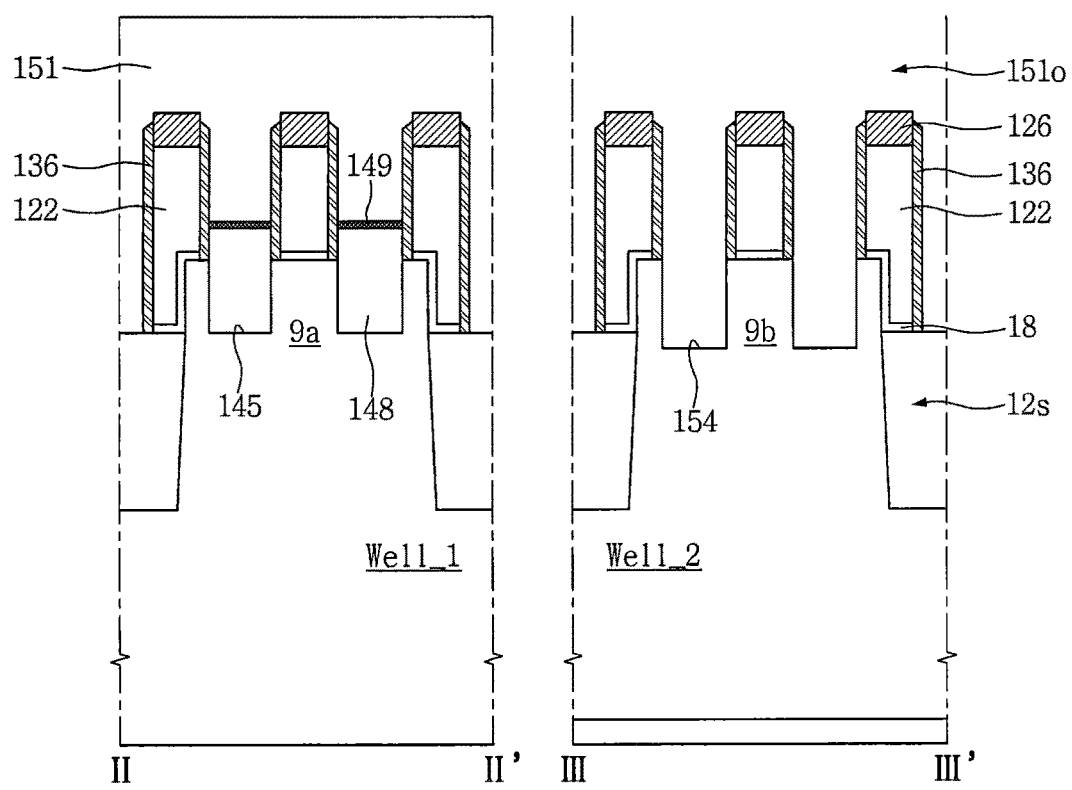

Referring to FIGS. 24, 25A, and 25B, methods of fabricating the semiconductor device in accordance with embodiments of the inventive concepts may include forming a surface protection layer 149, a second etching mask pattern 151, and a second active recess area 154.

The surface protection layer 149 may be formed by oxidizing an upper surface of the first semiconductor layer 148. The second etching mask pattern 151 may be formed on the semiconductor substrate 3 having the surface protection layer 149. The second etching mask pattern 151 may include an opening 151O exposing the second fin active region 9b and cover the first fin active region 9a. The second etching mask pattern 151 may be formed as a photoresist pattern. The second etching mask pattern 151 may cover the first well region Well_1 and partially cover the second well region Well_2. The second etching mask pattern 151 may overlap the boundary WB between the first and second well regions Well_1 and Well_2.

The formation of the second active recess area 154 may include etching the second fin active region 9b interposed between the sacrificial gate lines 122, using the second etching mask pattern 151, the hardmask line 126, and the gate spacers 136 as etching masks.

In some embodiments, similar to the second active recess area 54 described with reference to FIGS. 12A and 12B, in order to improve performance of the PMOS transistor, the second active recess area 154 may have a deeper bottom than the first active recess area 145 of the NMOS transistor.

In other embodiments, while the second active recess area 154 is formed, the hardmask line 126 may be partially etched and an upper surface thereof may be lowered to form a second hardmask recess portion 126R2. The first hardmask recess portion 126R1 and the second hardmask recess portion 126R2 may be spaced apart from each other. A hardmask protrusion 126P relatively protruding between the first hardmask recess portion 126R1 and the second hardmask recess portion 126R2 may be formed. The hardmask protrusion 126P may overlap the boundary WB between the first and second well regions Well_1 and Well_2 disposed on a surface of the lower active region 8.

In still other embodiments, while the second active recess area 154 is formed, upper end portions of the gate spacers 136 may be etched and lowered.

Next, the second etching mask pattern 151 may be removed.

Figure 26A:
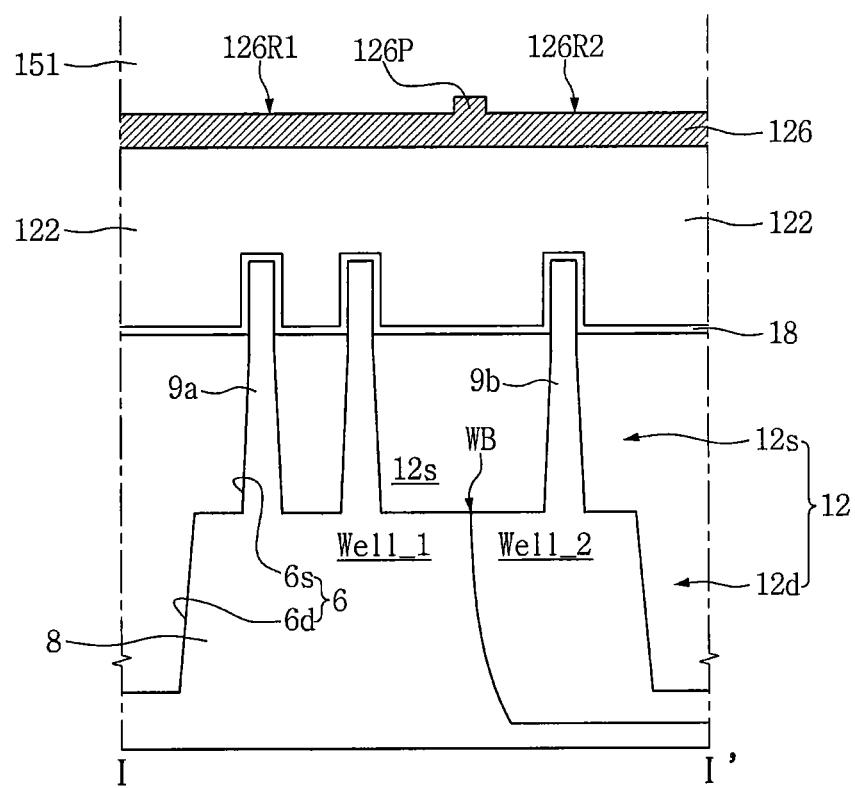
Figure 26B:
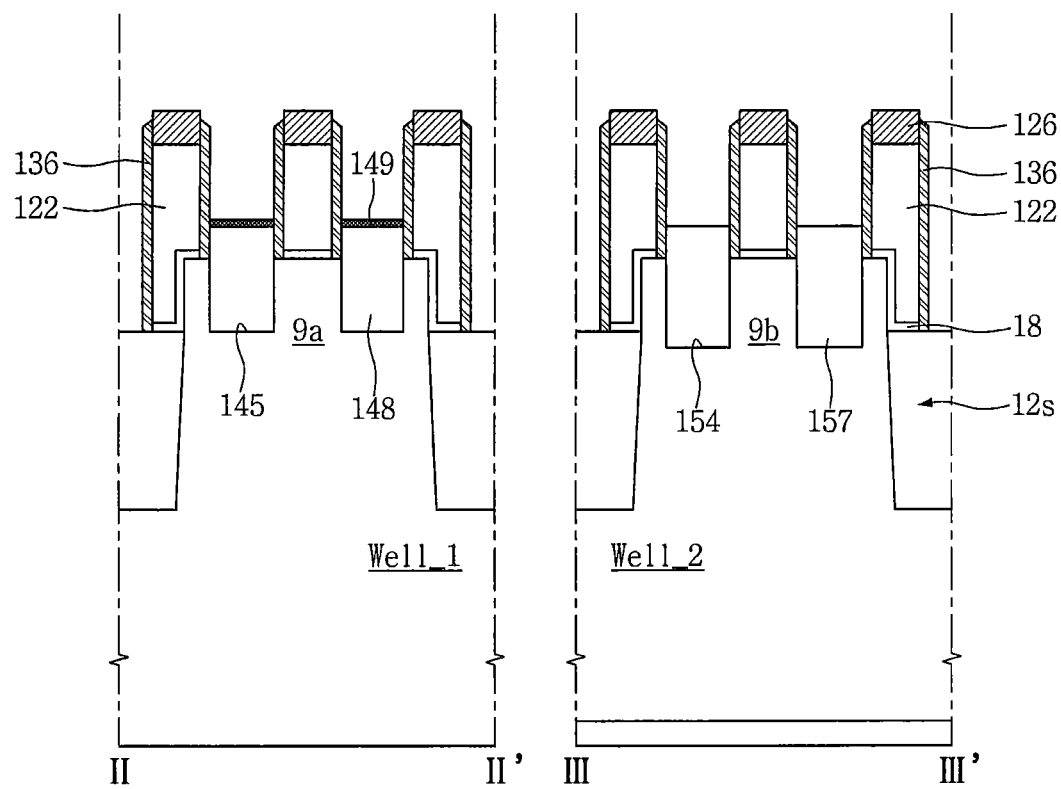

Referring to FIGS. 24, 26A, and 26B, methods of fabricating the semiconductor device in accordance with embodiments of the inventive concepts may include forming a second semiconductor layer 157. The formation of the second semiconductor layer 157 may include performing the second SEG process described with reference to FIGS. 13A and 13B. For example, the second semiconductor layer 157 may be formed of a SiGe layer using the second SEG process. While the second semiconductor layer 157 is formed, the surface protection layer 149 disposed on the first semiconductor layer 148 may protect growth of an SEG layer on the surface of the first semiconductor layer 148.

The second semiconductor layer 157 may fill the second active recess area 154 and have an upper surface disposed at a higher level than an upper surface of the second fin active region 9b. The upper surface of the second semiconductor layer 157 may be disposed at a different level from the upper surface of the first semiconductor layer 148. The upper surface of the second semiconductor layer 157 may be disposed at a higher level than the upper surface of the first semiconductor layer 148.

In some embodiments, by performing a source/drain ion-implantation process, the first semiconductor layer 148 may be formed to have a different conductivity-type from the first well region Well_1, and the second semiconductor layer 157 may be formed to have a different conductivity-type from the second well region Well_2. For example, the first semiconductor layer 148 may have N-type conductivity, and the second semiconductor layer 157 may have P-type conductivity. Accordingly, the first semiconductor layer 148 may be a source/drain area of the NMOS transistor, and the second semiconductor layer 157 may be a source/drain area of the PMOS transistor.

In other embodiments, the surface protection layer 149 may be removed.

Figure 27:
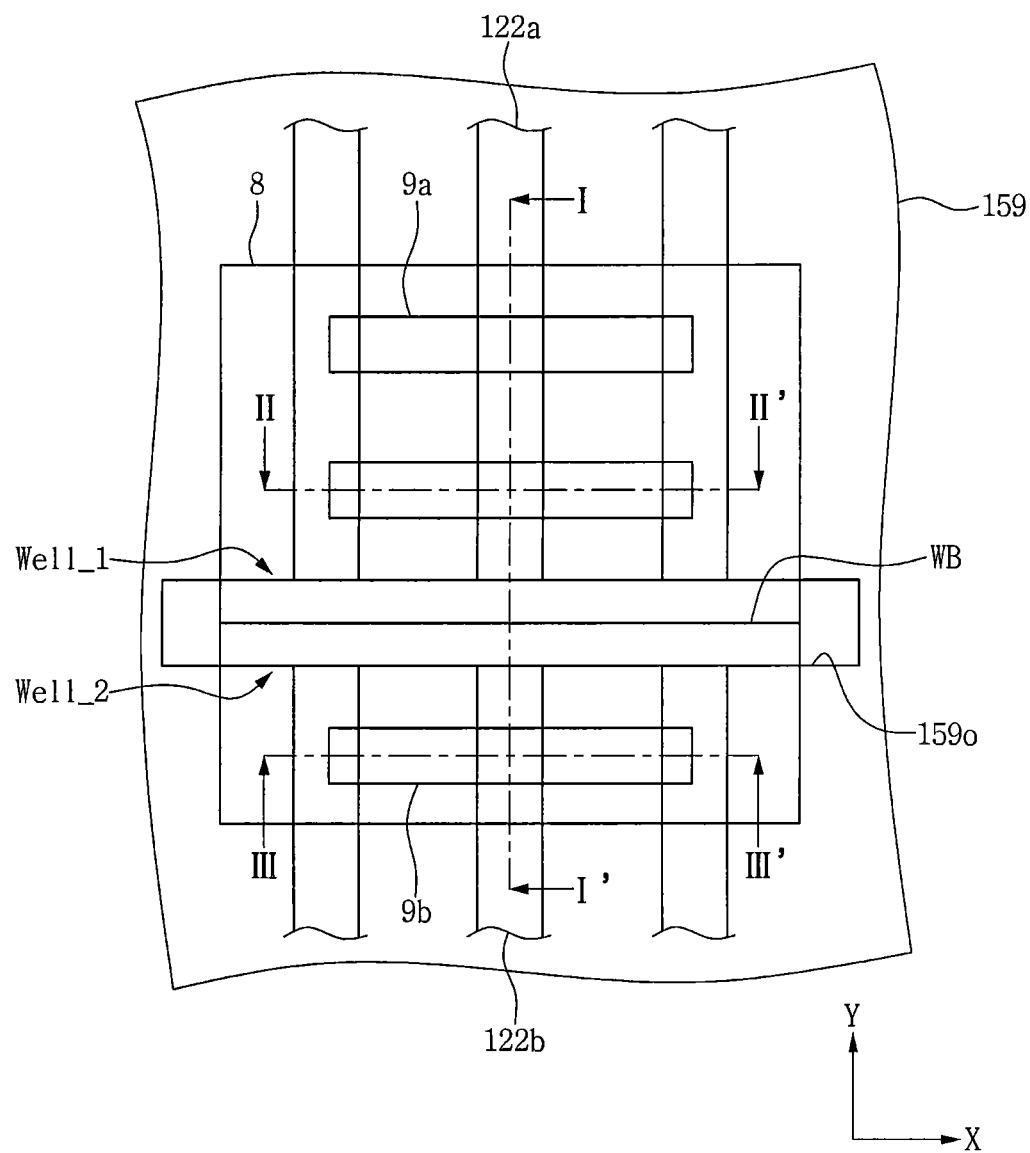
Figure 28A:
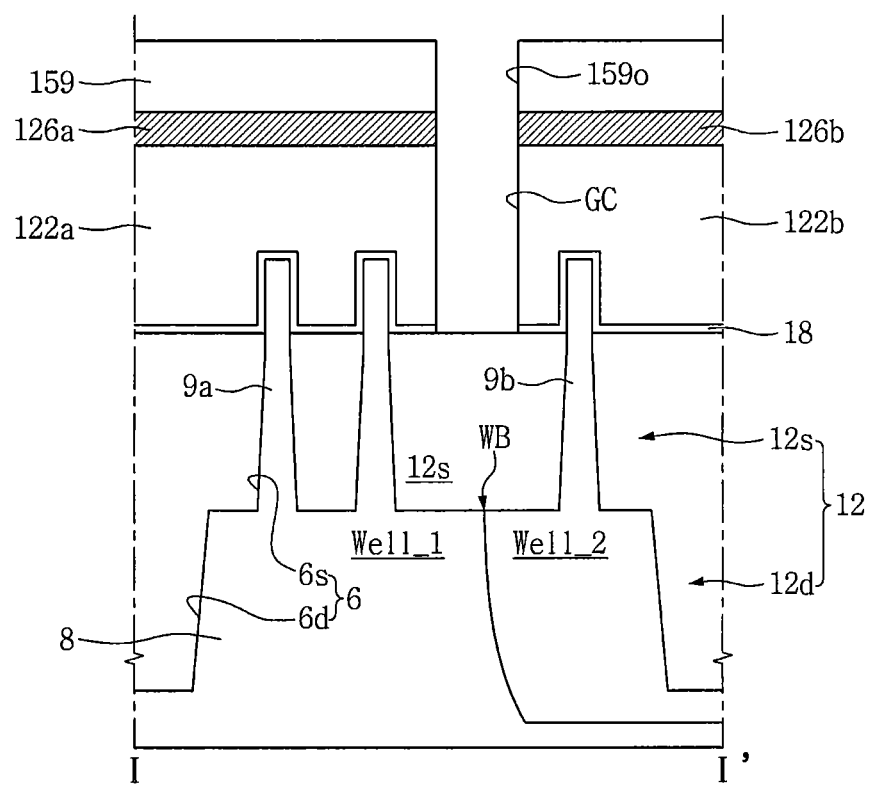
Figure 28B:
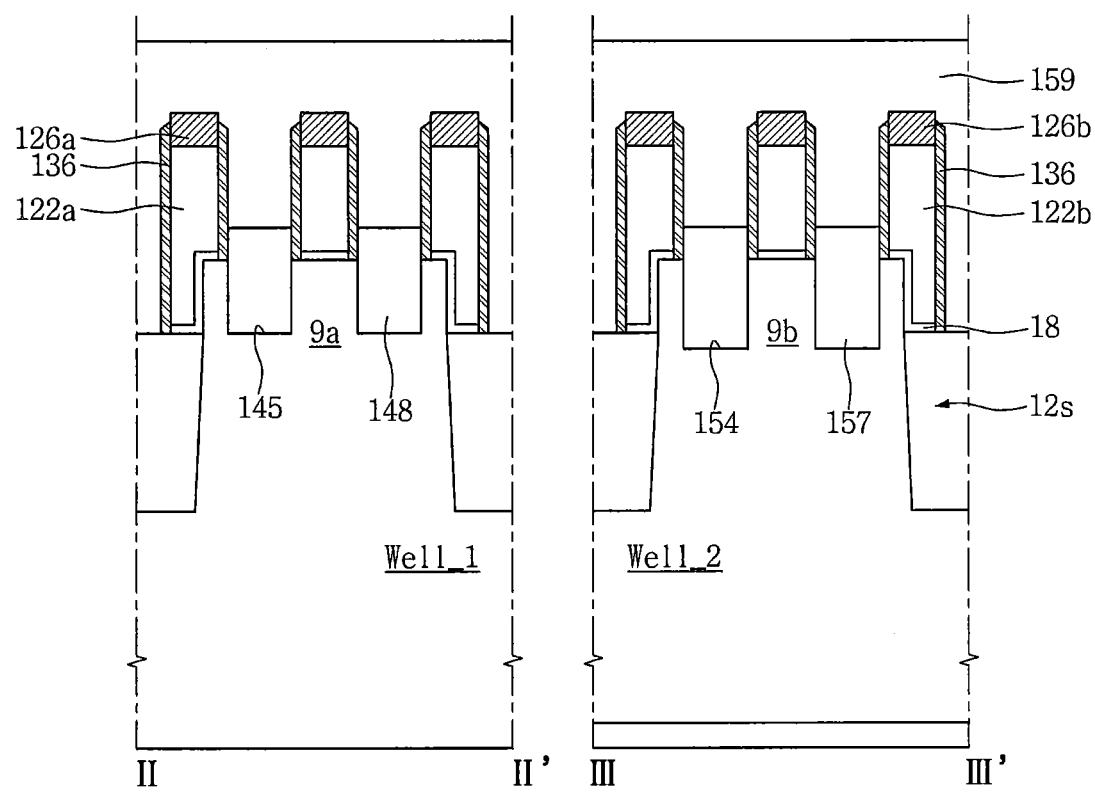

Referring to FIGS. 27, 28A, and 28B, methods of fabricating the semiconductor device in accordance with embodiments of the inventive concepts may include forming first and second hardmask patterns 126a and 126b and first and second sacrificial gate patterns 122a and 122b by patterning the hardmask line 126 and the sacrificial gate line 122.

The patterning of the hardmask line 126 and the sacrificial gate line 122 may include forming a gate cut mask 159 having a gate cut opening 159O on the semiconductor substrate 3 having the hardmask line 126 and the sacrificial gate line 122 by using the photolithography apparatus, and forming the first and second hardmask patterns 126a and 126b and the first and second sacrificial gate patterns 122a and 122b by etching the hardmask line 126 and the sacrificial gate line 122 using the gate cut mask 159 as an etching mask. Meanwhile, the base insulating layer 18 may be etched to expose an upper surface of the isolation region 12.

The gate cut mask 159 may be formed as a photoresist pattern. The gate cut opening 159O may be formed to have a minimum width implemented by the photolithography apparatus. The gate cut opening 159O may overlap the boundary WB between the first well region Well_1 and the second well region Well_2, and may not overlap the first fin active region 9a and the second fin active region 9b.

In a plan view, the gate cut opening 1590 of the gate cut mask 159 may overlap the hardmask protrusion 126P (refer to FIG. 26A) of the hardmask line 126 and have a greater width than the hardmask protrusion 126P (refer to FIG. 26A) of the hardmask line 126. The gate cut opening 1590 of the gate cut mask 159 may fully expose the hardmask protrusion 126P (refer to FIG. 26A). While the first and second hardmask patterns 126a and 126b are formed by etching the hardmask line 126, the hardmask protrusion 126P (refer to FIG. 26A) may be etched and removed.

Next, the gate cut mask 159 may be removed.

Figure 29A:
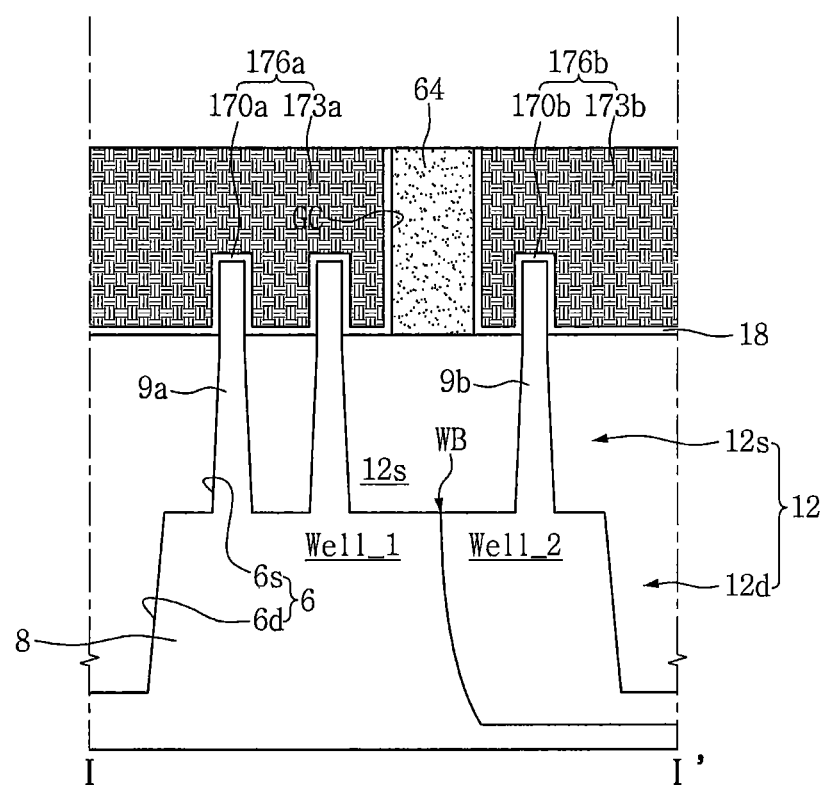
Figure 29B:
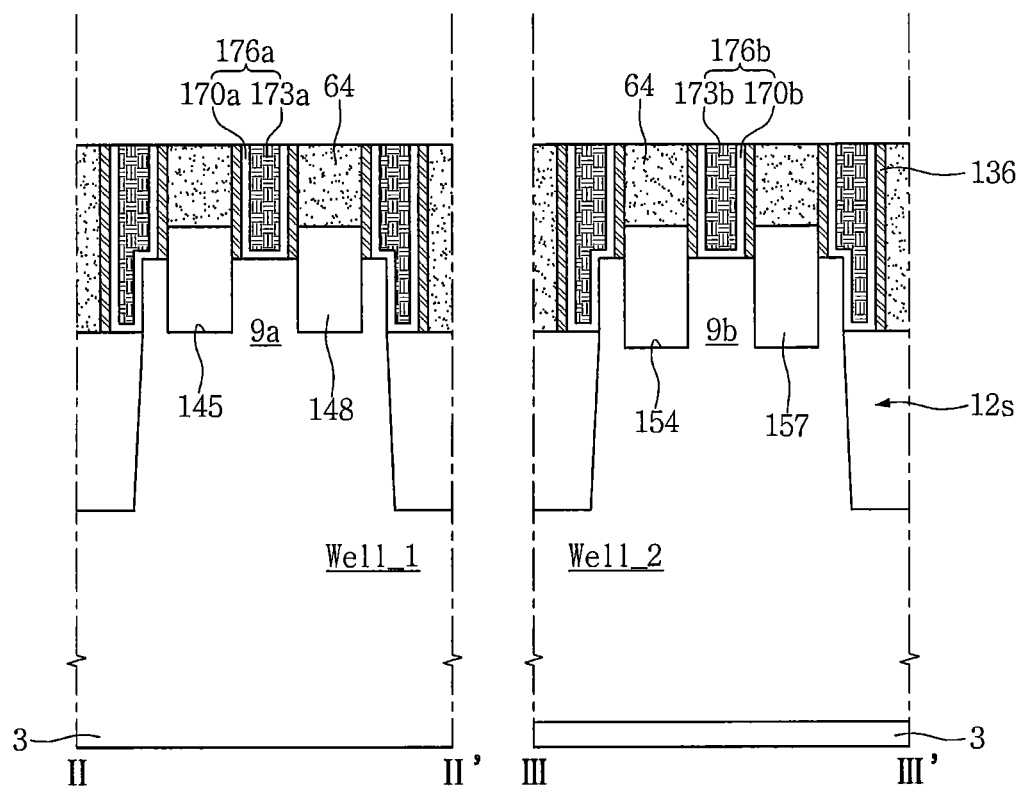

Referring to FIGS. 29A and 29B, methods of fabricating the semiconductor device in accordance with embodiments of the inventive concepts may include forming the interlayer insulating layer (reference numeral 63 in FIGS. 15A and 15B) the same as that described with reference to FIGS. 15A and 15B, and forming the planarized interlayer insulating pattern (reference numeral 64 in FIGS. 16A and 16B) by planarizing the interlayer insulating layer (reference numeral 63 in FIGS. 15A and 15B) using a CMP process, as described with reference to FIGS. 16A and 16B, forming the first and second gate trenches (reference numerals 67a and 67b in FIGS. 17A and 17B) the same as those described with reference with FIGS. 17A and 17B, and forming first and second gate structures 176a and 176b in the first and second gate trenches (reference numerals 67a and 67b in FIGS. 17A and 17B).

The first and second gate structures 176a and 176b may be substantially the same as the first and second gate structures 76a and 76b described with reference to FIGS. 18A and 18B. For example, the first gate structure 176a may include a first gate electrode 173a and a first gate dielectric layer 170a in contact with a side surface and bottom of the first gate electrode 173a, and the second gate structure 176b may include a second gate electrode 173b and a second gate dielectric layer 170b in contact with a side surface and bottom of the second gate electrode 173b.

The first gate structure 176a crossing the first fin active region 9a, and the first semiconductor layer 148 disposed at a side of the first gate structure 176a may define a first MOS transistor. The second gate structure 176b crossing the second fin active region 9b, and the second semiconductor layer 157 disposed at a side of the second gate structure 176b may define a second MOS transistor. The first MOS transistor may be an NMOS transistor, and the second MOS transistor may be a PMOS transistor. The NMOS transistor and the PMOS transistor may be adjacent to each other. The NMOS transistor and the PMOS transistor may be disposed in the second direction Y and spaced apart from each other with the interlayer insulating layer pattern 64 therebetween.

According to embodiments of the inventive concepts, the planarized interlayer insulating pattern (reference numeral 64 in FIGS. 16A and 16B) may be formed in a state in which the hardmask protrusion 126P (refer to FIG. 26A) of the hardmask line 126 generated while forming the first and second active recess areas 145 and 154 is removed. Accordingly, the upper surface of the planarized interlayer insulating pattern 64 may be planarized without any indentations. Accordingly, upper surfaces of the first and second gate structures 176a and 176b formed in the first and second gate trenches (reference numerals 67a and 67b in FIGS. 17A and 17B) interposed between the planarized interlayer insulating pattern 64 may be disposed at the same level or may be coplanar.

Figure 30:
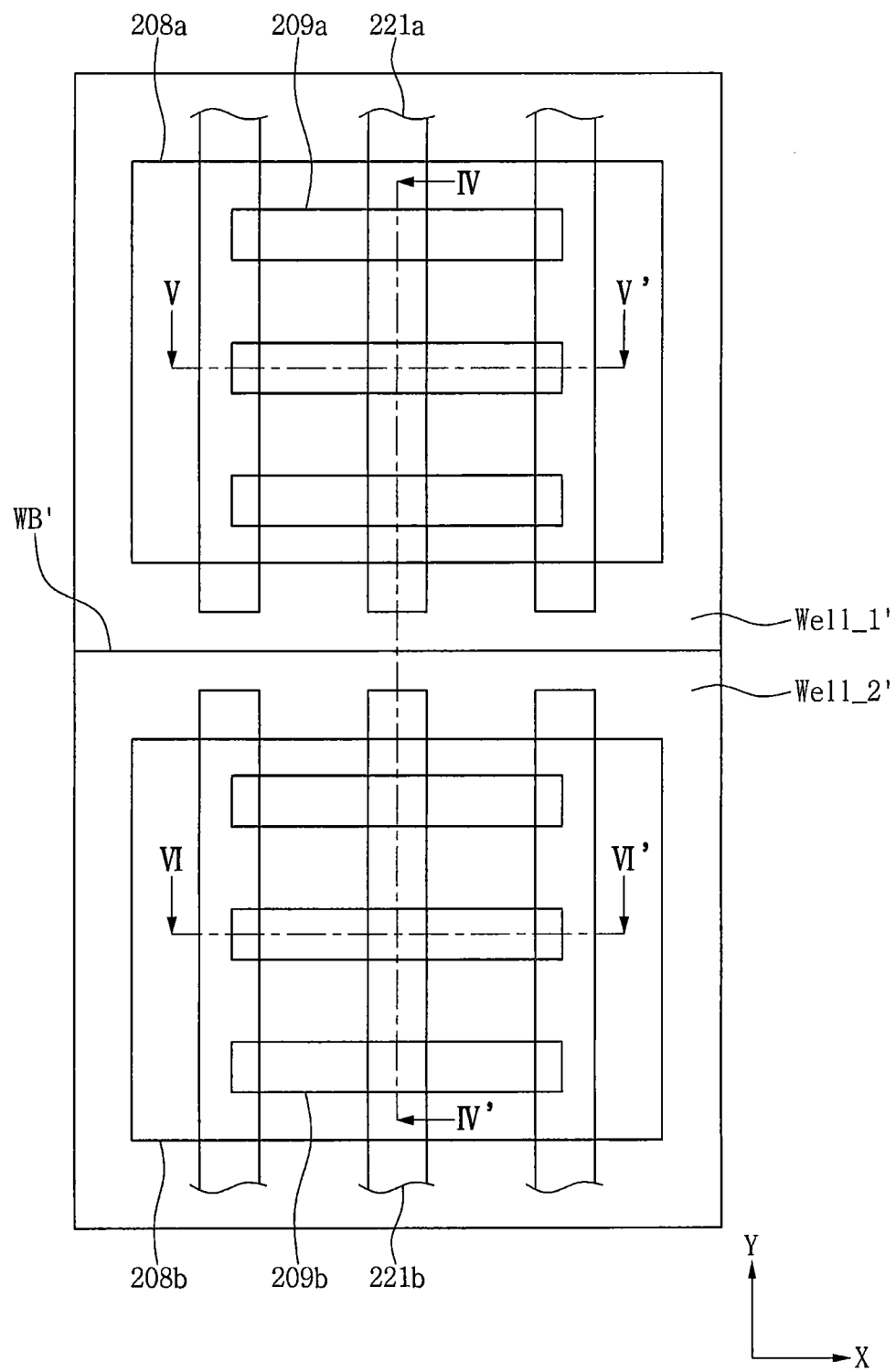
FIGS. 30 to 35B are diagrams illustrating methods of fabricating semiconductor devices in accordance with some embodiments of the inventive concepts.

Next, methods of fabricating semiconductor devices in accordance with still other embodiments of the inventive concepts will be described with reference to FIGS. 30 to 35b. FIGS. 30 and 34 are plan views for describing methods of fabricating semiconductor devices in accordance with still other embodiments of the inventive concepts, FIGS. 31A, 32A, 33A, and 35A are cross-sectional views illustrating areas taken along lines IV-IV' in the plan views of FIGS. 30 and 34, and FIGS. 31B, 32B, 33B, and 35B are cross-sectional views illustrating areas taken along lines V-V' and VI-VI' in the plan views of FIGS. 30 and 34.

Figure 31A:
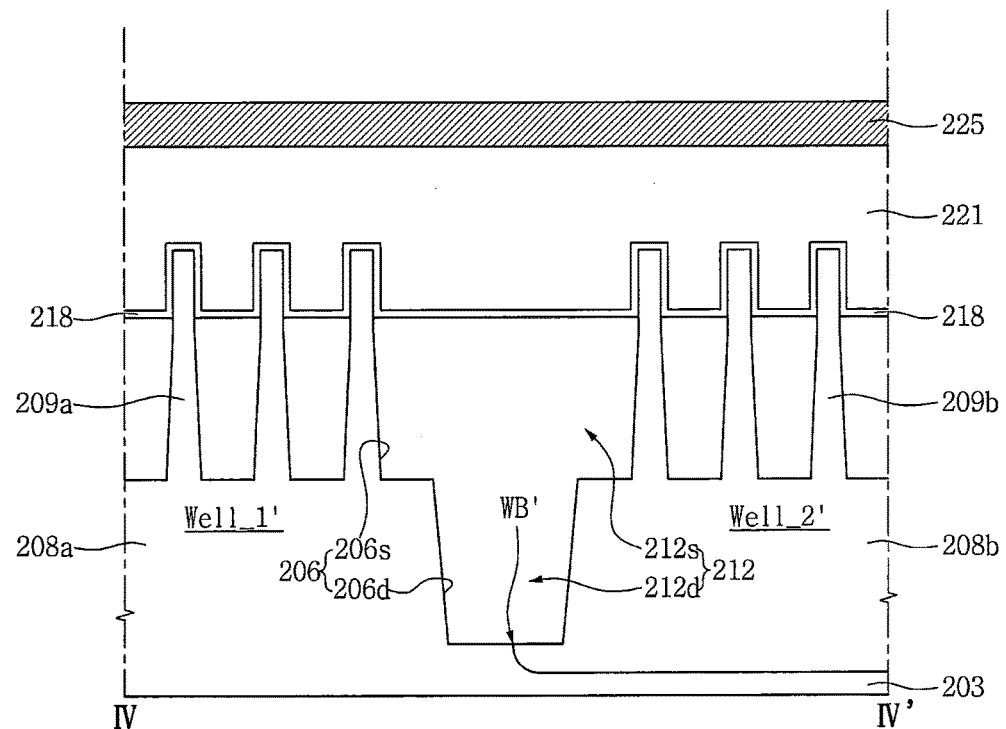
Figure 31B:
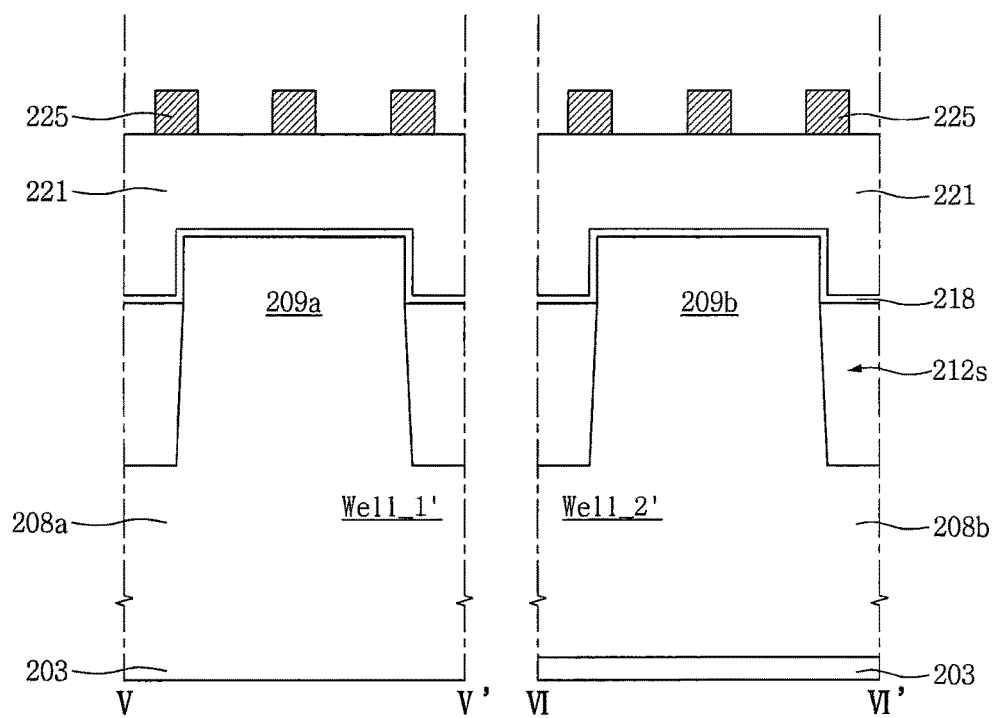

Referring to FIGS. 30, 31A, and 31B, methods of fabricating the semiconductor device in accordance with embodiments of the inventive concepts may include forming first and second well regions Well_1' and Well_2' in a semiconductor substrate 203, as described with reference to FIGS. 1, 2A, and 2B. The first well region Well_1' may have a first conductivity type, and the second well region Well_2' may have a second conductivity type different from the first conductivity type. For example, the first well region Well_1' may have P-type conductivity, and the second well region Well_2' may have N-type conductivity.

Methods of fabricating the semiconductor device in accordance with embodiments of the inventive concepts may include forming an isolation region 212 defining a plurality of active regions in the semiconductor substrate 203, and sequentially forming a base insulating layer 218, a sacrificial gate layer 221, and a hardmask line 225 on the semiconductor substrate 203 having the isolation region 212.

The isolation region 212 may include a trench insulating material filling a trench 206. The trench 206 may include a deep trench 206d and a shallow trench 206s. The isolation region 212 may include a deep isolation region 212d including a trench insulating material filling the deep trench 206d, and a shallow isolation region 212s including a trench insulating material partially filling the shallow trench 206s.

The active regions may include a first lower active region 208a, a second lower active region 208b, first fin active regions 209a disposed on the first lower active region 208a, and second fin active regions 209b disposed on the second lower active region 208b. The deep isolation region 212d may define the first lower active region 208a and the second lower active region 208b. The shallow isolation region 212s may define the first fin active regions 209a and the second fin active regions 209b.

The first lower active region 208a and the first fin active regions 209a may be formed in the first well region Well_1' and may have the first conductivity type. The second lower active region 208b and the second fin active regions 209b may be formed in the second well region Well_2', and may have the second conductivity type.

A boundary WB' between the first and second well regions Well_1' and Well_2' may be formed in the semiconductor substrate 203 under the deep isolation region 212d interposed between the first and second lower active regions 208a and 208b. In some embodiments, the boundary WB' between the first and second well regions Well_1' and Well_2' may represent a boundary on a surface of the semiconductor substrate 203.

The first and second fin active regions 209a and 209b may be spaced apart from each other and may have line shapes extending in a first direction X.

The first and second lower active regions 208a and 208b may be defined by the deep isolation region 212d. The first and second fin active regions 209a and 209b may be defined by the shallow isolation region 212s. Upper portions of the first and second fin active regions 209*a* and 209*b* may protrude from the isolation region 212.

The base insulating layer 218 may be conformally formed on surfaces of the first and second fin active regions 209*a* and 209*b* and the isolation region 212. The sacrificial gate layer 221 may be formed on the base insulating layer 218. The sacrificial gate layer 221 may include polysilicon.

The formation of the hardmask line 225 may include forming a hardmask layer on the sacrificial gate layer 221 and patterning the hardmask layer. The hardmask line 225 may include silicon nitride. The hardmask line 225 may have a line shape extending in a second direction Y perpendicular to the first direction X.

Figure 32A:
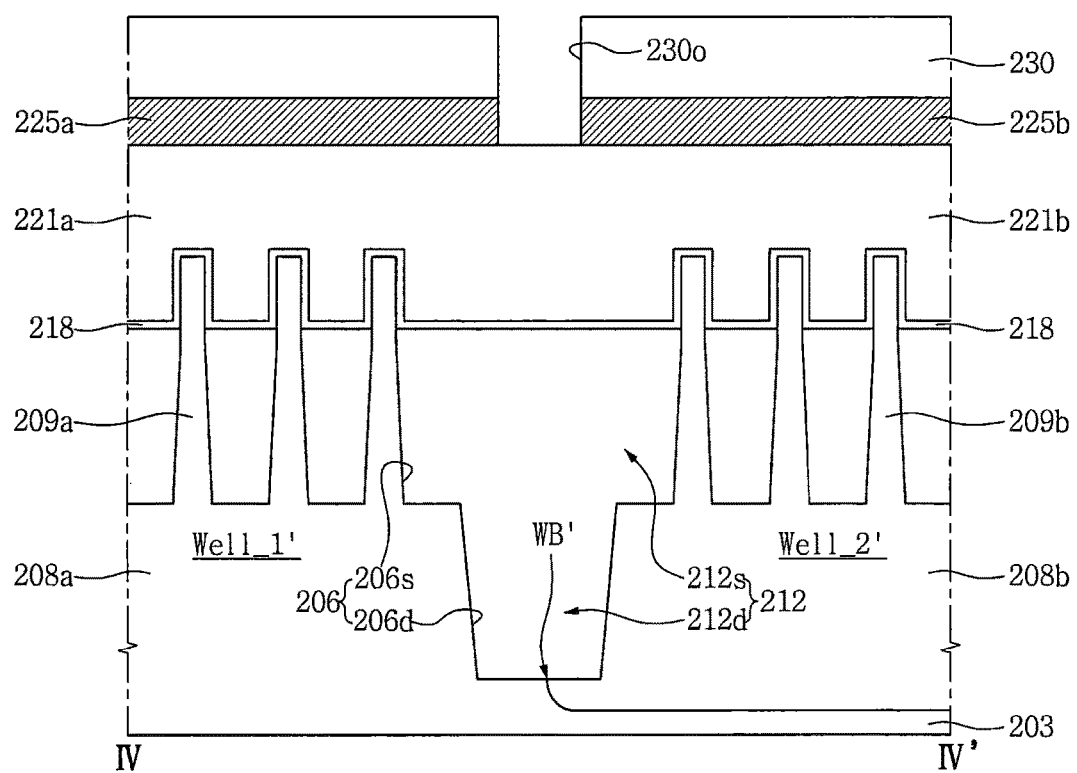
Figure 32B:
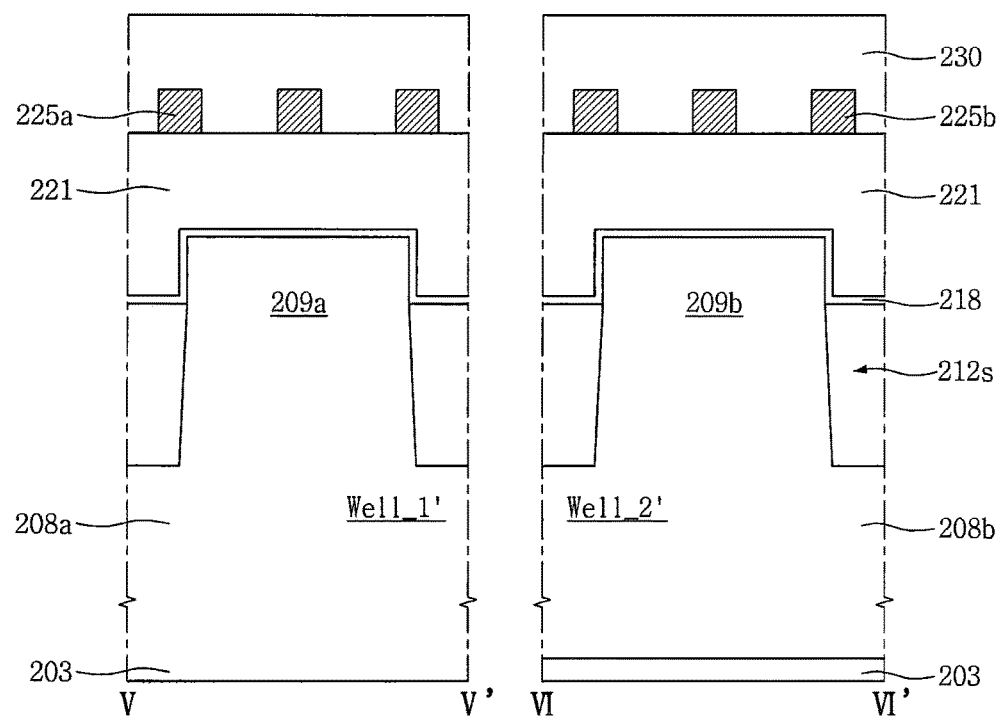

Referring to FIGS. 32A and 32B, methods of fabricating the semiconductor device in accordance with embodiments of the inventive concepts may include forming a first hardmask pattern 225*a* and a second hardmask pattern 225*b* by patterning the hardmask line 225.

The patterning of the hardmask line 225 may include forming a gate cut mask 230 having a gate cut opening 230*o* on the semiconductor substrate 203 having the hardmask line 225 using a photolithography apparatus and forming the first and second hardmask patterns 225*a* and 225*b* by etching the hardmask line 225 exposed by the gate cut opening 230*o* by using the gate cut mask 230 as an etching mask.

The gate cut mask 230 may be formed as a photoresist pattern. The gate cut opening 230*o* may be formed to have a minimum width implemented by the photolithography apparatus. The gate cut opening 230*o* may have a trench shape parallel to the first and second fin active regions 209*a* and 209*b* and extending in the first direction X, similar to the gate cut opening 30*o* of the gate cut mask 30 described with reference to FIGS. 4, 5A, and 5B. The gate cut opening 230*o* may overlap the boundary WB' between the first and second well regions Well_1' and Well_2', and may not overlap the first and second fin active regions 209*a* and 209*b*. The gate cut opening 230*o* may not overlap the first and second lower active regions 208*a* and 208*b*.

Next, the gate cut mask 230 may be removed.

Figure 33A:
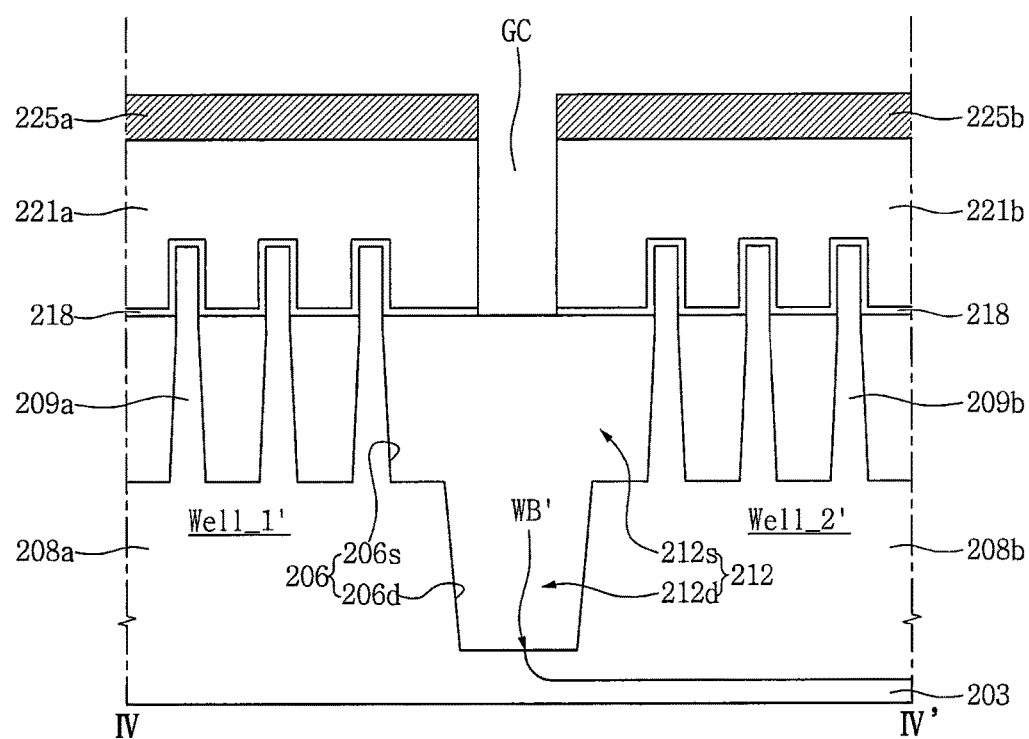
Figure 33B:
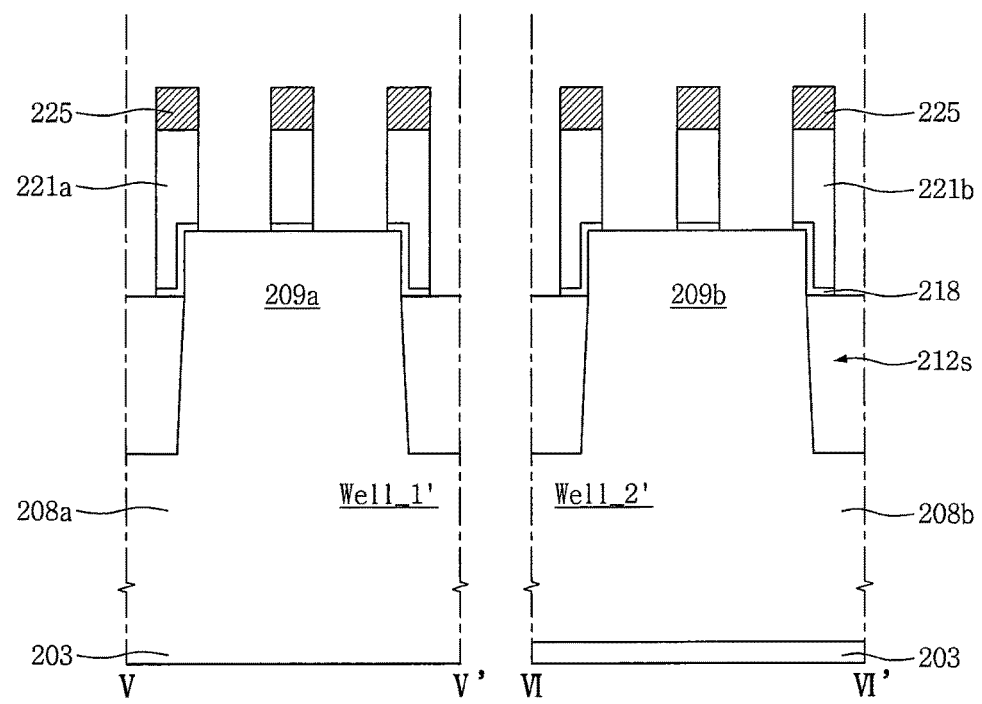
Figure 34:
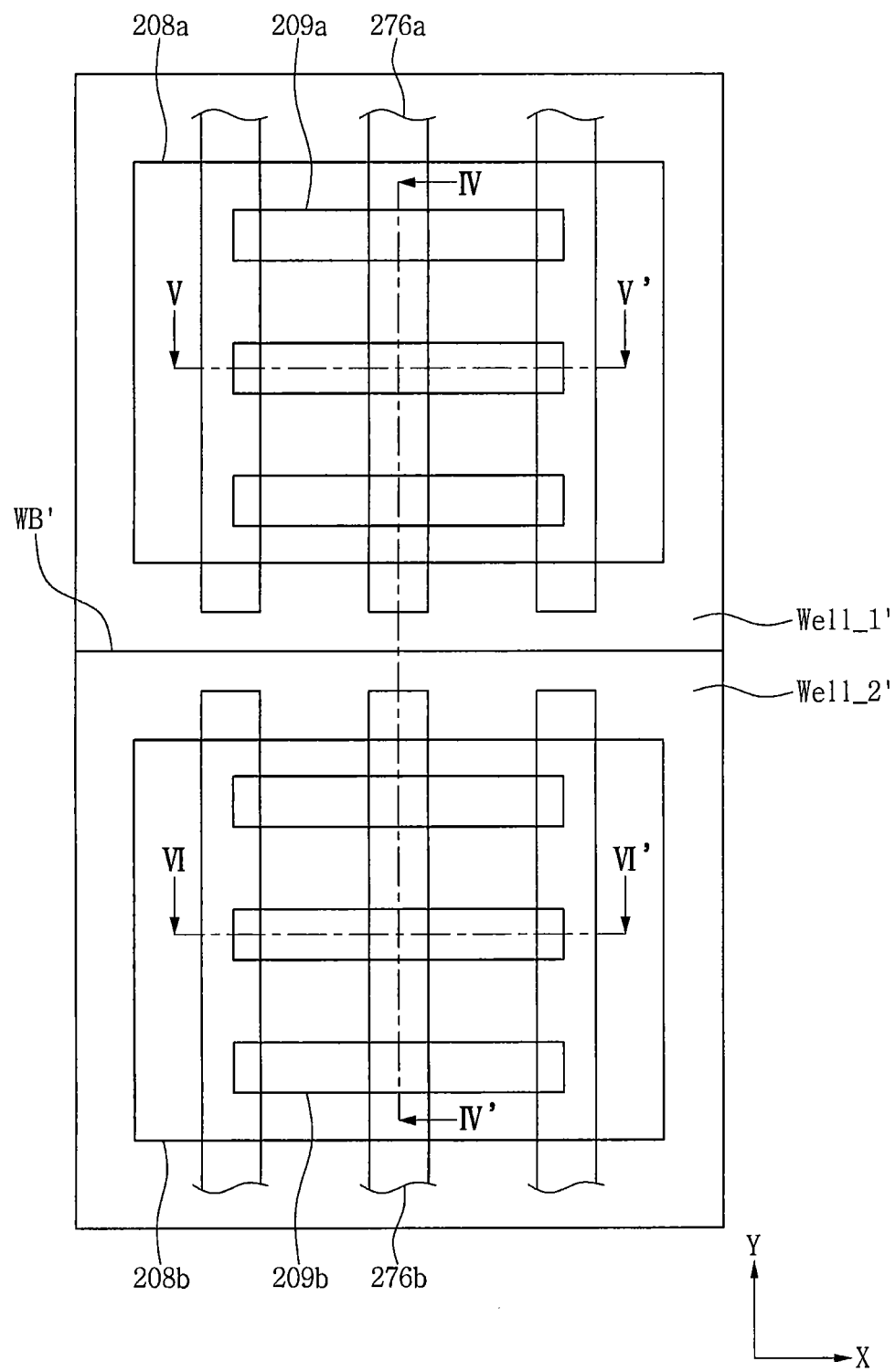

Referring to FIGS. 33A and 33B, methods of fabricating the semiconductor device in accordance with embodiments of the inventive concepts may include forming a first sacrificial gate layer 221*a* below the first hardmask pattern 225*a* and a second sacrificial gate layer 221*b* below the second hardmask pattern 225*b* by etching the sacrificial gate layer 221, and etching the base insulating layer 218. An upper surface of the first fin active region 209*a* may be exposed through the first sacrificial gate layer 221*a* and the etched base insulating layer 218. An upper surface of the second fin active region 209*b* may be exposed through the second sacrificial gate layer 221*b* and the etched base insulating layer 218. An area interposed between the first sacrificial gate layer 221*a* and the second sacrificial gate layer 221*b* may be defined as a gate cut area GC. The gate cut area GC may overlap the boundary WB' between the first and second well regions Well_1' and Well_2'.

Figure 35A:
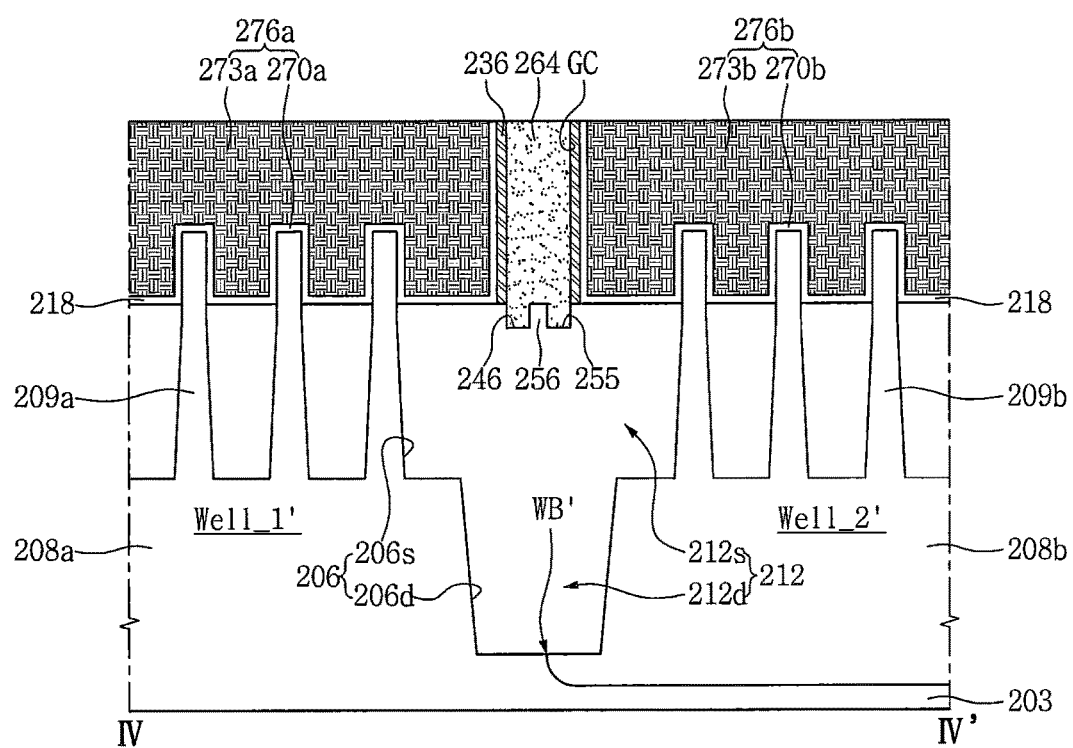
Figure 35B:
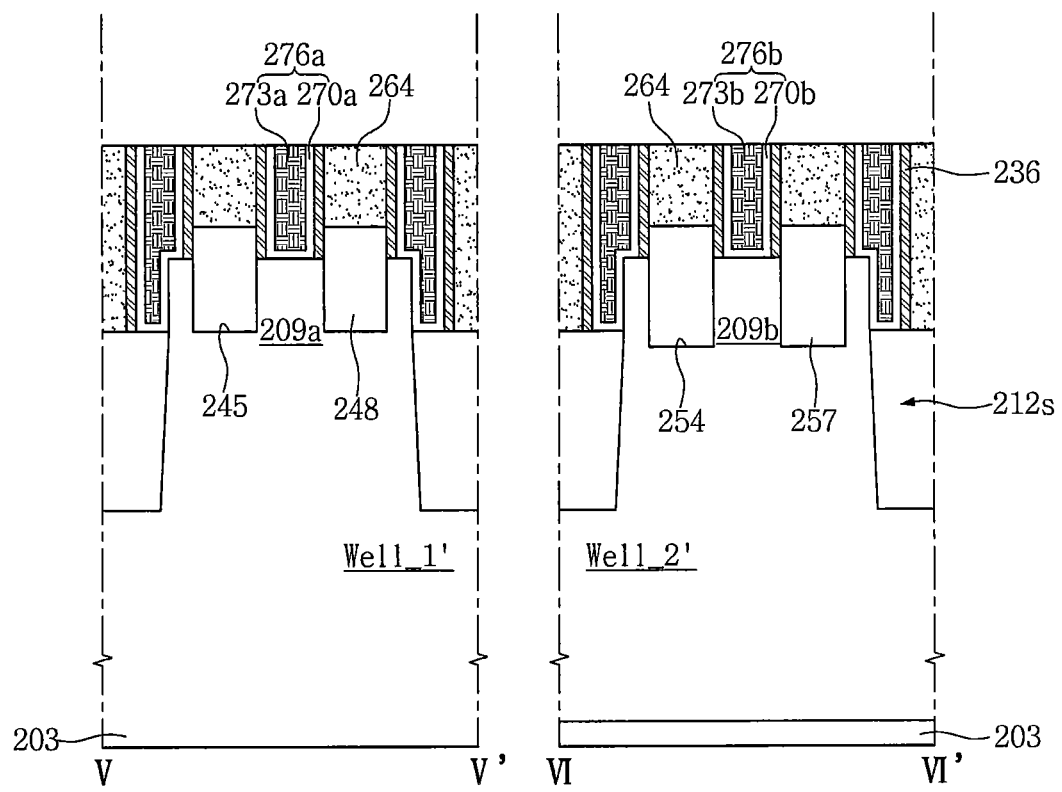

Referring to FIGS. 34, 35A, and 35B, methods of fabricating the semiconductor device in accordance with embodiments of the inventive concepts may include forming gate spacers 236 by performing substantially the same process as that described with reference to FIGS. 8A to 9B, forming a first active recess area 245 and a first field recess area 246, forming a first semiconductor layer 248 by performing substantially the same process as that described with reference to FIGS. 10A and 10B, forming a second active recess area 254 and a second field recess area 255 by performing substantially the same process as that described with reference to FIGS. 11A to 12B, and forming a second semiconductor layer 257 by performing substantially the same process as that described with reference to FIGS. 13A and 13B. Next, a planarized interlayer insulating layer 264 may be formed by performing substantially the same process as that described with reference to FIGS. 14A to 16B, and first and second gate structures 276*a* and 276*b* may be formed by performing substantially the same process as that described with reference to FIGS. 17A to 18B.

The first and second field recess areas 246 and 255 may be formed on a surface of the isolation region 212 disposed on the deep trench 206*d*. The first and second field recess areas 246 and 255 may be spaced apart from each other, and a protrusion 256 of the isolation region 212 may be formed between the first and second field recess areas 246 and 255.

The first gate structure 276*a* may include a first gate electrode 273*a* and a first gate dielectric layer 270*a* in contact with a side surface and bottom of the first gate electrode 273*a*, and the second gate structure 276*b* may include a second gate electrode 273*b* and a second gate dielectric layer 270*b* in contact with a side surface and bottom of the second gate electrode 273*b*.

The first gate structure 276*a* crossing the first fin active region 209*a*, and the first semiconductor layer 248 disposed at a side of the first gate structure 276*a* may define a first MOS transistor. The second gate structure 276*b* crossing the second fin active region 209*b* and the second semiconductor layer 257 disposed at a side of the second gate structure 276*b* may define a second MOS transistor. The first MOS transistor may be an NMOS transistor, and the second MOS transistor may be a PMOS transistor.

Figure 36:
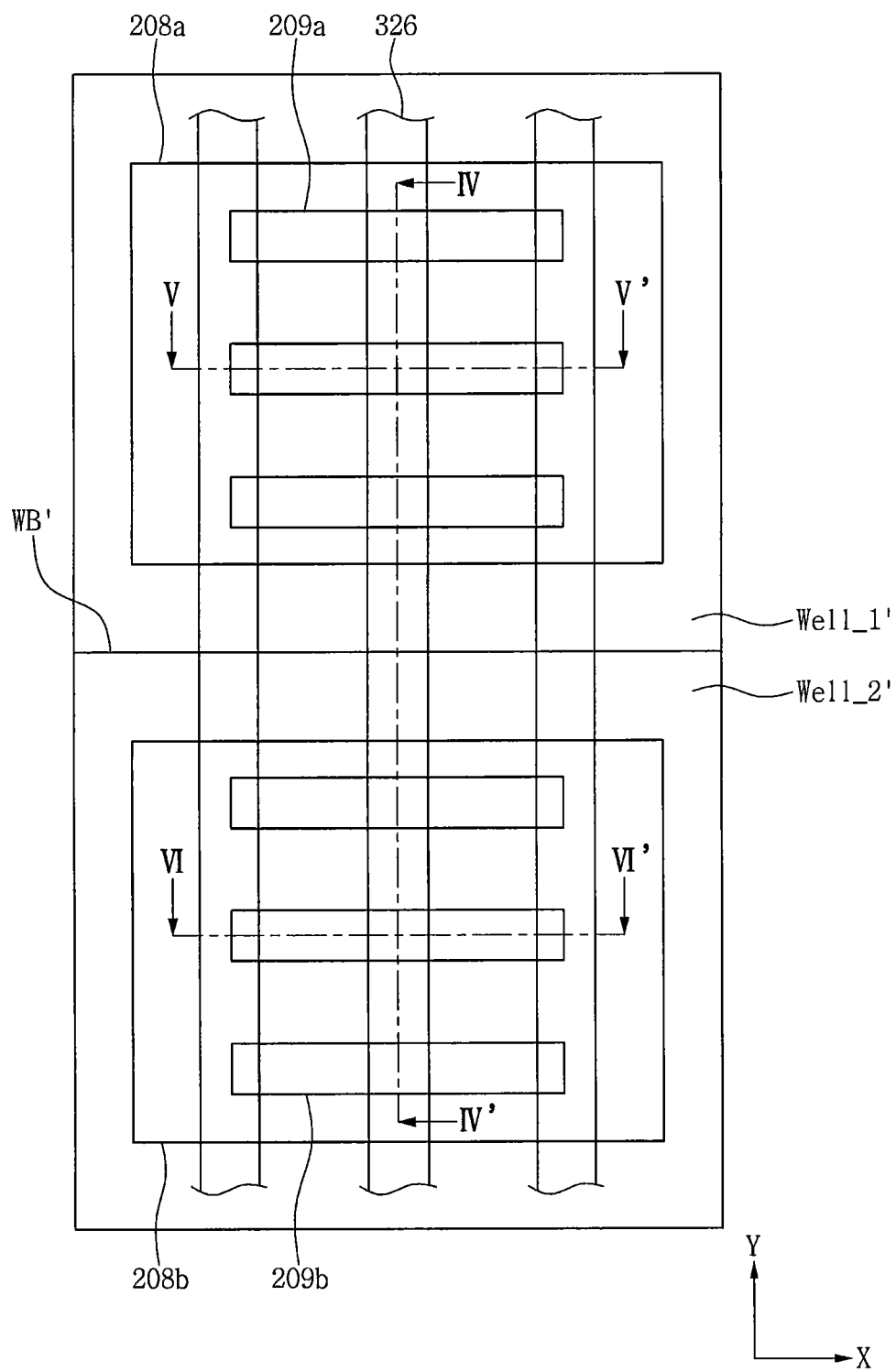
FIGS. 36 to 41B are diagrams illustrating methods of fabricating semiconductor devices in accordance with some embodiments of the inventive concepts.

Next, methods of fabricating semiconductor devices in accordance with yet other embodiments of the inventive concepts will be described with reference to FIGS. 36 to 41B. FIGS. 36 and 39 are plan views for describing methods of fabricating semiconductor devices in accordance with yet other embodiments of the inventive concepts, FIGS. 37A, 38A, 40A, and 41A are cross-sectional views illustrating areas taken along lines IV-IV' in the plan views of FIGS. 36 and 39, and FIGS. 37B, 38B, 40B, and 41B are cross-sectional views illustrating areas taken along lines V-V' and VI-VI' in the plan views of FIGS. 36 and 39.

Figure 37A:
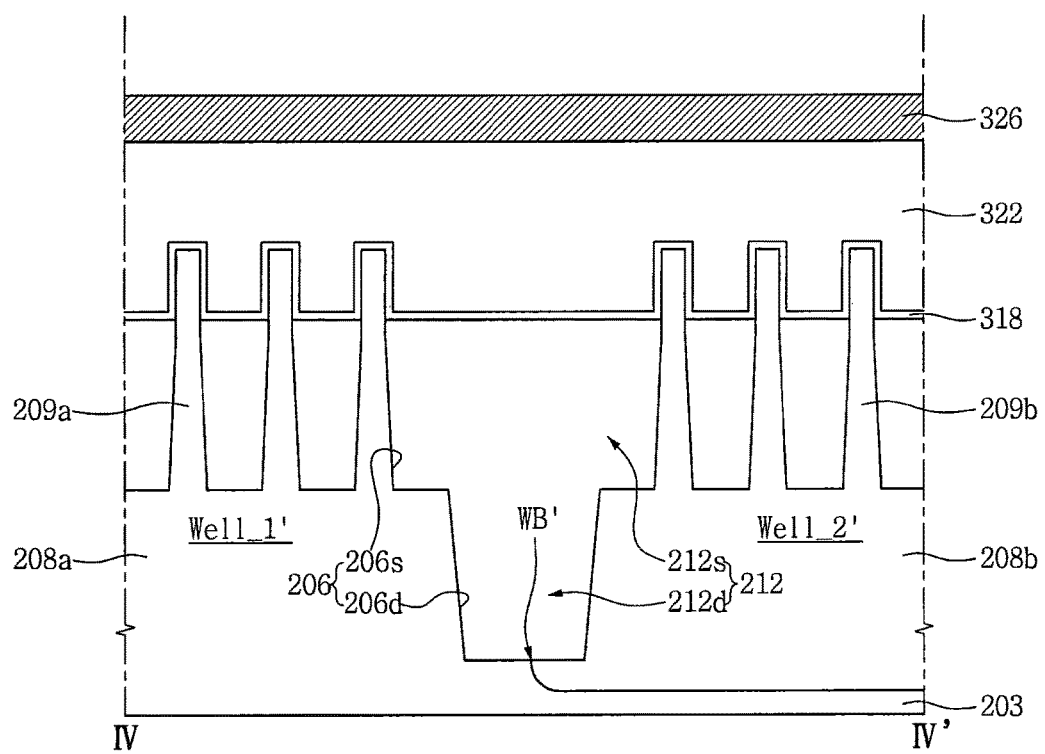
Figure 37B:
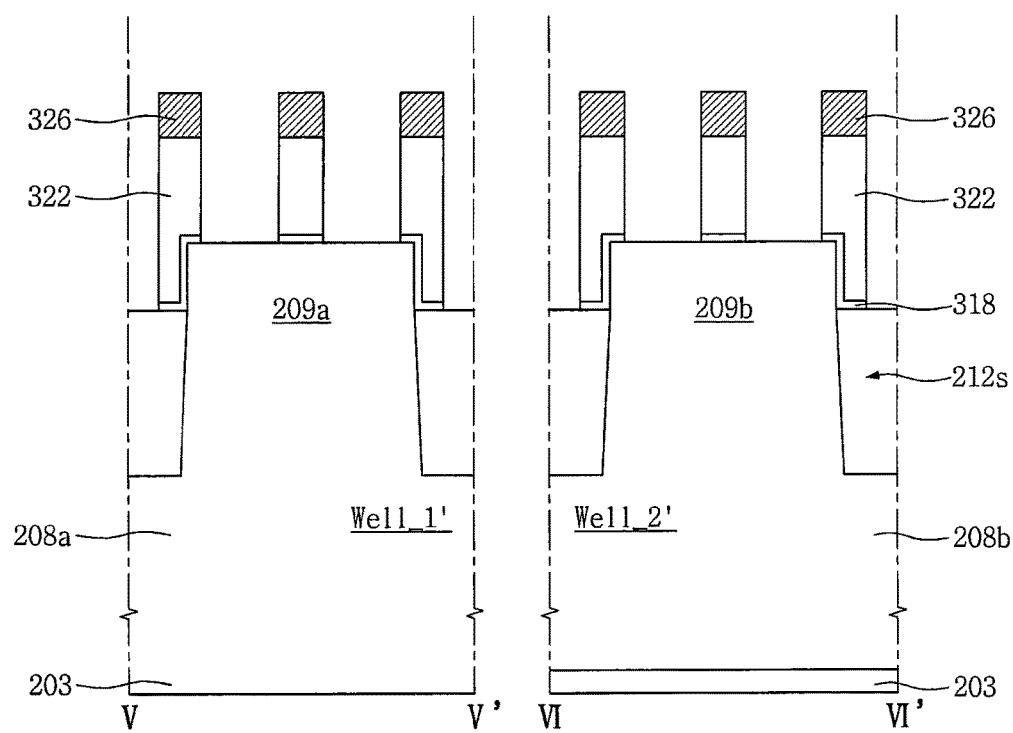

Referring to FIGS. 36, 37A, and 37B, methods of fabricating the semiconductor device in accordance with embodiments of the inventive concepts may include forming the first and second well regions Well_1' and Well_2' in the semiconductor substrate 203 and forming the isolation region 212 defining the plurality of active regions 208*a*, 208*b*, 209*a*, and 209*b* in the semiconductor substrate 203, as described in FIGS. 30, 31A, and 31B.

Methods of fabricating the semiconductor device in accordance with embodiments of the inventive concepts may include forming a base insulating layer 318, a sacrificial gate line 322, and a hardmask line 326 sequentially stacked on the semiconductor substrate 203 having the isolation region 212 by performing substantially the same process as that described with reference to FIGS. 19, 20A, and 20B.

The formation of the base insulating layer 318, the sacrificial gate line 322, and the hardmask line 326 may include forming a base insulating layer, a sacrificial gate layer, and a hardmask layer on the semiconductor substrate 203 having the isolation region 212, forming the hardmask line 326 by patterning the hardmask layer, and sequentially etching the sacrificial gate layer and the base insulating layer using the hardmask line 326 as an etching mask.

Figure 38A:
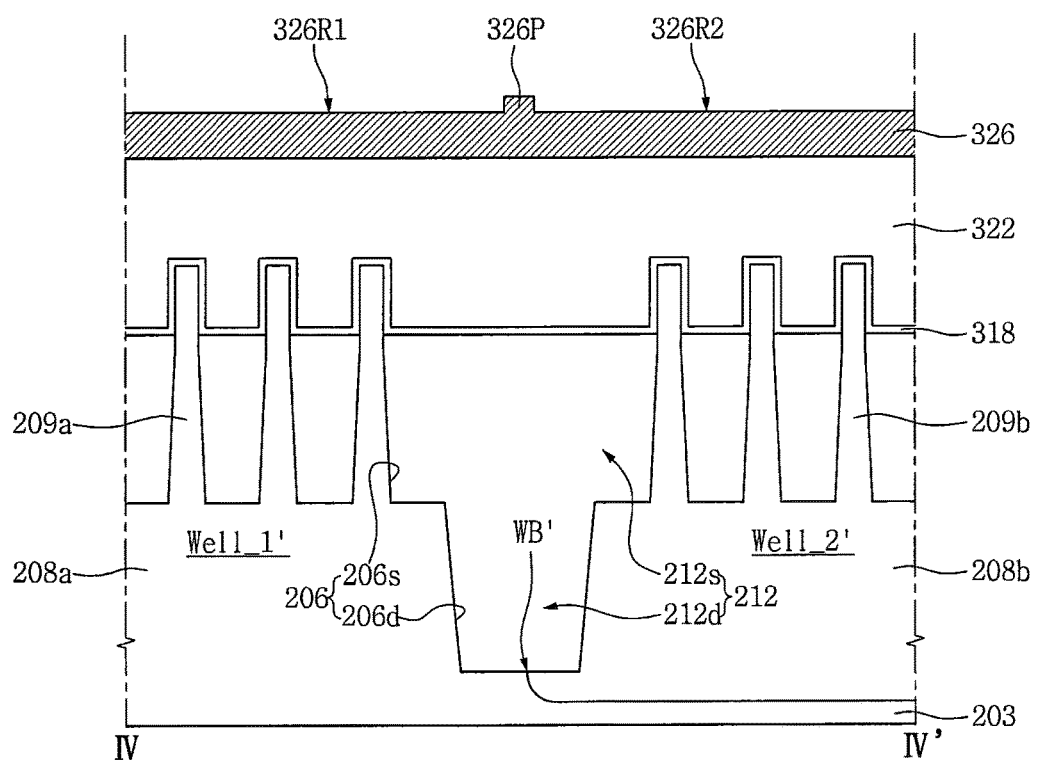
Figure 38B:
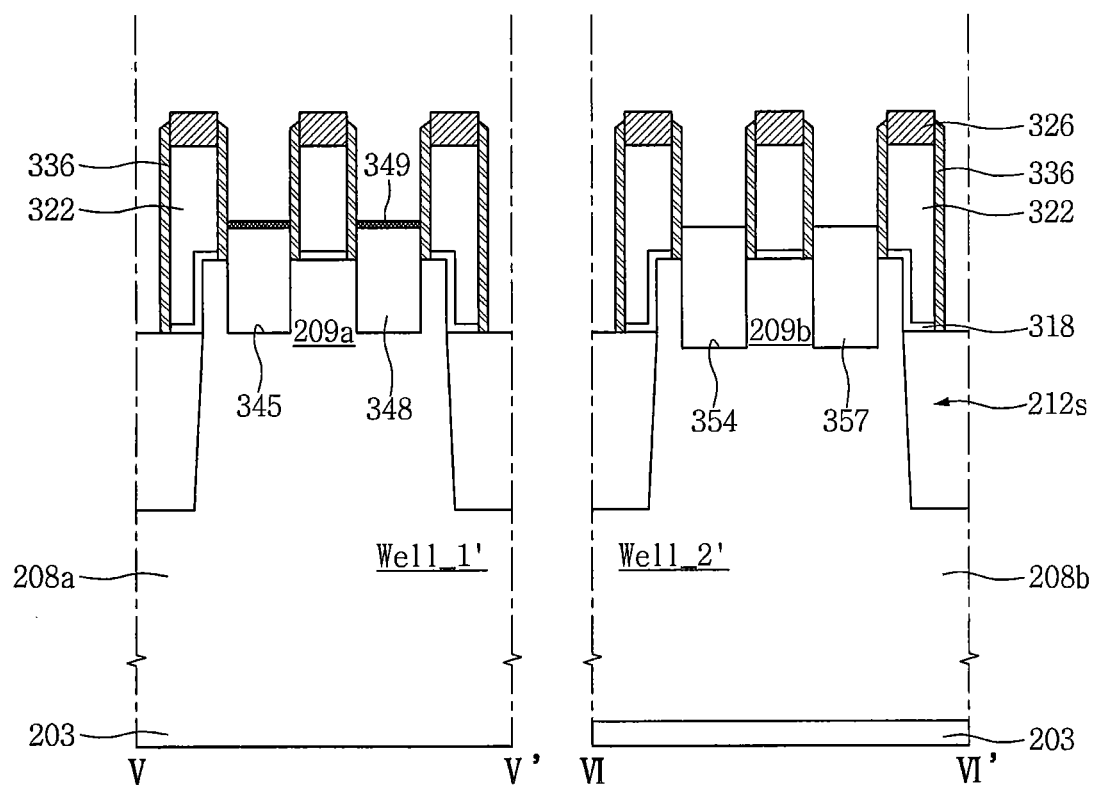
Figure 39:
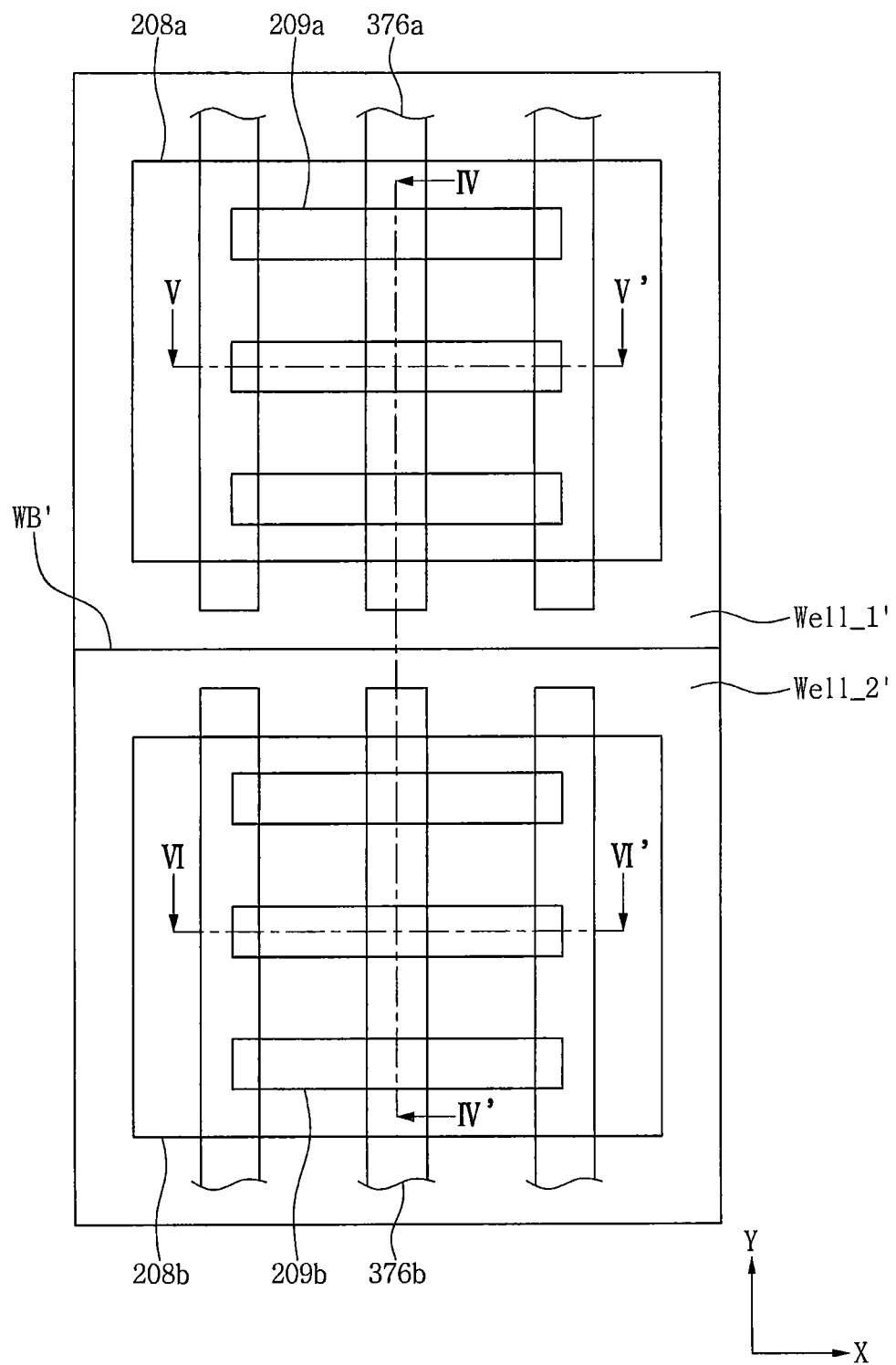

Referring to FIGS. 36, 38A, and 38B, methods of fabricating the semiconductor device in accordance with embodiments of the inventive concepts may include forming gate spacers 336 on side surfaces of the sacrificial gate line 322, forming a first active recess area 345 in the first fin active region 209a disposed at a side of the sacrificial gate line 322, and forming a first semiconductor layer 348 filling the first active recess area 345, by performing substantially the same process as that described with reference to FIGS. 21 to 23B.

While the first active recess area 345 is formed, the hardmask line 326 overlapping the first well region Well_1' may be etched to form a first hardmask recess portion 326R1.

Methods of fabricating the semiconductor device in accordance with embodiments of the inventive concepts may include forming a second active recess area 354 in the second fin active region 209b disposed at a side of the sacrificial gate line 322 and forming a second semiconductor layer 357 filling the second active recess area 354, by performing substantially the same process as that described with reference to FIGS. 24 to 26B.

While the second active recess area 354 is formed, the hardmask line 326 overlapping the second well region Well_2' may be etched to form a second hardmask recess portion 326R2. The first and second hardmask recess portions 326R1 and 326R2 may be spaced apart from each other, and a protrusion 326P of the hardmask line 326 may be formed between the first and second hardmask recess portions 326R1 and 326R2.

Figure 40A:
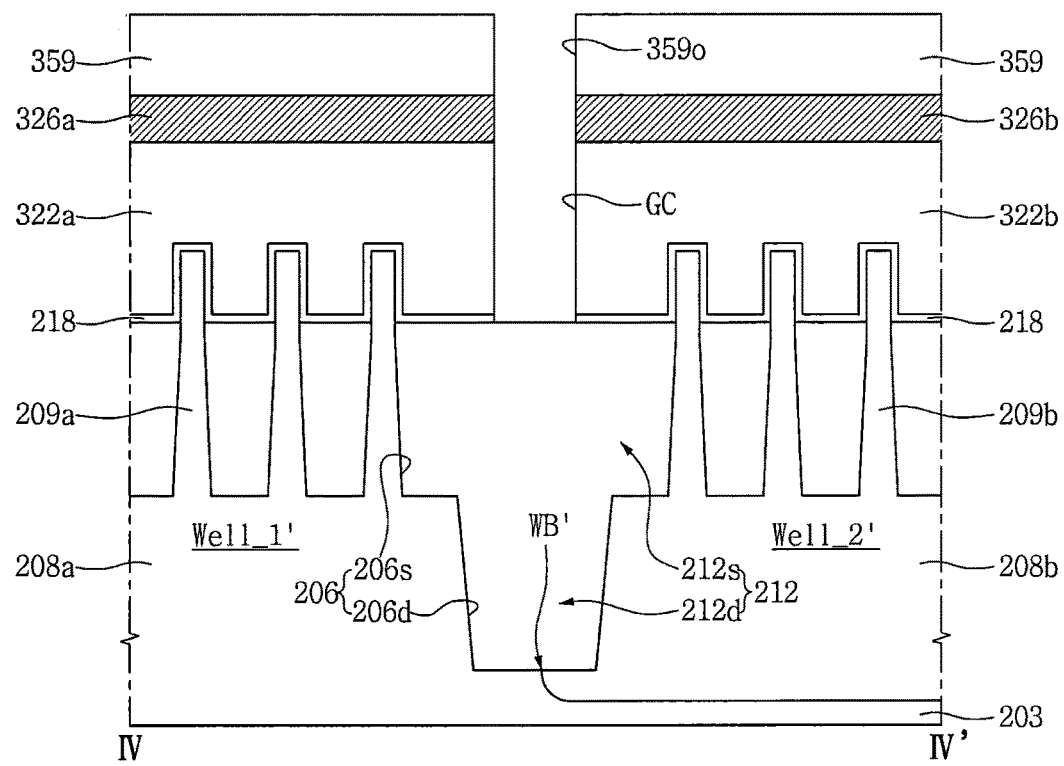
Figure 40B:
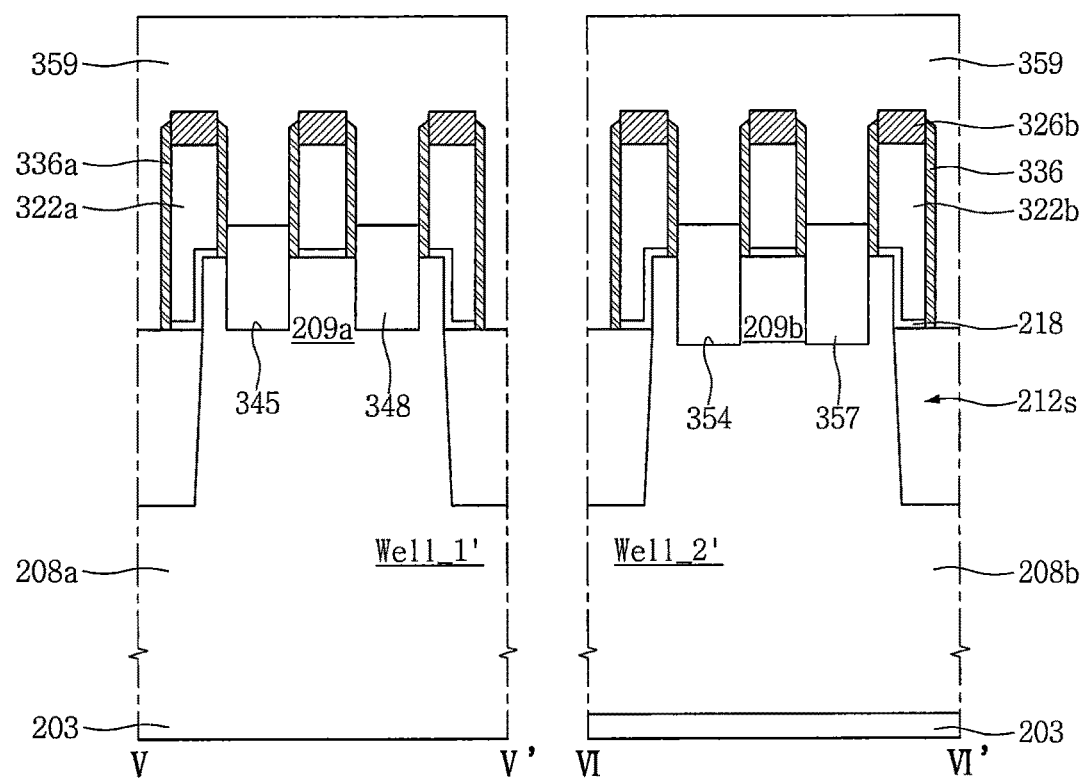

Referring to FIGS. 39, 40A, and 40B, methods of fabricating the semiconductor device in accordance with embodiments of the inventive concepts may include forming first and second hardmask patterns 326a and 326b and first and second sacrificial gate patterns 322a and 322b by patterning the hardmask line 326 and the sacrificial gate line 322.

The patterning of the hardmask line 326 and the sacrificial gate line 322 may include forming a gate cut mask 359 having a gate cut opening 3590 on the semiconductor substrate 203 having the hardmask lines 326 by using a photolithography apparatus and forming the first and second hardmask patterns 326a and 326b and the first and second sacrificial gate patterns 322a and 322b by etching the hardmask line 326 and the sacrificial gate line 322 using the gate cut mask 359 as an etching mask. An area between the first sacrificial gate pattern 322a and the second sacrificial gate pattern 322b may be defined as a gate cut area GC. The gate cut area GC may overlap the boundary WB' between the first well region Well_1' and the second well region Well_2'.

The gate cut mask 359 may be formed as a photoresist pattern. The gate cut opening 3590 may be formed to have a minimum width implemented by the photolithography apparatus. The gate cut opening 3590 may be formed on the deep isolation region 212d. The gate cut opening 3590 may overlap the boundary WB' between the first well region Well_1' and the second well region Well_2' and may not overlap the first fin active region 209a and the second fin active region 209b.

In a plan view, the gate cut opening 3590 of the gate cut mask 359 may overlap the hardmask protrusion 326P (refer to FIG. 38A) of the hardmask line 326 and have a greater width than the hardmask protrusion 326P (refer to FIG. 38A) of the hardmask line 326. The gate cut opening 3590 of the gate cut mask 359 may fully expose the hardmask protrusion 326P (refer to FIG. 38A).

While the first and second hardmask patterns 326a and 326b are formed by etching the hardmask line 326, the hardmask protrusion 326P (refer to FIG. 38A) may be etched and removed.

Next, the gate cut mask 359 may be removed.

Figure 41A:
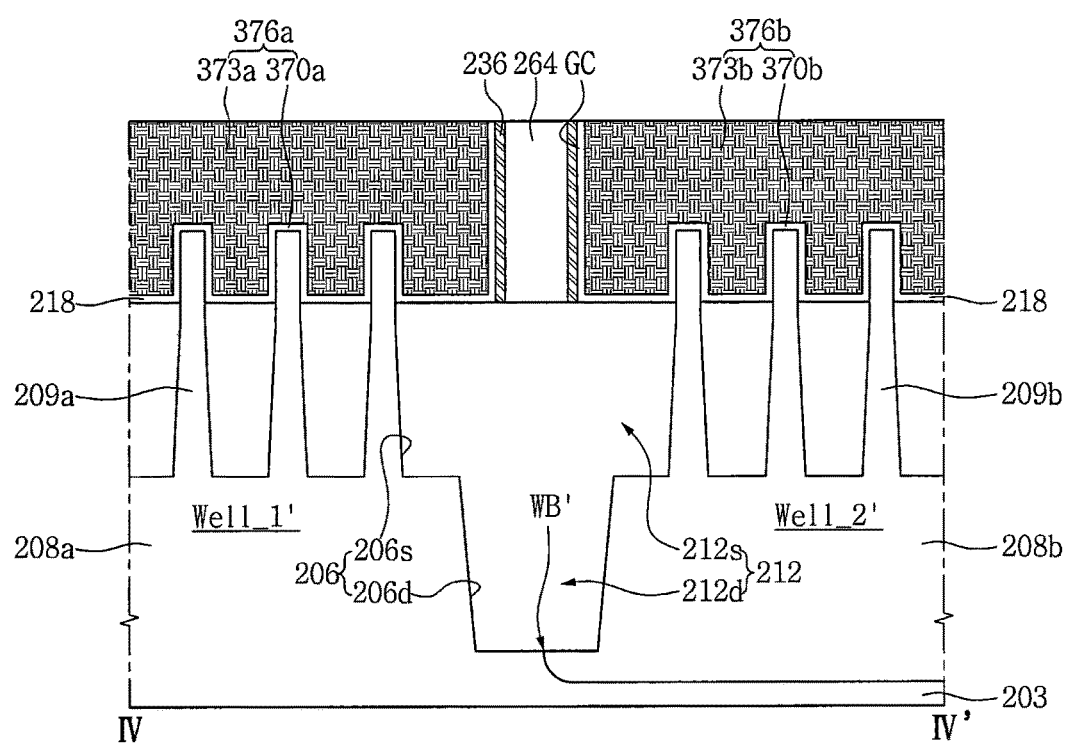
Figure 41B:
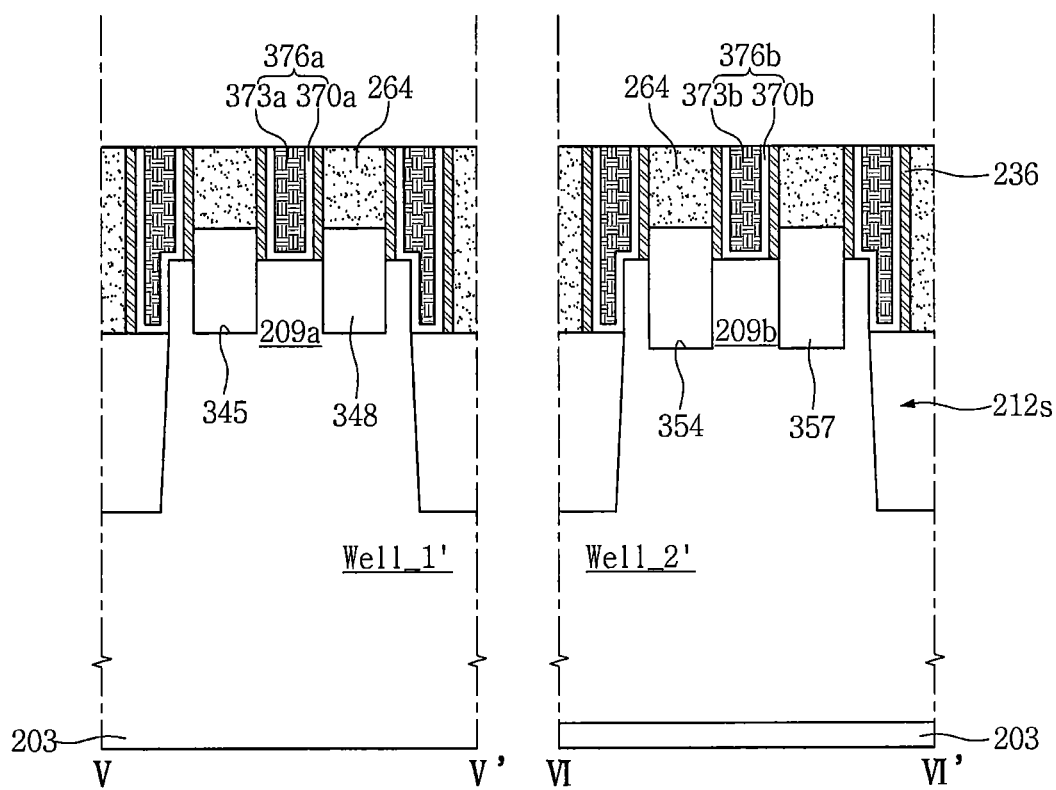

Referring to FIGS. 39, 41A, and 41B, methods of fabricating the semiconductor device in accordance with embodiments of the inventive concepts may include forming the planarized interlayer insulating layer 264 the same as that described with reference to FIGS. 34, 35A, and 35B, and first and second gate structures 376a and 376b corresponding to the first and second gate structures 276a and 276b described with reference to FIGS. 34, 35A, and 35B, using methods substantially the same as that described with reference to FIGS. 34, 35A, and 35B. The first gate structure 376a may include a first gate electrode 373a and a first gate dielectric layer 370a in contact with a side surface and bottom of the first gate electrode 373a, and the second gate structure 376b may include a second gate electrode 373b and a second gate dielectric layer 370b in contact with a side surface and bottom of the second gate electrode 373b.

The first gate structure 376a crossing the first fin active region 209a, and the first semiconductor layer 348 disposed at a side of the first gate structure 376a may define a first MOS transistor. The second gate structure 376b crossing the second fin active region 209b, and the second semiconductor layer 357 disposed at a side of the second gate structure 376b may define a second MOS transistor. The first MOS transistor may be an NMOS transistor, and the second MOS transistor may be a PMOS transistor.

Figure 42A:
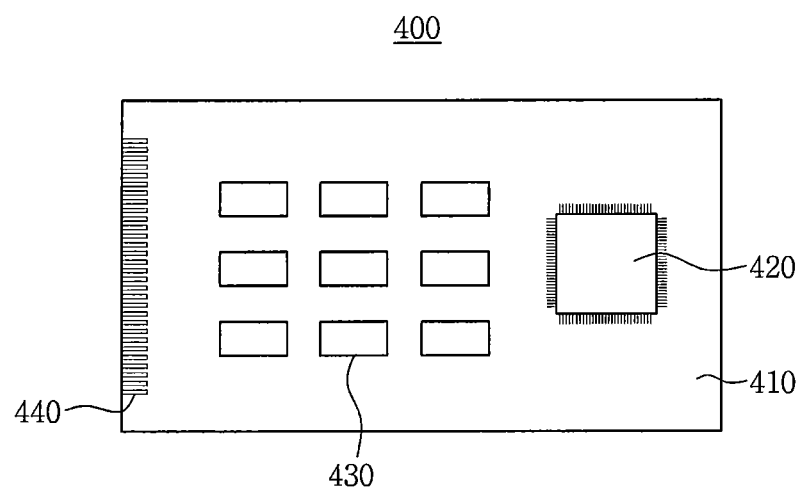
FIG. 42A is a diagram conceptually illustrating a semiconductor module in accordance with some embodiments of the inventive concepts.

FIG. 42A is a diagram conceptually illustrating a semiconductor module 400 in accordance with some embodiments of the inventive concepts. Referring to FIG. 42A, the semiconductor module 400 in accordance with embodiments of the inventive concepts may include a processor 420 and semiconductor devices 430, mounted on a module substrate 410. The processor 420 and the semiconductor devices 430 may include semiconductor devices in accordance with some embodiments of the inventive concepts. Conductive input/output terminals 440 may be disposed on at least one side of the module substrate 410.

The processor 420 and the semiconductor devices 430 may include semiconductor devices formed by methods of fabricating semiconductor devices in accordance with embodiments of the inventive concepts. For example, the processor 420 and the semiconductor devices 430 may include an NMOS transistor and a PMOS transistor of the semiconductor device formed by methods of fabricating semiconductor devices in accordance with embodiments of the inventive concepts.

Figure 42B:
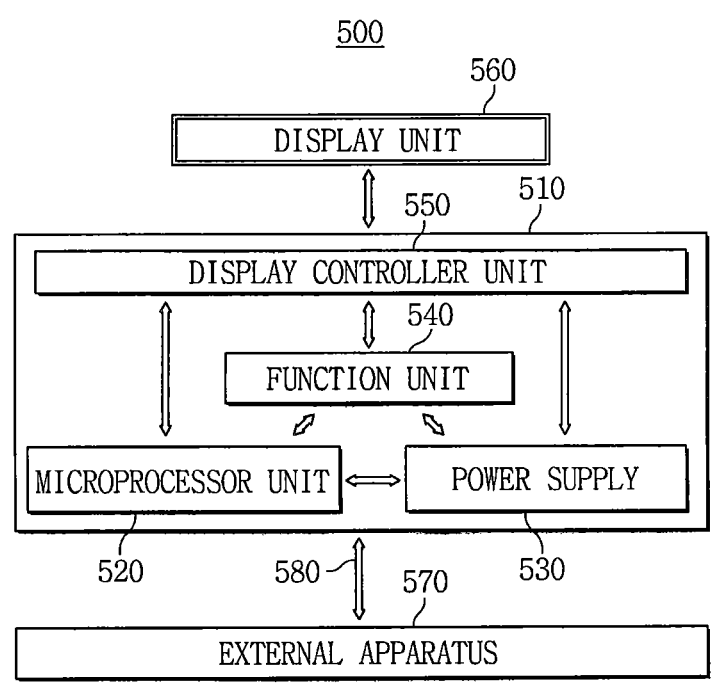
FIGS. 42B and 42C are block diagrams conceptually illustrating electronic systems in accordance with embodiments of the inventive concepts.
Figure 42C:
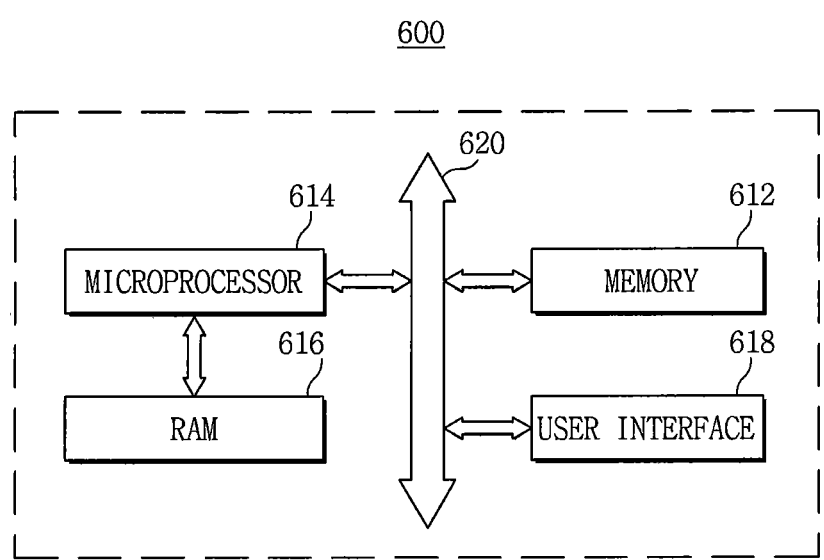

FIGS. 42B and 42C are system block diagrams conceptually illustrating electronic systems in accordance with embodiments of the inventive concepts.

First, referring to FIG. 42B, an electronic system 500 in accordance with embodiments of the inventive concepts may include a body 510, a display unit 560, and an external apparatus 570. The body 510 may include a microprocessor unit 520, a power supply 530, a function unit 540, and/or a display controller unit 550. The body 510 may include a system board or motherboard having a printed circuit board (PCB), and/or a case. The microprocessor unit 520, the power supply 530, the function unit 540, and the display controller unit 550 may be installed or disposed on an upper surface or an inside of the body 510. The display unit 560 may be disposed on an upper surface or an inside/outside of the body 510. The display unit 560 may display an image processed by the display controller unit 550. For example, the display unit 560 may include a liquid crystal display (LCD), an active matrix organic light emitting diode (AMOLED), or various other display panels. The display unit 560 may include a touch-screen. Accordingly, the display unit 560 may have an input/output function. The power supply 530 may supply a current or voltage to the microprocessor unit 520, the function unit 540, and the display controller unit 550, etc. The power supply 530 may include a rechargeable battery, a socket for a dry cell, or a voltage/current converter. The microprocessor unit 520 may receive a voltage from the power supply 530 to control the function unit 540 and the display unit 560. For example, the microprocessor unit 520 may include a central processing unit (CPU) or an application processor (AP). The function unit 540 may include a touch-pad, a touch-screen, a volatile/nonvolatile memory, a memory card controller, a camera, a light, an audio and video playback processor, a wireless transmission/reception antenna, a speaker, a microphone, a Universal Serial Bus (USB) port, and other units having various functions.

The microprocessor unit 520 and/or the function unit 540 may include semiconductor devices formed by methods of fabricating semiconductor devices in accordance with embodiments of the inventive concepts. For example, the microprocessor unit 520 or the function unit 540 may include an NMOS transistor and a PMOS transistor of a semiconductor device formed by methods of fabricating semiconductor devices in accordance with embodiments of the inventive concepts.

Next, referring to FIG. 42C, the electronic system 600 may include a microprocessor 614, a memory system 612, and a user interface 618 which perform data communication using a bus 620. The microprocessor 614 may include a CPU or an AP. The electronic system 600 may further include a random access memory (RAM) 616, which directly communicates with the microprocessor 614. The microprocessor 614 and/or the RAM 616 can be assembled in a single package. The user interface 618 may be used to input data to or output data from the electronic system 600. For example, the user interface 618 may include a touch-pad, a touch-screen, a keyboard, a mouse, a scanner, a voice detector, a cathode ray tube (CRT) monitor, an LCD, an AMOLED, a plasma display panel (PDP), a printer, a light, or various other input/output devices. The memory system 612 may store code for operating the microprocessor 614, data processed by the microprocessor 614, or external input data. The memory system 612 may include a memory controller, a hard disk, or a solid state drive (SSD).

The microprocessor 614, the RAM 616, and/or the memory system 612 may include semiconductor devices formed by methods of fabricating semiconductor devices in accordance with embodiments of the inventive concepts. For example, microprocessor 614, the RAM 616, and/or the memory system 612 may include an NMOS transistor and a PMOS transistor of a semiconductor device formed by methods of fabricating semiconductor devices in accordance with embodiments of the inventive concepts.

According to embodiments of the inventive concepts, methods of fabricating semiconductor devices capable of minimizing a distance between a first gate structure crossing a first conductivity-type active region and a second gate structure crossing a second conductivity-type active region while improving productivity may be provided. The first gate structure may be a gate structure of an NMOS transistor, and the second gate structure may be a gate structure of a PMOS transistor.

According to embodiments of the inventive concepts, methods of fabricating semiconductor devices in which upper surfaces of a gate structure of an NMOS transistor and a gate structure of a PMOS transistor, adjacent to each other, are coplanar or otherwise formed at substantially the same level may be provided.

According to embodiments of the inventive concepts, an electronic apparatus and an electronic system including the semiconductor devices may be provided.

The foregoing is illustrative of embodiments and is not to be construed as limiting thereof. Although a few embodiments have been described, those skilled in the art will readily appreciate that many modifications are possible without materially departing from the novel teachings and advantages.

What is claimed is:
1. A semiconductor device comprising:
a first fin active region and a second fin active region protruding from a substrate, respectively, wherein the first and second fin active regions are spaced apart from each other;
an isolation region between the first and second fin active regions;
a first gate electrode on the first fin active region and on a first portion of the isolation region and extending in a first direction; and
a second gate electrode on the second fin active region and on a second portion of the isolation region and extending in the first direction,
wherein the second gate electrode is spaced apart from the first gate electrode in the first direction, and
wherein the isolation region includes a first recess portion immediately adjacent to a first sidewall of the first gate electrode in the first direction, a second recess portion immediately adjacent to a second sidewall of the second gate electrode facing the first sidewall of the first gate electrode in the first direction, and a protrusion portion comprising an insulating material that extends away from the substrate between the first recess portion and the second recess portion.
2. The semiconductor device of claim 1, wherein the first fin active region and the second fin active region have different conductivity types.
3. The semiconductor device of claim 1, further comprising:
first and second well regions in the substrate,
wherein the first well region and the second well region have different conductivity types and define a well boundary at an interface between the different conductivity types of the first well region and the second well region.
4. The semiconductor device of claim 3, wherein the first fin active region is disposed on the first well region, and the second fin active region is disposed on the second well region.
5. The semiconductor device of claim 4, wherein a space between the first sidewall of the first gate electrode and the second sidewall of the second electrode overlaps the well boundary.
6. The semiconductor device of claim 1, further comprising:
an insulating layer filling a space between the first and second sidewalls of the first and second gate electrodes, on the isolation region;
a first gate spacer between the first sidewall of the first gate electrode and the insulating layer; and a second gate spacer between the second sidewall of the second gate electrode and the insulating layer.

7. The semiconductor device of claim 6, wherein a sidewall of the first recess portion is aligned with the first gate spacer, and a sidewall of the second recess portion is aligned with the second gate spacer.

8. The semiconductor device of claim 1, further comprising:
at least one first edge gate electrode, distinct from the first gate electrode, overlapping at least an end portion of the first fin active region, and
at least one second edge gate electrode, distinct from the second gate electrode, overlapping at least an end portion of the second fin active region.

9. The semiconductor device of claim 8, wherein the isolation region includes a shallow isolation portion and a deep isolation portion.

10. A semiconductor device comprising:
a first fin active region and a second fin active region protruding from a substrate, respectively;
an isolation region between the first fin active region and the second fin active region;
a first gate electrode and a second gate electrode crossing the first fin active region and the second fin active region, respectively, the first gate electrode and the second gate electrode on the isolation region and facing each other on the isolation region; and
an insulating layer filling a space between facing sidewalls of the first and second gate electrodes, on the isolation region, the insulating layer having a planarized top surface,
wherein the isolation region includes spaced recess portions and a protrusion portion between the spaced recess portions,
the spaced recess portions are spaced apart from the first and second fin active regions,
a lowermost bottom surface of the first gate electrode is located at a lower level than an upper surface of the first fin active region, and
a lowermost bottom surface of the second gate electrode is located at a lower level than an upper surface of the second fin active region.

11. The semiconductor device of claim 10, further comprising a spacer interposed between the first gate electrode and the insulating layer.

12. The semiconductor device of claim 10, wherein the insulating layer covers the spaced recess portions and the protrusion portion.

13. The semiconductor device of claim 10, wherein the isolation region includes a shallow isolation portion and a deep isolation portion.

14. A semiconductor device comprising:
first fin active regions protruding from a substrate;
a second fin active region protruding from the substrate; and
a first isolation region comprising an insulating material between the first fin active regions and the second fin active region,
wherein an upper surface of the first isolation region includes a pair of recess portions in the insulating material and a protrusion portion comprising the insulating material that extends away from the substrate between the pair of recess portions, and
the pair of recess portions are spaced apart from the first fin active regions and the second fin active region, respectively.

15. The semiconductor device of claim 14, wherein the first fin active regions are spaced apart from each other by a second isolation region.

16. The semiconductor device of claim 15, wherein a width of the first isolation region is greater than a width of the second isolation region.

17. The semiconductor device of claim 14, wherein the first isolation region includes a shallow isolation portion and a deep isolation portion.

18. The semiconductor device of claim 14, further comprising:
a first conductive line crossing the first fin active regions and on the first isolation region;
a second conductive line crossing the second fin active region and on the first isolation region;
wherein the first conductive line and the second conductive line are spaced apart from each other, and
the pair of recess portions and the protrusion portion are between the first conductive line and the second conductive line.

19. The semiconductor device of claim 18, further comprising a planarized insulating layer on the pair of recess portions and the protrusion of the first isolation region.

20. The semiconductor device of claim 14, wherein the first fin active regions and the second fin active region have different conductivity types.

* * * * *